(12) United States Patent
Yamazaki et al.

(10) Patent No.: US 12,057,508 B2
(45) Date of Patent: Aug. 6, 2024

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Shinya Sasagawa, Chigasaki (JP); Shunichi Ito, Atsugi (JP); Erika Takahashi, Chigasaki (JP); Tetsuya Kakehata, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 413 days.

(21) Appl. No.: 17/436,136

(22) PCT Filed: Mar. 18, 2020

(86) PCT No.: PCT/IB2020/052441
§ 371 (c)(1),
(2) Date: Sep. 3, 2021

(87) PCT Pub. No.: WO2020/201870
PCT Pub. Date: Oct. 8, 2020

(65) Prior Publication Data
US 2022/0157986 A1    May 19, 2022

(30) Foreign Application Priority Data

Mar. 29, 2019    (JP) .................................. 2019-066875

(51) Int. Cl.
*H01L 29/786*    (2006.01)
*H10B 12/00*    (2023.01)

(52) U.S. Cl.
CPC ............ *H01L 29/786* (2013.01); *H10B 12/00* (2023.02); *H01L 29/78603* (2013.01); *H01L 29/7869* (2013.01)

(58) Field of Classification Search
CPC ............ H01L 29/786; H01L 29/78648; H01L 29/7869; H01L 29/78696; H01L 27/1225; H01L 29/78603; H10B 12/00
See application file for complete search history.

(56) References Cited

U.S. PATENT DOCUMENTS

2016/0322503 A1*    11/2016    Tezuka ............. H01L 29/78603
2017/0317111 A1*    11/2017    Ando .................... H01L 27/124
2019/0348537 A1     11/2019    Yamazaki et al.

FOREIGN PATENT DOCUMENTS

CN            110088913 A       8/2019
JP            2018-107447 A     7/2018
(Continued)

OTHER PUBLICATIONS

International Search Report (Application No. PCT/IB2020/052441) Dated Jul. 7, 2020.
(Continued)

*Primary Examiner* — Patricia D Valenzuela
(74) *Attorney, Agent, or Firm* — Eric J. Robinson; Robinson Intellectual Property Law Office, P.C.

(57) ABSTRACT

A semiconductor device includes a first insulator; a first oxide over the first insulator; a second oxide over the first oxide; first and second conductors and a third oxide over the second oxide; a second insulator over the first conductor; a third insulator over the second conductor; first and second layers; and fourth to sixth insulators. The sixth insulator includes a region in contact with a top surface of the first insulator. The first layer includes a region in contact with side surfaces of the first and second oxides, a side surface of the first conductor, and the top surface of the first insulator.

(Continued)

The second layer includes a region in contact with the side surfaces of the first and second oxides, a side surface of the second conductor, and the top surface of the first insulator.

6 Claims, 44 Drawing Sheets

(56) References Cited

FOREIGN PATENT DOCUMENTS

| | | |
|---|---|---|
| JP | 2019-047101 A | 3/2019 |
| TW | 201841367 | 11/2018 |
| WO | WO-2018/122659 | 7/2018 |

OTHER PUBLICATIONS

Written Opinion (Application No. PCT/IB2020/052441) Dated Jul. 7, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

FIG. 4A
| Amorphous | Intermediate state<br>New crystalline phase<br>Crystalline | Crystal |
|---|---|---|
| completely amorphous | ·CAAC<br>·nc<br>·CAC<br>excluding single crystal and poly crystal | ·single crystal<br>·poly crystal |
FIG. 4B
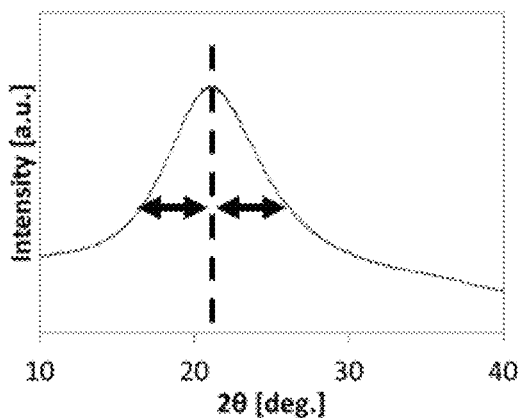
FIG. 4C
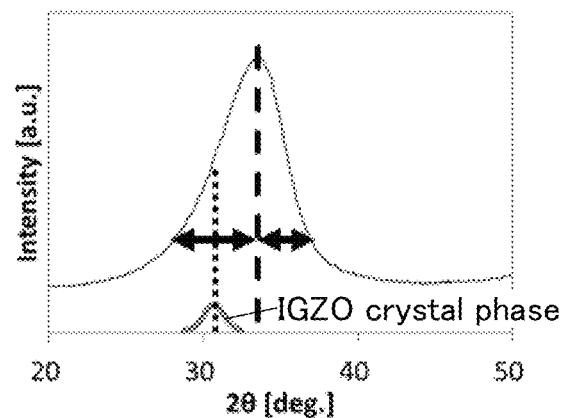
FIG. 4D
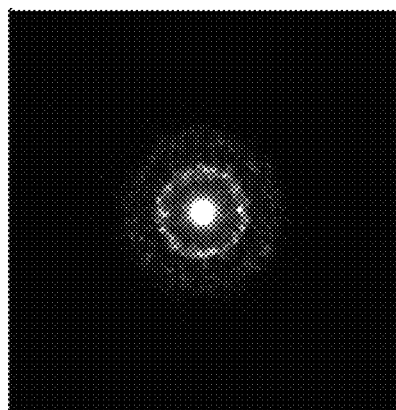

FIG. 6A
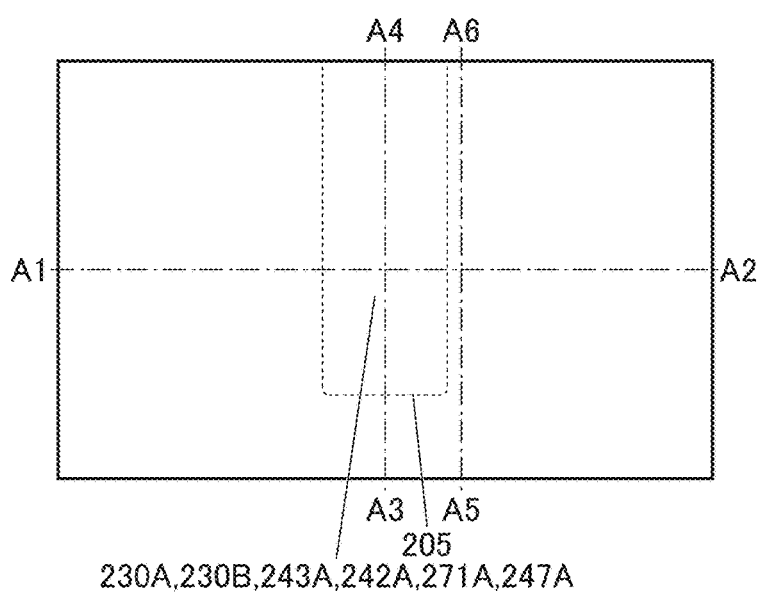
FIG. 6C
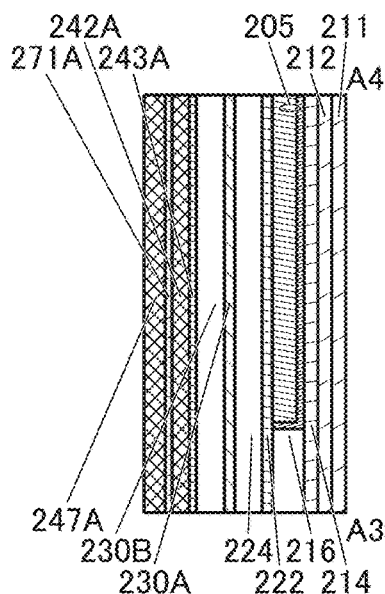
FIG. 6B
FIG. 6D
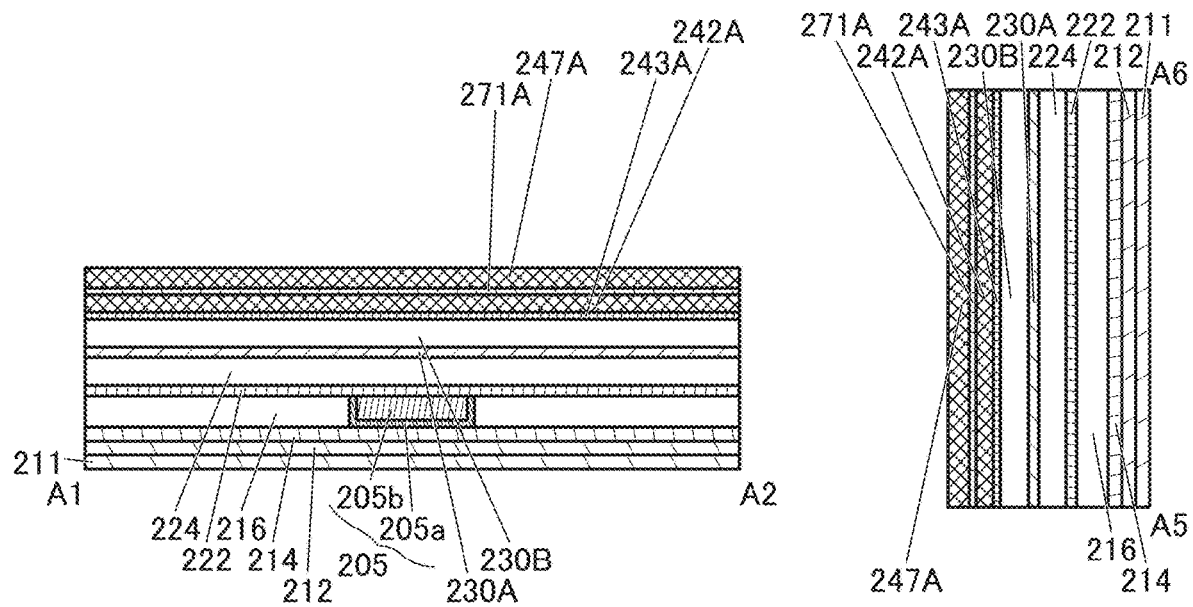

FIG. 28A
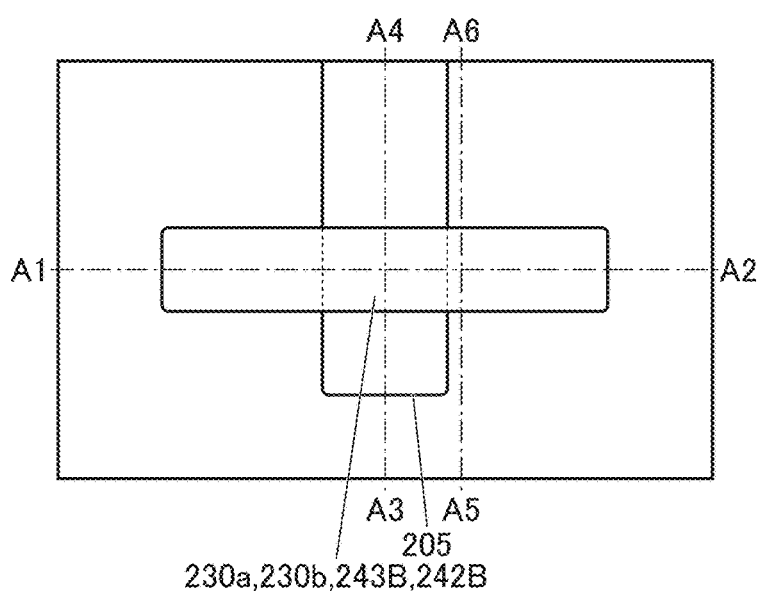
FIG. 28C
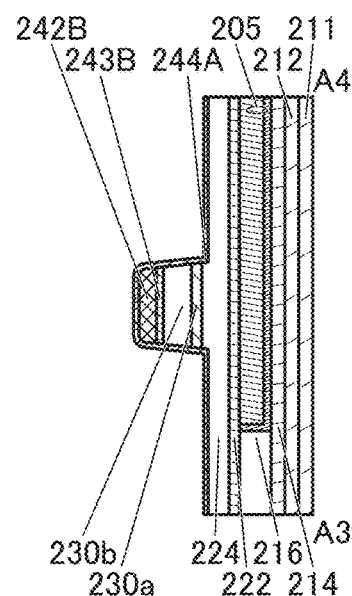
FIG. 28D
FIG. 28B
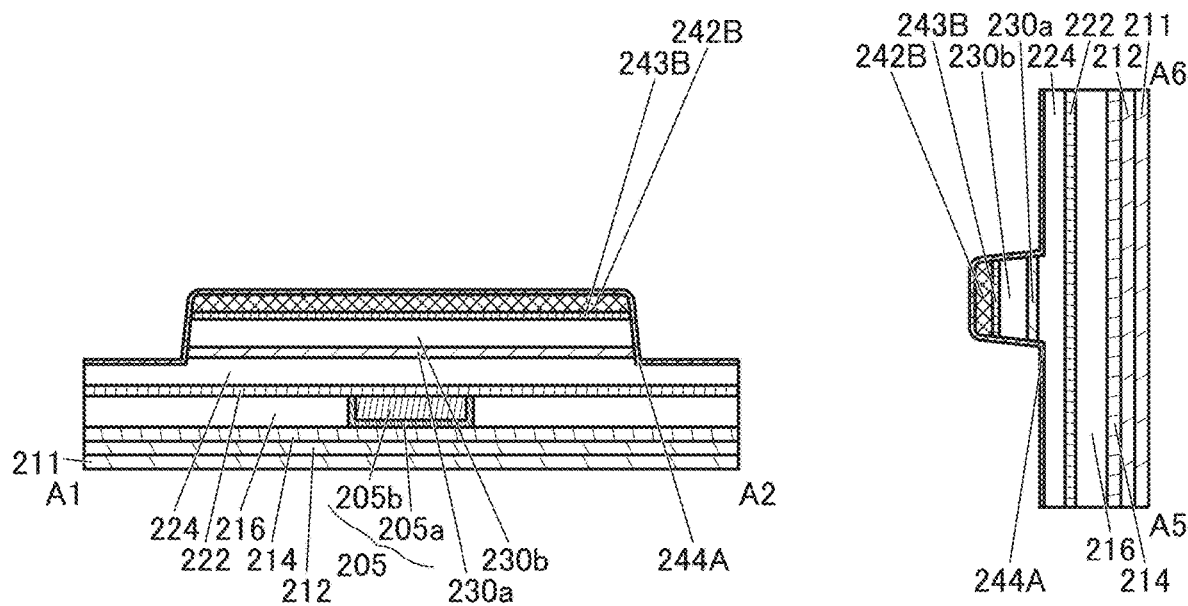

FIG. 29A
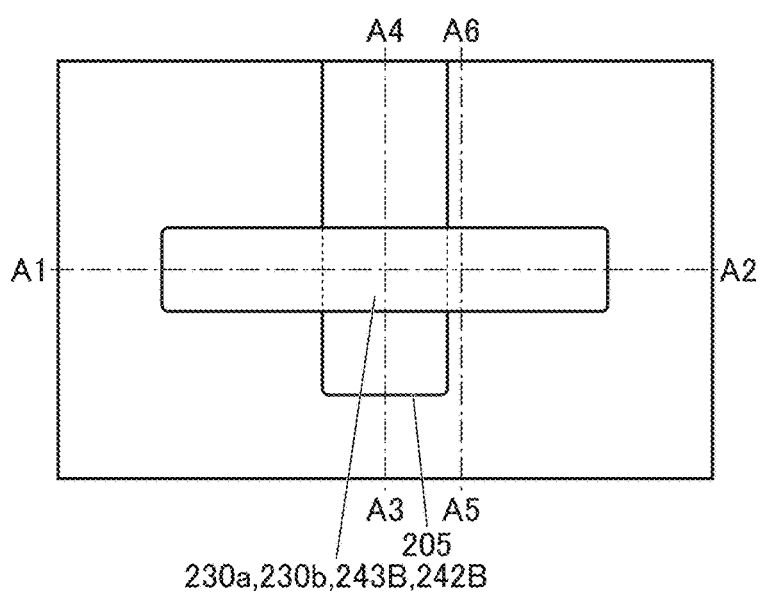
FIG. 29C
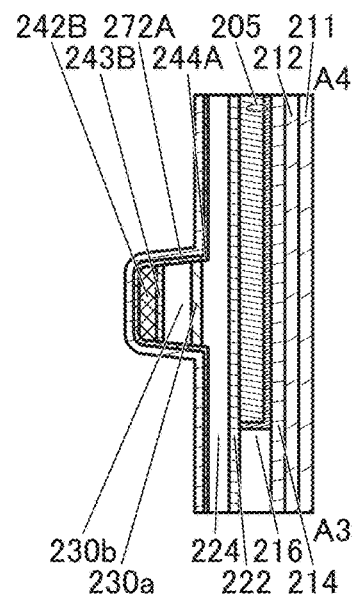
FIG. 29B
FIG. 29D
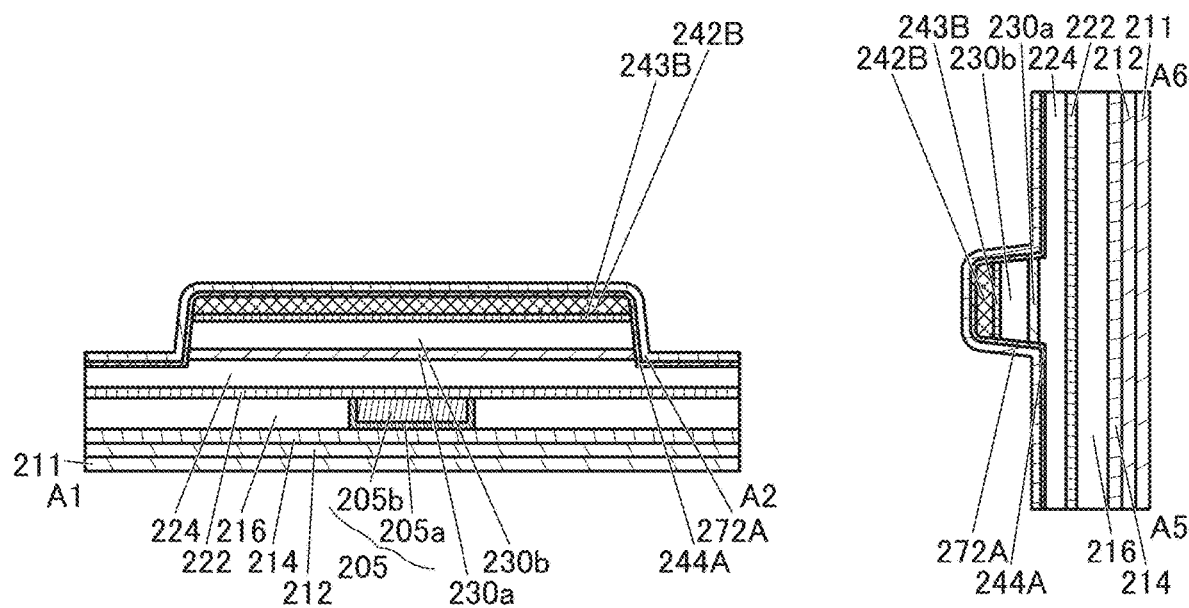

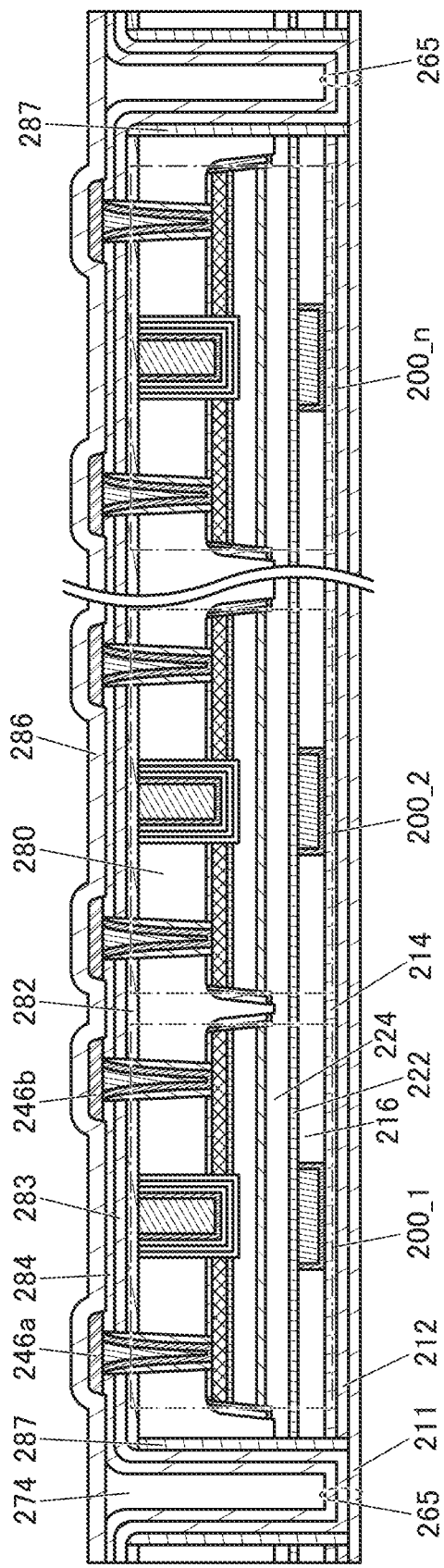

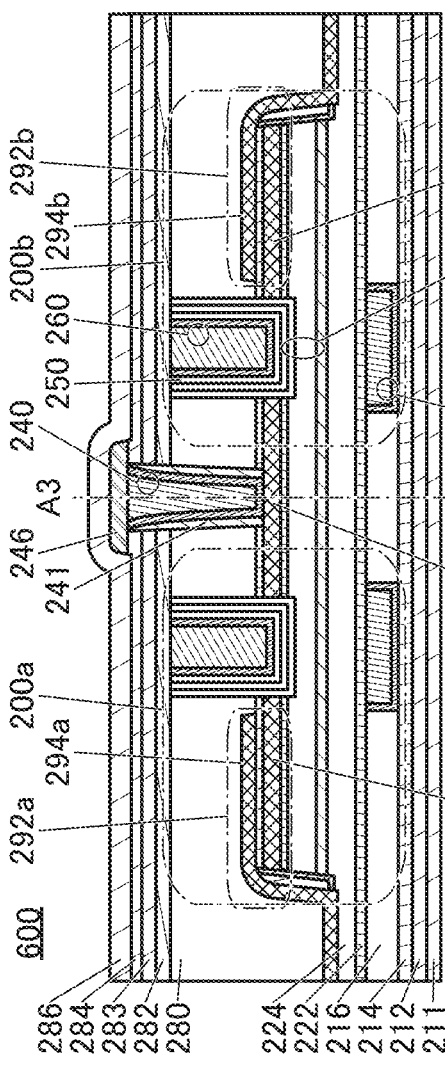
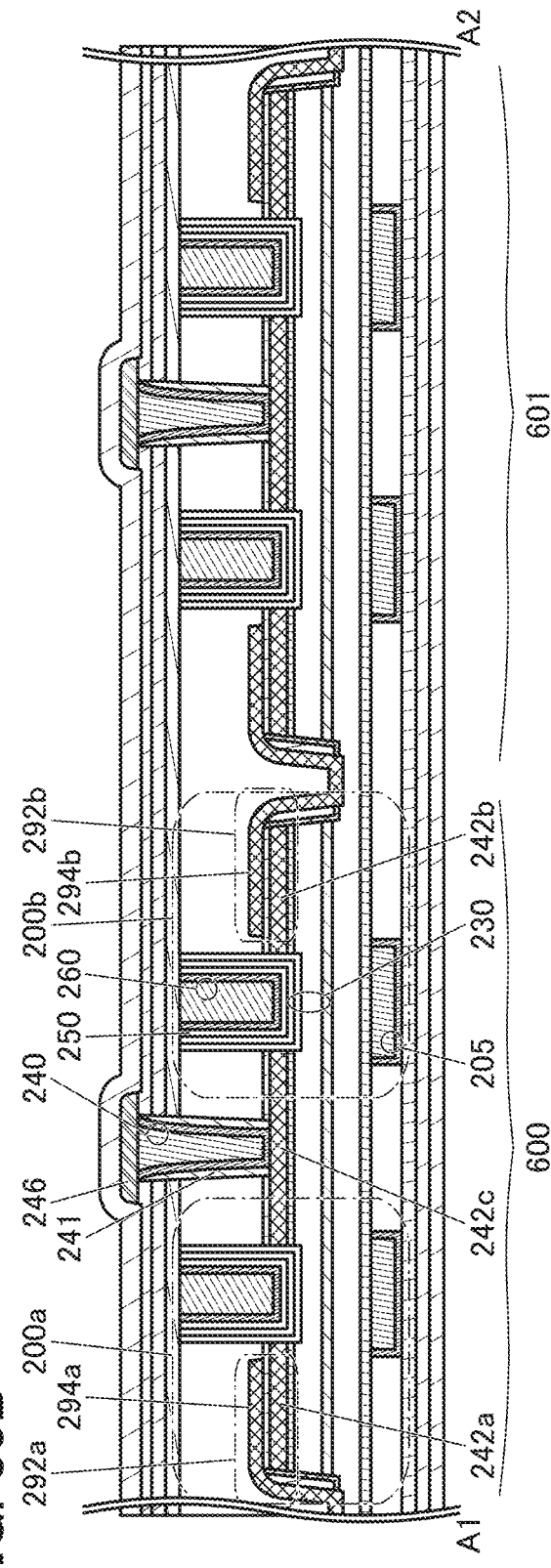
FIG. 35A
FIG. 35B

1471

1472

1473

1474

1475

1476

1477

1478

SEMICONDUCTOR DEVICE AND METHOD FOR MANUFACTURING SEMICONDUCTOR DEVICE

TECHNICAL FIELD

One embodiment of the present invention relates to a transistor, a semiconductor device, and an electronic device. One embodiment of the present invention relates to a method for manufacturing a semiconductor device. One embodiment of the present invention relates to a semiconductor wafer and a module.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has attracted attention. The transistor is widely used in electronic devices such as an integrated circuit (IC) or an image display device (also simply referred to as a display device). A silicon-based semiconductor material is widely known as a semiconductor thin film applicable to the transistor; in addition, an oxide semiconductor has attracted attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCES

Non-Patent Documents

[Non-Patent Document 1] S. Yamazaki et al., "SID Symposium Digest of Technical Papers", 2012, volume 43, issue 1, p. 183-186
[Non-Patent Document 2] S. Yamazaki et al., "Japanese Journal of Applied Physics", 2014, volume 53, Number 4S, p. 04ED18-1-04ED18-10

SUMMARY OF THE INVENTION

Problems to be Solved by the Invention

An object of one embodiment of the present invention is to provide a semiconductor device with a small variation in transistor characteristics. Another object of one embodiment of the present invention is to provide a semiconductor device having high reliability. Another object of one embodiment of the present invention is to provide a semiconductor device having favorable electrical characteristics. Another object of one embodiment of the present invention is to provide a semiconductor device having a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first insulator; a first oxide over the first insulator; a second oxide over the first oxide; a first conductor and a second conductor over the second oxide; a second insulator over the first conductor; a third insulator over the second conductor; a first layer and a second layer over the first insulator; a fourth insulator over the first layer; a fifth insulator over the second layer; a sixth insulator over the first insulator, the second insulator, and the third insulator; a third oxide positioned between the first conductor and the second conductor and positioned over the second oxide; a seventh insulator over the third oxide; and a third conductor over the seventh insulator. The sixth insulator includes a region in contact with a top surface of the first insulator. The first layer includes a region in contact with a side surface of the first oxide, a side surface of the second oxide, a side surface of the first conductor, and the top surface of the first insulator. The second layer includes a region in contact with the side surface of the first oxide, the side surface of the second oxide, a side surface of the second conductor, and the top surface of the first insulator. The fourth insulator is positioned over the first insulator with the first layer therebetween. The fifth insulator is positioned over the first insulator with the second layer therebetween.

In the above semiconductor device, the thicknesses of the first layer and the second layer are each preferably greater than or equal to 0.5 nm and less than or equal to 1.5 nm.

In the above semiconductor device, it is preferable that the first conductor and the second conductor be each a nitride containing tantalum, and the first layer and the second layer each contain tantalum and oxygen. It is further preferable that a tantalum concentration at and near an interface between the first insulator and the sixth insulator be lower than a tantalum concentration in the first layer or the second layer.

In the above semiconductor device, it is preferable that the second oxide and the third oxide each contain indium, an element M (M is gallium, aluminum, yttrium, or tin), and zinc.

Effect of the Invention

One embodiment of the present invention can provide a semiconductor device with a small variation in transistor characteristics. One embodiment of the present invention can provide a semiconductor device having high reliability. One embodiment of the present invention can provide a semiconductor device having favorable electrical characteristics. One embodiment of the present invention can provide a semiconductor device having a high on-state current. One embodiment of the present invention can provide a semiconductor device that can be miniaturized or highly integrated. One embodiment of the present invention can provide a semiconductor device with low power consumption.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 4A is a diagram showing the classification of crystal structures of IGZO. FIG. 4B is a diagram showing an XRD spectrum of quartz glass. FIG. 4C is a diagram showing an XRD spectrum of crystalline IGZO. FIG. 4D is a diagram showing a nanobeam electron diffraction pattern of crystalline IGZO.

FIG. 6A is a top view illustrating a method for manufacturing a semiconductor device of one embodiment of the present invention. FIG. 6B to FIG. 6D are cross-sectional views illustrating a method for manufacturing a semiconductor device of one embodiment of the present invention.

FIG. 28A is a top view illustrating a method for manufacturing a semiconductor device of one embodiment of the present invention. FIG. 28B to FIG. 28D are cross-sectional views illustrating a method for manufacturing a semiconductor device of one embodiment of the present invention.

FIG. 29A is a top view illustrating a method for manufacturing a semiconductor device of one embodiment of the present invention. FIG. 29B to FIG. 29D are cross-sectional views illustrating a method for manufacturing a semiconductor device of one embodiment of the present invention.

FIG. 31A and FIG. 31B are cross-sectional views of a semiconductor device of one embodiment of the present invention.

FIG. 35A and FIG. 35B are cross-sectional views of a semiconductor device of one embodiment of the present invention.

MODE FOR CARRYING OUT THE INVENTION

Figure 1A:
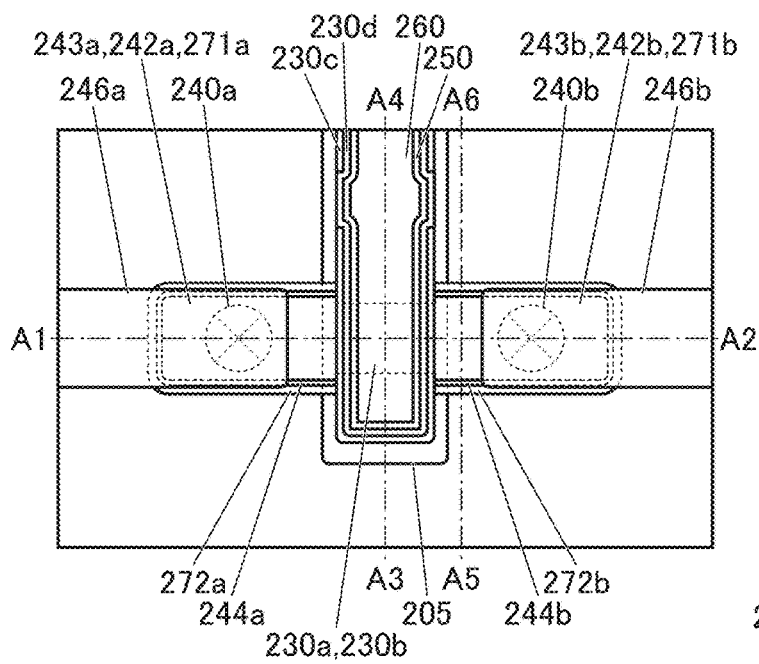
FIG. 1A is a top view of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers that are used to specify one embodiment of the present invention in some cases.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter, also referred to as an "effective channel width") is sometimes different from a channel width shown in a top view of a transistor (hereinafter, also referred to as an "apparent channel width"). For example, when a gate electrode covers a side surface of a semiconductor, an effective channel width is larger than an apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than the main components of the oxide semiconductor, and the like; hydrogen, lithium, sodium, silicon, boron, phosphorus, carbon, nitrogen, and the like are given as examples. Note that water also serves as an impurity in some cases. Entry of an impurity may cause oxygen vacancies (also referred to as $V_O$) in an oxide semiconductor, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, normally off means drain current per micrometer of channel width flowing through a transistor being $1 \times 10^{-20}$ A or less at room temperature, $1 \times 10^{-18}$ A or less at 85° C., or $1 \times 10^{-16}$ A or less at 125° C. when a potential is not applied to a gate or a ground potential is applied to the gate.

Embodiment 1

In this embodiment, an example of a semiconductor device including a transistor 200 of one embodiment of the present invention and a manufacturing method thereof will be described with reference to FIG. 1A to FIG. 31B.

Structure Example of Semiconductor Device

Figure 1C:
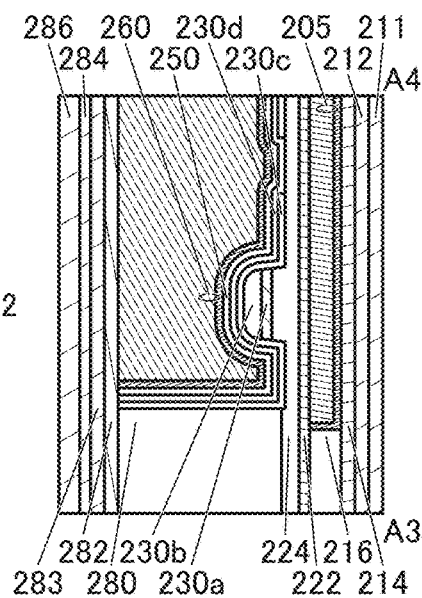
FIG. 1B to FIG. 1D are cross-sectional views of a semiconductor device of one embodiment of the present invention.
Figure 1B:
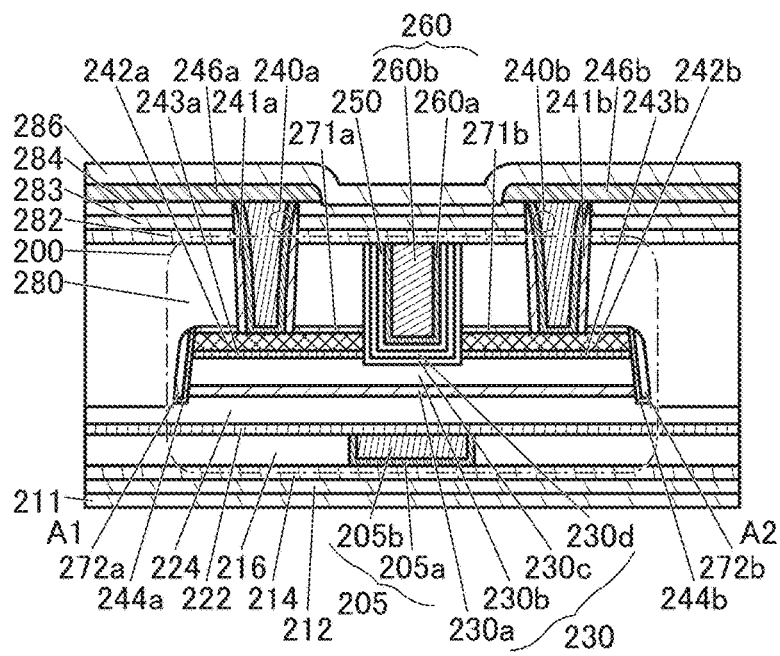
Figure 1D:
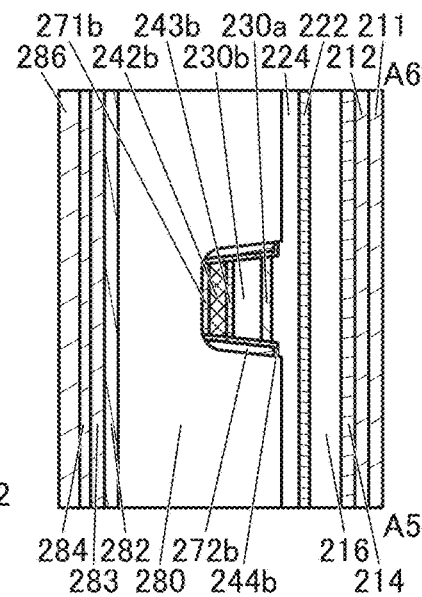

A structure of a semiconductor device including the transistor 200 is described with reference to FIG. 1A to FIG. 1D. FIG. 1A to FIG. 1D are a top view and cross-sectional views of a semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by the dashed-dotted line A1-A2 in FIG. 1A, and is also a cross-sectional view of the transistor 200 in the channel length direction. FIG. 1C is a cross-sectional view of a portion indicated by the dashed-dotted line A3-A4 in FIG. 1A, and is also a cross-sectional view of the transistor 200 in the channel width direction. FIG. 1D is a cross-sectional view of a portion indicated by the dashed-dotted line A5-A6 in FIG. 1A. Note that for clarity of the drawing, some components are not illustrated in the top view of FIG. 1A.

The semiconductor device of one embodiment of the present invention includes an insulator 211 over a substrate (not illustrated), an insulator 212 over the insulator 211, an insulator 214 over the insulator 212, the transistor 200 over the insulator 214, an insulator 280 over the transistor 200, an insulator 282 over the insulator 280, an insulator 283 over the insulator 282, and an insulator 284 over the insulator 283. The insulator 211, the insulator 212, the insulator 214, the insulator 280, the insulator 282, the insulator 283, and the insulator 284 function as interlayer films. The semiconductor device also includes a conductor 240a and a conductor 240b that are electrically connected to the transistor 200 and function as plugs. An insulator 241a is provided in contact with the side surface of the conductor 240a, and an insulator 241b is provided in contact with the side surface of the conductor 240b. A conductor 246a that is electrically connected to the conductor 240a and functions as a wiring and a conductor 246b that is electrically connected to the conductor 240b and functions as a wiring are provided over the insulator 284, the conductor 240a, and the conductor 240b. An insulator 286 is provided over the conductor 246a, the conductor 246b, and the insulator 284.

The insulator 241a is provided in contact with the inner wall of an opening in an insulator 271a, the insulator 280, the insulator 282, the insulator 283, and the insulator 284; a first conductor of the conductor 240a is provided in contact with the side surface of the insulator 241a; and a second conductor of the conductor 240a is provided on the inner side thereof. The insulator 241b is provided in contact with the inner wall of an opening in an insulator 271b, the insulator 280, the insulator 282, the insulator 283, and the insulator 284; a first conductor of the conductor 240b is provided in contact with the side surface of the insulator 241b; and a second conductor of the conductor 240b is provided on the inner side thereof. Here, the level of the top surfaces of the conductor 240a and the conductor 240b and the level of the top surface of the insulator 284 in a region overlapping with the conductor 246a or the conductor 246b can be substantially the same. Note that although the transistor 200 has a structure in which the first conductor of the conductor 240a and the second conductor of the conductor 240a are stacked and the first conductor of the conductor 240b and the second conductor of the conductor 240b are stacked, the present invention is not limited thereto. For example, the conductor 240a and the conductor 240b may each have a single-layer structure or a stacked-layer structure of three or more layers. In the case where a structure body has a stacked-layer structure, layers may be distinguished by ordinal numbers corresponding to the formation order.

[Transistor 200]

As illustrated in FIG. 1A to FIG. 1D, the transistor 200 includes an insulator 216 over the insulator 214; a conductor 205 (a conductor 205a and a conductor 205b) positioned to be embedded in the insulator 214 and/or the insulator 216; an insulator 222 over the insulator 216 and the conductor 205; an insulator 224 over the insulator 222; an oxide 230a over the insulator 224; an oxide 230b over the oxide 230a; an oxide 243a, an oxide 243b, and an oxide 230c over the oxide 230b; a conductor 242a over the oxide 243a; a conductor 242b over the oxide 243b; an insulator 271a over the conductor 242a; an insulator 271b over the conductor 242b; an oxide 230d over the oxide 230c; an insulator 250 over the oxide 230d; a conductor 260 (a conductor 260a and a conductor 260b) that is positioned over the insulator 250 and overlaps with part of the oxide 230c; a layer 244a in contact with part of the side surface of the oxide 230a, part of the side surface of the oxide 230b, the side surface of the oxide 243a, the side surface of the conductor 242a, and the side surface of the insulator 271a; a layer 244b in contact with part of the side surface of the oxide 230a, part of the side surface of the oxide 230b, the side surface of the oxide 243b, the side surface of the conductor 242b, and the side surface of the insulator 271b; an insulator 272a in contact with the top surface and side surface of the layer 244a; and an insulator 272b in contact with the top surface and side surface of the layer 244b. The oxide 230c is in contact with the side surface of the oxide 243a, the side surface of the oxide 243b, the side surface of the conductor 242a, and the side surface of the conductor 242b. Here, as illustrated in FIG. 1B and FIG. 1C, the top surface of the conductor 260 is positioned to be substantially level with the top surface of the insulator 250, the top surface of the oxide 230d, and the top surface of the oxide 230c. The insulator 282 is in contact with the top surfaces of the conductor 260, the insulator 250, the oxide 230d, the oxide 230c, and the insulator 280.

An opening reaching the oxide 230b is formed in the insulator 280. The oxide 230c, the oxide 230d, the insulator 250, and the conductor 260 are positioned in the opening. In addition, in the channel length direction of the transistor 200, the conductor 260, the insulator 250, the oxide 230d, and the oxide 230c are provided between the insulator 271a, the conductor 242a, and the oxide 243a and the insulator 271b, the conductor 242b, and the oxide 243b. The insulator 250 includes a region in contact with the side surface of the conductor 260 and a region in contact with the bottom surface of the conductor 260. The oxide 230c includes a region in contact with the oxide 230b, a region overlapping with the side surface of the conductor 260 with the oxide 230d and the insulator 250 therebetween, and a region overlapping with the bottom surface of the conductor 260 with the oxide 230d and the insulator 250 therebetween.

The oxide 230 preferably includes the oxide 230a positioned over the insulator 224, the oxide 230b positioned over the oxide 230a, the oxide 230c that is positioned over the oxide 230b and is at least partly in contact with the oxide 230b, and the oxide 230d positioned over the oxide 230c.

Although a structure in which the oxide 230 has a four-layer stacked structure of the oxide 230a, the oxide 230b, the oxide 230c, and the oxide 230d in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, a three-layer structure of the oxide 230a, the oxide 230b, and the oxide 230c, or a stacked-layer structure including five or more layers. Alternatively, each of the oxide 230a, the oxide 230b, the oxide 230c, and the oxide 230d may have a stacked-layer structure.

The conductor 260 functions as a first gate (also referred to as top gate) electrode, and the conductor 205 functions as a second gate (also referred to as back gate) electrode. The insulator 250 functions as a first gate insulator, and the insulator 224 and the insulator 222 function as a second gate insulator. The conductor 242a functions as one of a source and a drain, and the conductor 242b functions as the other of the source and the drain. The oxide 230 functions as a channel formation region.

Figure 2:
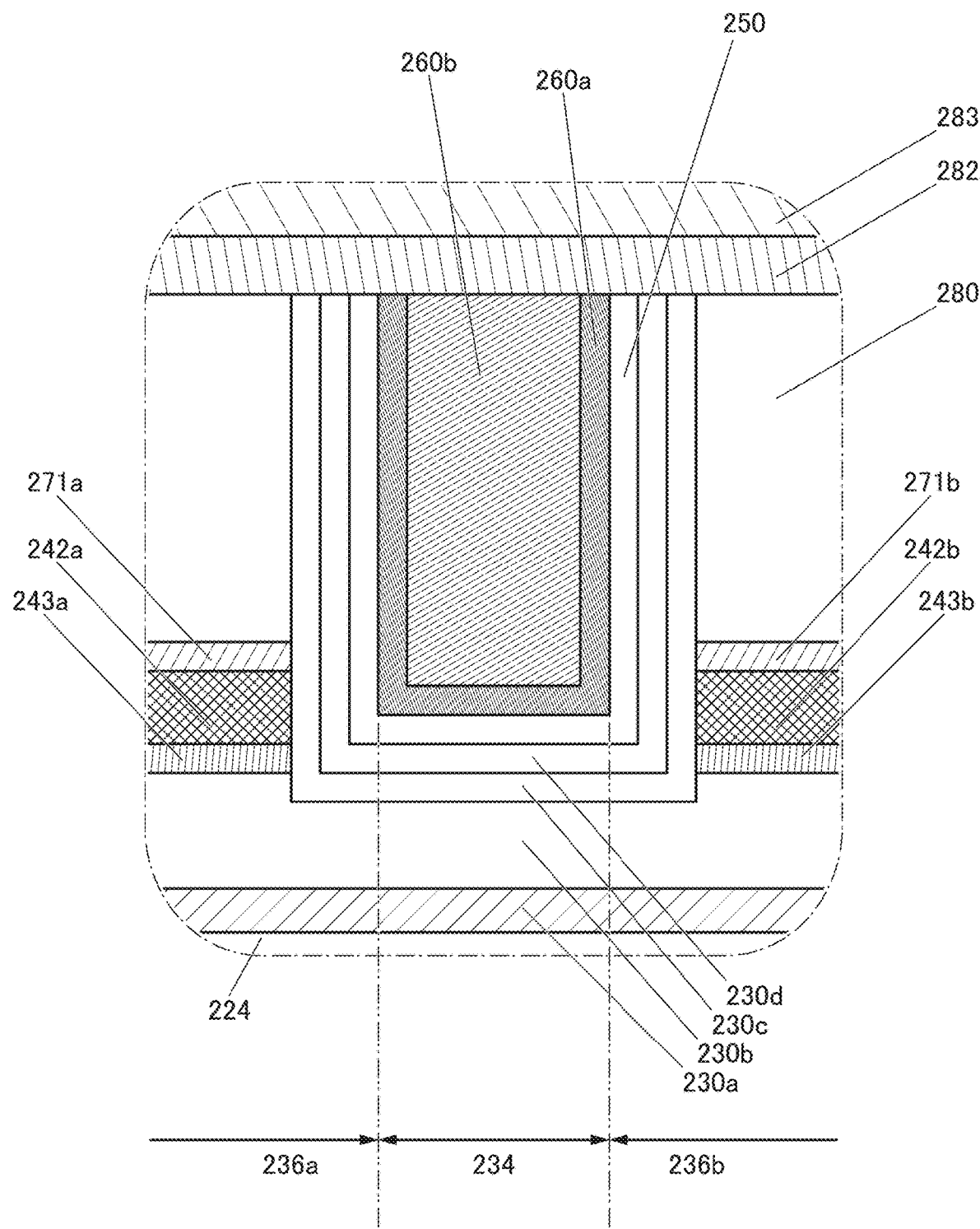
FIG. 2 is a cross-sectional view of a semiconductor device of one embodiment of the present invention.

Here, FIG. 2 is an enlarged view of the vicinity of the channel formation region in FIG. 1B. As illustrated in FIG. 2, the oxide 230 includes a region 234 functioning as the channel formation region of the transistor 200 and a region 236a and a region 236b that function as a source region and a drain region and are provided such that the region 234 is sandwiched therebetween. At least part of the region 234 overlaps with the conductor 260. The conductor 242a and the conductor 242b are provided over the oxide 230b, and lower-resistance regions are formed in the vicinity of the conductor 242a of the region 236a and in the vicinity of the conductor 242b of the region 236b.

The region 236a and the region 236b functioning as the source region and the drain region are each a region that has a low oxygen concentration or contains impurities such as hydrogen, nitrogen, and a metal element, for example, and thus has an increased carrier concentration and reduced resistance. In other words, the region 236a and the region 236b are each a region having a higher carrier concentration and lower resistance than the region 234. The region 234 functioning as the channel formation region is a higher-resistance region with a lower carrier concentration because it has a higher oxygen concentration or a lower impurity concentration than the region 236a and the region 236b, for example. A region having an oxygen concentration higher than or equal to an oxygen concentration of the region 236a and lower than or equal to an oxygen concentration of the region 234 may be formed between the region 234 and the region 236a; or a region having an oxygen concentration higher than or equal to an oxygen concentration of the region 236b and lower than or equal to the oxygen concentration of the region 234 may be formed between the region 234 and the region 236b.

Although the width of the region 234 in the channel length direction is equal to the width of the conductor 260 in FIG. 2, one embodiment of the present invention is not limited thereto. The width of the region 234 is smaller than the width of the conductor 260 in some cases, and the width of the region 234 is larger than the width of the conductor 260 in other cases.

In the oxide 230, the boundaries between the regions are difficult to detect clearly in some cases. The concentration of impurities such as hydrogen, nitrogen, and a metal element detected in each region might not only gradually change between the regions, but also continuously change within each region. That is, the region closer to the channel formation region preferably has a lower concentration of impurities such as hydrogen, nitrogen, and a metal element.

In the transistor 200, as the oxide 230 (the oxide 230a, the oxide 230b, the oxide 230c, and the oxide 230d) including the channel formation region, a metal oxide functioning as a semiconductor (hereinafter, also referred to as an oxide semiconductor) is preferably used.

The metal oxide functioning as a semiconductor preferably has a band gap of 2 eV or more, further preferably 2.5 eV or more. With the use of a metal oxide having such a wide band gap, the off-state current of the transistor can be reduced.

For example, as the oxide 230, a metal oxide such as an In—M—Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide, an In—Zn oxide, or indium oxide may be used as the oxide 230.

The oxide 230 preferably has a stacked-layer structure of a plurality of oxide layers with different chemical compositions. Specifically, the atomic ratio of the element M to metal elements of main components in the metal oxide used as the oxide 230a is preferably greater than the atomic ratio of the element M to metal elements of main components in the metal oxide used as the oxide 230b. Moreover, the atomic ratio of the element M to In in the metal oxide used as the oxide 230a is preferably greater than the atomic ratio of the element M to In in the metal oxide used as the oxide 230b. Moreover, the atomic ratio of In to the element M in the metal oxide used as the oxide 230b is preferably greater than the atomic ratio of In to the element M in the metal oxide used as the oxide 230a.

Moreover, the atomic ratio of the element M to In in the metal oxide used as the oxide 230a or the oxide 230d is preferably greater than the atomic ratio of the element M to In in the metal oxide used as the oxide 230b or the oxide 230c. The greater the atomic ratio of the element M to In is, the more likely the diffusion of impurities or oxygen is to be inhibited. Thus, including the oxide 230a below the oxide 230b makes it possible to inhibit diffusion of impurities into the oxide 230b from the components formed below the oxide 230a. Moreover, including the oxide 230d over the oxide 230c makes it possible to inhibit diffusion of impurities into the oxide 230c from the components formed above the oxide 230d.

In other words, the atomic ratio of In to the element M in the metal oxide used as the oxide 230b or the oxide 230c is preferably greater than the atomic ratio of In to the element M in the metal oxide used as the oxide 230a or the oxide 230d. When the oxide 230a, the oxide 230b, the oxide 230c, and the oxide 230d contain a common element (as the main component) besides oxygen, the density of defect states at each interface between the oxide 230a, the oxide 230b, the oxide 230c, and the oxide 230d can be low. In that case, a main carrier path is the oxide 230b, the oxide 230c, or the vicinity thereof, for example, the interface between the oxide 230b and the oxide 230c. Since the density of defect states at the interface between the oxide 230b and the oxide 230c can be decreased, the influence of interface scattering on carrier conduction is small, and a high on-state current can be obtained.

The oxide 230b and the oxide 230c preferably have crystallinity. It is particularly preferable to use a CAAC-OS (c-axis aligned crystalline oxide semiconductor) described later as the oxide 230b and the oxide 230c. The oxide 230d may also have crystallinity.

The use of the CAAC-OS as the oxide 230b and the oxide 230c can reduce impurities and oxygen vacancies in the channel formation region in the oxide semiconductor.

Accordingly, a transistor that has stable electrical characteristics with a small variation in electrical characteristics and improved reliability can be provided.

Furthermore, extraction of oxygen from the oxide 230b by the source electrode or the drain electrode can be inhibited. This can reduce oxygen extraction from the oxide 230b even when heat treatment is performed; thus, the transistor 200 is stable with respect to high temperatures in a manufacturing process (what is called thermal budget).

The CAAC-OS has a property of making oxygen move easily in the direction perpendicular to the c-axis. Thus, oxygen contained in the oxide 230c can be efficiently supplied to the oxide 230b.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

A clear crystal grain boundary is difficult to observe in the CAAC-OS; thus, it can be said that a reduction in electron mobility due to the crystal grain boundary is unlikely to occur. Thus, a metal oxide including a CAAC-OS is physically stable. Therefore, the metal oxide including a CAAC-OS is resistant to heat and has high reliability.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide having a dense structure with high crystallinity and a small amount of impurities or defects (oxygen vacancies and the like) as described above. In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

A transistor using an oxide semiconductor is likely to have its electrical characteristics changed by impurities and oxygen vacancies in a channel formation region of the oxide semiconductor, which may affect the reliability. In some cases, hydrogen in the vicinity of an oxygen vacancy forms a defect that is an oxygen vacancy into which hydrogen enters (hereinafter, sometimes referred to as $V_OH$), which generates an electron serving as a carrier. Therefore, when the channel formation region in the oxide semiconductor includes oxygen vacancies, the transistor tends to have normally-on characteristics (the channel is generated even when no voltage is applied to the gate electrode and current flows through the transistor). Therefore, the impurities and oxygen vacancies are preferably reduced as much as possible in the channel formation region of the oxide semiconductor. In other words, the oxide semiconductor preferably includes an i-type (intrinsic) or substantially i-type channel formation region with a low carrier concentration.

As a countermeasure to the above, an insulator containing oxygen that is released by heating (hereinafter, sometimes referred to as excess oxygen) is provided in the vicinity of the oxide semiconductor so that oxygen can be supplied from the insulator to the oxide semiconductor when heat treatment is performed. As a result, oxygen vacancies in the channel formation region in the oxide semiconductor can be filled with supplied oxygen. Furthermore, hydrogen remaining in the oxide semiconductor reacts with supplied oxygen, so that the hydrogen can be removed as $H_2O$ (dehydration). This can inhibit formation of $V_OH$ in the oxide semiconductor.

However, when an excess amount of oxygen is supplied to the source region or the drain region, the carrier concentration in the source region or the drain region is reduced, so that the on-state current or field-effect mobility of the transistor 200 might be decreased. Furthermore, a variation in the amount of oxygen supplied to the source region or the drain region on the substrate plane leads to a variation in characteristics of the semiconductor device including the transistor.

Hence, the region 234 functioning as the channel formation region in the oxide semiconductor is preferably i-type or substantially i-type with a low carrier concentration, whereas the region 236a and the region 236b functioning as the source region and the drain region are preferably n-type with a high carrier concentration. That is, it is preferable that oxygen be supplied to the region 234 in the oxide semiconductor and the region 236a and the region 236b not be supplied with an excess amount of oxygen.

Thus, in this embodiment, oxygen diffuses from the insulator 280 containing excess oxygen to the oxide 230c through the insulator 224, and oxygen is supplied from the oxide 230c to the oxide 230b. Accordingly, oxygen can be selectively supplied to the oxide 230c and a region of the oxide 230b that is in contact with the oxide 230c, which account for a large portion of the region 234.

Figure 3A:
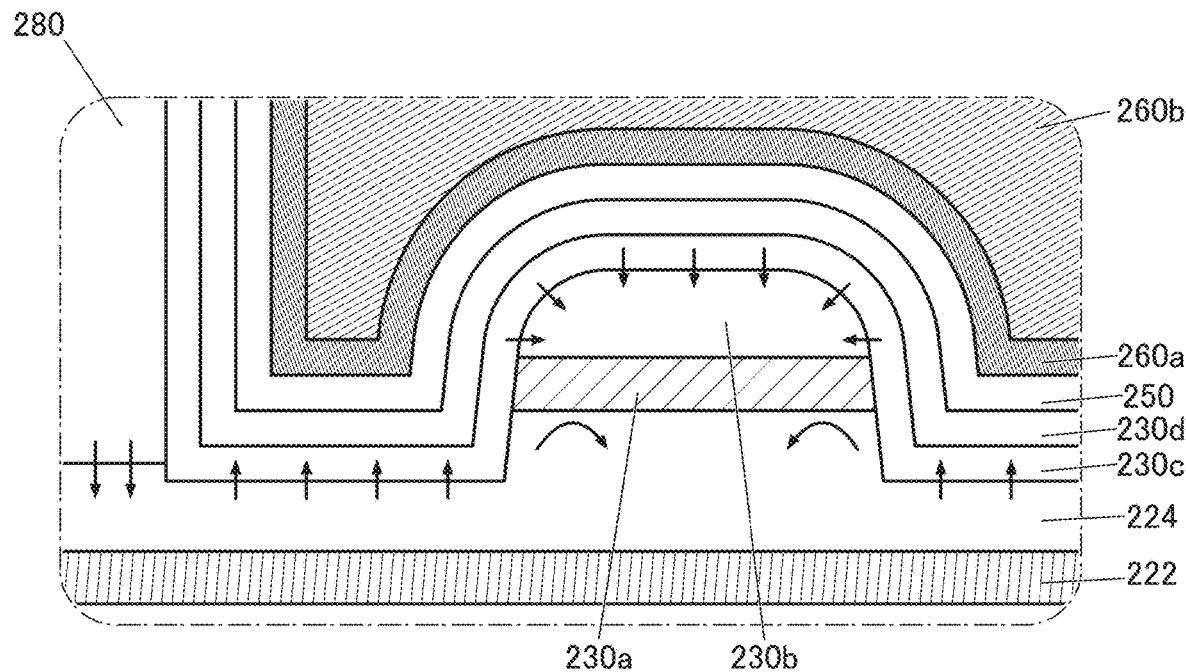
FIG. 3A and FIG. 3B are cross-sectional views of a semiconductor device of one embodiment of the present invention.
Figure 3B:
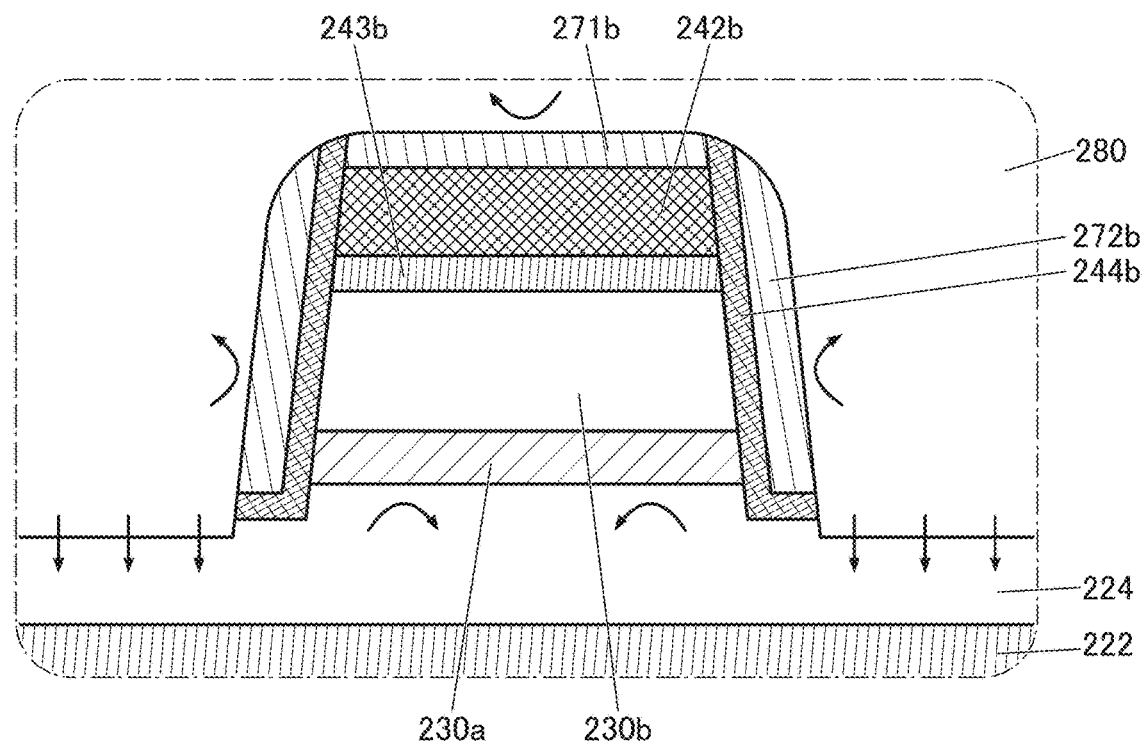

Here, the behavior of oxygen at the time of performing heat treatment on the transistor 200 of this embodiment will be described with reference to FIG. 3A and FIG. 3B. FIG. 3A is an enlarged cross-sectional view corresponding to FIG. 1C, and FIG. 3B is an enlarged cross-sectional view corresponding to FIG. 1D. That is, the oxide 230b and the oxide 230c illustrated in FIG. 3A are regions where the channel is formed, and the oxide 230b illustrated in FIG. 3B is a region functioning as the source region or the drain region. Note that arrows in FIG. 3A and FIG. 3B indicate the main oxygen diffusion directions.

As illustrated in FIG. 3A and FIG. 3B, excess oxygen contained in the insulator 280 diffuses from the interface between the insulator 280 and the insulator 224 to the insulator 224. Furthermore, as illustrated in FIG. 3A, excess oxygen contained in the insulator 224 diffuses from the interface between the insulator 224 and the oxide 230c to the oxide 230c. Moreover, excess oxygen contained in the oxide 230c diffuses from the interface between the oxide 230c and the oxide 230b to the oxide 230b. In this manner, excess oxygen contained in the insulator 280 is supplied to the region 234 functioning as the channel formation region of the transistor 200.

When the above CAAC-OS having a dense structure is used as the oxide 230b, diffusion of impurities and oxygen in the oxide 230b can be reduced. Accordingly, oxygen supplied to the region 234 of the oxide 230b can be inhibited from diffusing to the region 236a or the region 236b of the oxide 230b.

Part of excess oxygen diffusing to the oxide 230c also diffuses to the oxide 230d. Oxygen is less likely to diffuse to the oxide 230d than to the oxide 230c; thus, diffusion of oxygen to the insulator 250 is relatively inhibited. Thus, oxidation of the conductor 260 through the insulator 250 can be inhibited.

As illustrated in FIG. 3A and FIG. 3B, the oxide 230b overlaps with the insulator 224 with the oxide 230a having a low oxygen-transmitting property therebetween. Thus, excess oxygen contained in the insulator 224 is less likely to diffuse to the oxide 230a than to the oxide 230c. Accordingly, diffusion of excess oxygen contained in the insulator 224 from a bottom surface of the oxide 230b is relatively inhibited.

Note that a step of forming the oxide 230b or the like in an island shape is included between a step of depositing the insulator 224 and a step of forming the insulator 280 over the insulator 224. When the oxide 230b or the like is formed in an island shape, a layer is sometimes formed over the insulator 224 in a region not overlapping with the oxide 230b. When the insulator 280 is formed over the layer, the layer is positioned between the insulator 224 and the insulator 280. In the case where the layer has a function of inhibiting diffusion of oxygen, diffusion of excess oxygen contained in the insulator 280 to the insulator 224 is inhibited. This might reduce the amount of oxygen supplied to the channel formation region of the oxide 230. Thus, the layer over the insulator 224 is preferably removed.

The layer is also formed on the side surface of the oxide 230a and the side surface of the oxide 230b in some cases. In the case where the layer has a function of inhibiting diffusion of oxygen, entry of oxygen into the region 236a and the region 236b can be inhibited. Thus, the layer formed on the side surface of the oxide 230a and the side surface of the oxide 230b is preferably left.

Thus, in the transistor of one embodiment of the present invention, it is preferable that part of the layer over the insulator 224 be removed, the layer 244a and the layer 244b be formed to cover the side surfaces of the oxide 230a and the oxide 230b, the insulator 272a be formed to cover the side surface of the layer 244a, and the insulator 272b be formed to cover the side surface of the layer 244b.

As illustrated in FIG. 3B, the layer 244b is provided in contact with the side surfaces of the oxide 230a, the oxide 230b, the oxide 243b, the conductor 242b, and the insulator 271b, the insulator 272b is provided in contact with the side surface of the layer 244b, and the insulator 271b is provided on the top surface of the conductor 242b. That is, the oxide 230a, the oxide 230b, the oxide 243b, and the conductor 242b are isolated from the insulator 280 by the layer 244b, the insulator 271b, and the insulator 272b through which oxygen is less likely to diffuse. This can inhibit excess oxygen contained in the insulator 280 from directly diffusing to the oxide 230a, the oxide 230b, the oxide 243b, and the conductor 242b. Note that in the above, only the conductor 242b side (the region 236b side) illustrated in FIG. 3B is mentioned; however, diffusion of excess oxygen can be similarly inhibited on the conductor 242a side (the region 236a side).

As described above, oxygen is selectively supplied to the region 234 of the oxide semiconductor to make the region 234 i-type or substantially i-type, and diffusion of oxygen to the region 236a and the region 236b functioning as the source region and the drain region is inhibited to maintain the n-type of the region 236a and the region 236b. As a result, changes in the electrical characteristics of the transistor 200 can be inhibited, and thus variation in the electrical characteristics of the transistor 200 on the substrate plane can be inhibited.

With the structure above, a semiconductor device with a small variation in transistor characteristics can be provided. A highly reliable semiconductor device can be provided. A semiconductor device having favorable electrical characteristics can be provided.

In order to make the oxide 230c serve as a main carrier path, the atomic ratio of indium to a metal element that is a main component in the oxide 230c is preferably greater than the atomic ratio of indium to a metal element that is a main component in the oxide 230b. When a metal oxide having a high content of indium is used for a channel formation region, the on-state current of the transistor can be increased. Accordingly, when the atomic ratio of indium to a metal element that is a main component in the oxide 230c is greater than the atomic ratio of indium to a metal element that is a main component in the oxide 230b, the oxide 230c can serve as a main carrier path.

Furthermore, in order to make the oxide 230c serve as a main carrier path, the conduction band minimum of the oxide 230c is preferably more apart from the vacuum level than the conduction band minimum of each of the oxide 230a, the oxide 230b, and the oxide 230d is. In other words, the electron affinity of the oxide 230c is preferably larger than the electron affinity of each of the oxide 230a, the oxide 230b, and the oxide 230d.

A shift voltage (Vsh) measured with a +GBT (Gate Bias Temperature) stress test is given as an example of a parameter for evaluating the reliability of a transistor. Vsh is defined as gate voltage (Vg) at which, in a drain current (Id)-Vg curve of a transistor, the tangent at a point where the slope of the curve is the steepest intersects the straight line of Id=1 pA. Furthermore, the amount of change in Vsh is represented as ΔVsh.

ΔVsh of a transistor under a +GBT stress test shifts in the negative direction over time in some cases. In addition, ΔVsh sometimes shows the behavior of shifting in not one direction (e.g., negative direction) but both the negative direction and the positive direction. Note that this behavior is sometimes referred to as jagged behavior of ΔVsh in +GBT stress tests in this specification and the like.

When the metal oxide not containing the element M as its main component or the metal oxide with a small proportion of the element M is used as the oxide 230c, ΔVsh can be reduced and jagged behavior of ΔVsh can be inhibited, for example, whereby the reliability of a transistor can be improved.

The oxide 230d preferably contains at least one of the metal elements contained in the metal oxide used as the oxide 230c, and further preferably contains all of the metal elements. For example, it is preferable that an In—M—Zn oxide, an In—Zn oxide, or indium oxide be used as the oxide 230c, and an In—M—Zn oxide, an M—Zn oxide, or an oxide of the element M be used as the oxide 230d. Accordingly, the density of defect states at the interface between the oxide 230c and the oxide 230d can be decreased.

The oxide 230d is preferably a metal oxide that inhibits diffusion or passage of oxygen, compared to the oxide 230c. Providing the oxide 230d between the insulator 250 and the oxide 230c can inhibit diffusion of oxygen contained in the insulator 280 into the insulator 250. Thus, the oxygen can be efficiently supplied to the oxide 230b through the oxide 230c.

When the atomic ratio of In to the metal element that is the main component in the metal oxide used as the oxide 230d is smaller than the atomic ratio of In to the metal element that is the main component in the metal oxide used as the oxide 230c, diffusion of In to the insulator 250 side can be inhibited. Since the insulator 250 functions as a gate insulator, the transistor exhibits poor characteristics when In enters the insulator 250 and the like. Thus, the oxide 230d provided between the oxide 230c and the insulator 250 enables a semiconductor device to have high reliability.

Here, the conduction band minimum gradually changes at junction portions of the oxide 230a, the oxide 230b, the oxide 230c, and the oxide 230d. In other words, the conduction band minimum at the junction portions of the oxide 230a, the oxide 230b, the oxide 230c, and the oxide 230d continuously changes or is continuously connected. To obtain this, the density of defect states in a mixed layer formed at the interface between the oxide 230a and the oxide 230b, the interface between the oxide 230b and the oxide 230c, and the interface between the oxide 230c and the oxide 230d is preferably decreased.

Specifically, when the oxide 230a and the oxide 230b, the oxide 230b and the oxide 230c, and the oxide 230c and the oxide 230d contain the same element as a main component in addition to oxygen, a mixed layer with a low density of defect states can be formed. For example, in the case where the oxide 230b is an In—M—Zn oxide, an In—M—Zn oxide, an M-Zn oxide, an oxide of the element M, an In—Zn oxide, indium oxide, or the like may be used as the oxide 230a, the oxide 230c, and the oxide 230d.

Specifically, as the oxide 230a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230b, a metal oxide with a composition of In:M:Zn=1:1:1 [atomic ratio] or in the neighborhood thereof, or a composition of In:M:Zn=4:2:3 [atomic ratio] or in the neighborhood thereof is used. As the oxide 230c, a metal oxide with a composition of In:M:Zn=4:2:3 [atomic ratio] or in the neighborhood thereof, a composition of In:M:Zn=5:1:3 [atomic ratio] or in the neighborhood thereof, or a composition of In:M:Zn=10:1:3 [atomic ratio] or in the neighborhood thereof, or indium oxide is used. As the oxide 230d, a metal oxide with a composition of In:M:Zn=1:3:4 [atomic ratio] or in the neighborhood thereof, a composition of M:Zn=2:1 [atomic ratio] or in the neighborhood thereof, a composition of M:Zn=2:5 [atomic ratio] or in the neighborhood thereof, or an oxide of the element M is used. Note that a composition in the neighborhood includes ±30% of an intended atomic ratio. Gallium is preferably used as the element M.

When the oxide 230a, the oxide 230b, the oxide 230c, and the oxide 230d have the above structure, the density of defect states at the interface between the oxide 230a and the oxide 230b, the interface between the oxide 230b and the oxide 230c, and the interface between the oxide 230c and the oxide 230d can be made low. Thus, the influence of interface scattering on carrier conduction is small, and the transistor 200 can have a high on-state current and excellent frequency characteristics.

In a cross-sectional view of the transistor in the channel length direction, it is preferable that a groove be provided in the oxide 230b and the oxide 230c including the CAAC-OS be embedded in the groove. At this time, the oxide 230c is provided to cover the inner wall (the side wall and the bottom surface) of the groove.

It is preferable that the depth of the groove of the oxide 230b be substantially the same as the thickness of the oxide 230c. In other words, in a cross-sectional view of the transistor in the channel length direction, it is preferable that the interface between the oxide 230b and the oxide 243a or the oxide 243b be substantially level with the lowest position of the interface between the oxide 230c and the oxide 230d. For example, a difference between the level of the interface between the oxide 230b and the oxide 243a or the oxide 243b and the level of the lowest position of the interface between the oxide 230c and the oxide 230d is preferably smaller than or equal to the thickness of the oxide 230c, further preferably smaller than or equal to half of the thickness of the oxide 230c.

Such a structure reduces the effect of impurities such as $V_OH$ in the transistor, whereby a channel can be formed in the oxide 230c. As a result, the transistor can have favorable electrical characteristics. Furthermore, a semiconductor device with a small variation in transistor characteristics and high reliability can be provided.

Moreover, impurities at the interface between the oxide 230b and the oxide 230c and in the vicinity thereof are preferably reduced or removed. It is particularly preferable that impurities such as aluminum and silicon be reduced or removed because the impurities hinder an increase in the crystallinity or c-axis alignment of the oxide 230c and the oxide 230b. For example, the concentration of aluminum atoms at the interface between the oxide 230b and the oxide 230c and in the vicinity thereof is preferably lower than or equal to 2.0 atomic %, further preferably lower than or equal to 1.5 atomic %, still further preferably lower than or equal to 1.0 atomic %.

Note that in a metal oxide, a region having become an amorphous-like oxide semiconductor (a-like OS) where an increase in crystallinity or c-axis alignment is hindered by impurities such as aluminum and silicon is referred to as a non-CAAC region in some cases. In the non-CAAC region, a large amount of $V_OH$ is generated; thus, it is highly probable that the transistor easily becomes normally on. Accordingly, the non-CAAC region is preferably reduced in size or removed.

By contrast, since a dense crystal structure is formed in the oxide 230b and the oxide 230c each having a CAAC structure, it is difficult for $V_OH$ to exist stably. Furthermore, oxygen adding treatment described later supplies excess oxygen to the oxide 230b and the oxide 230c, whereby the reactions, $V_OH \rightarrow V_O+H$ and $V_O+O \rightarrow null$, can progress. This can reduce $V_OH$ in the oxide 230b and the oxide 230c, and can also reduce $V_O$. When the oxide 230b and the oxide 230c each have a CAAC structure as described above, the transistor can be inhibited from becoming normally on.

FIG. 2 illustrates the structure in which the side wall of the opening in which the conductor 260 and the like are embedded is substantially perpendicular to the formation surface of the oxide 230b including the groove of the oxide 230b; one embodiment of the present invention is not limited thereto. The opening may have a U-shape with a bottom portion having a gentle curve.

Here, in the oxide 230c, it is preferable that the c-axis be substantially perpendicular to the formation surface or the top surface of the oxide 230c. Thus, the oxide 230c includes a region where crystal layers extend to be substantially parallel to the bottom surface and the side surface of the opening. The oxide 230d further preferably has a crystal structure similar to that of the oxide 230c.

An angle formed between the a-b plane of the oxide 230c in the groove and the a-b plane of the oxide 230b is preferably less than or equal to 60°, further preferably less than or equal to 45°, still further preferably less than or equal to 30°. By making the angle formed between the a-b plane of the oxide 230c in the groove and the a-b plane of the oxide 230b small, the crystallinity of the oxide 230c in the groove can be increased.

An oxide formed of a non-CAAC region is sometimes formed in contact with the interface between the oxide 230b and the oxide 230c. The amount of impurities in the oxide is preferably reduced. It is particularly preferable to reduce the amount of impurity elements that hinder an increase in crystallinity or c-axis alignment, such as aluminum and silicon. The concentration of aluminum atoms in the oxide is preferably lower than or equal to 2.0 atomic %, further preferably lower than or equal to 1.5 atomic %, still further preferably lower than or equal to 1.0 atomic %, for example. As described above, the oxide formed of the non-CAAC region is preferably reduced in size or removed.

Note that the oxide is not necessarily formed to be surrounded by the oxide 230b, the oxide 243a, the oxide 230c, and the oxide 230d, and is sometimes formed to be sandwiched between the oxide 230b and the oxide 230c.

As illustrated in FIG. 3A, a curved surface may be provided between the side surface of the oxide 230b and the top surface of the oxide 230b in a cross-sectional view of the transistor 200 in the channel width direction. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in the region overlapping with the conductor 242a or the conductor 242b or less than half of the length of the region not having the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the groove with the insulator 250 and the conductor 260, which are formed in a later step. Furthermore, a decrease in the length of the region not having the curved surface can be prevented, and reductions in the on-state current and mobility of the transistor 200 can be inhibited. Thus, a semiconductor device having favorable electrical characteristics can be provided.

Note that the oxide 230c may be provided for each of the transistors 200. That is, the oxide 230c of the transistor 200 is not necessarily in contact with the oxide 230c of another transistor 200 adjacent to the transistor 200. Furthermore, the oxide 230c of the transistor 200 may be apart from the oxide 230c of another transistor 200 adjacent to the transistor 200. In other words, a structure in which the oxide 230c is not located between the transistor 200 and another transistor 200 adjacent to the transistor 200 may be employed.

When the above structure is employed for the semiconductor device where a plurality of transistors 200 are located in the channel width direction, the oxide 230c is independently provided for each transistor 200. Accordingly, generation of a parasitic transistor between the transistor 200 and another transistor 200 adjacent to the transistor 200 can be inhibited, and generation of a leakage path can be inhibited. Thus, a semiconductor device that has favorable electrical characteristics and can be miniaturized or highly integrated can be provided.

For example, when a distance between a side end portion of the oxide 230c of the transistor 200 and a side end portion of the oxide 230c of another transistor 200 adjacent to the transistor 200, which face each other in the channel width direction of the transistor 200, is denoted by $L_1$, $L_1$ is made greater than 0 nm. When a distance between a side end portion of the oxide 230a of the transistor 200 and a side end portion of the oxide 230a of another transistor 200 adjacent to the transistor 200, which face each other in the channel width direction of the transistor 200, is denoted by $L_2$, a value of a ratio of $L_1$ to $L_2$ ($L_1/L_2$) is preferably greater than 0 and less than 1, further preferably greater than or equal to 0.1 and less than or equal to 0.9, still further preferably greater than or equal to 0.2 and less than or equal to 0.8. Note that $L_2$ may be a distance between a side end portion of the oxide 230b of the transistor 200 and a side end portion of the oxide 230b of another transistor 200 adjacent to the transistor 200, which face each other.

By a reduction in the ratio of $L_1$ to $L_2$ ($L_1/L_2$), even when misalignment of a region where the oxide 230c is not located between the transistor 200 and another transistor 200 adjacent to the transistor 200 occurs, the oxide 230c of the transistor 200 can be apart from the oxide 230c of another transistor 200 adjacent to the transistor 200.

By an increase in the ratio of $L_1$ to $L_2$ ($L_1/L_2$), even when the interval between the transistor 200 and another transistor 200 adjacent to the transistor 200 is decreased, the width of the minimum feature size can be secured, and further miniaturization or higher integration of the semiconductor device can be achieved.

Note that each of the conductor 260 and the insulator 250 may be shared by the adjacent transistors 200. In other words, the conductor 260 of the transistor 200 includes a region continuous with the conductor 260 of another transistor 200 adjacent to the transistor 200. In addition, the insulator 250 of the transistor 200 includes a region continuous with the insulator 250 of another transistor 200 adjacent to the transistor 200.

In the above structure, the oxide 230d includes a region in contact with the insulator 224 between the transistor 200 and another transistor 200 adjacent to the transistor 200. Note that the oxide 230c and the oxide 230d of the transistor 200 may be apart from the oxide 230c and the oxide 230d of another transistor 200 adjacent to the transistor 200.

The insulator 211, the insulator 212, the insulator 214, the insulator 282, the insulator 283, the insulator 284, and the insulator 286 preferably function as barrier insulating films, each of which inhibits diffusion of impurities such as water and hydrogen into the transistor 200 from the substrate side or above the transistor 200. Thus, for each of the insulator 211, the insulator 212, the insulator 214, the insulator 282, the insulator 283, the insulator 284, and the insulator 286, an insulating material having a function of inhibiting diffusion of impurities such as hydrogen atoms, hydrogen molecules, water molecules, nitrogen atoms, nitrogen molecules, nitrogen oxide molecules (e.g., $N_2O$, $NO$, or $NO_2$), and copper atoms (through which the impurities are less likely to pass) is preferably used. Alternatively, it is preferable to use an insulating material having a function of inhibiting diffusion of oxygen (e.g., at least one of oxygen atoms, oxygen molecules, and the like) (through which the above oxygen is less likely to pass).

Note that in this specification, a barrier insulating film refers to an insulating film having a barrier property. A barrier property in this specification means a function of inhibiting diffusion of a targeted substance (also referred to as low permeability). Alternatively, a barrier property in this specification means a function of trapping or fixing (also referred to as gettering) a targeted substance.

For example, it is preferable that the insulator 211, the insulator 212, the insulator 283, and the insulator 284 be formed using silicon nitride or the like, and the insulator 214 and the insulator 282 be formed using aluminum oxide or the like. Accordingly, impurities such as water and hydrogen can be inhibited from diffusing to the transistor 200 side from the substrate side through the insulator 211, the insulator 212, and the insulator 214. Alternatively, oxygen contained in the insulator 224 or the like can be inhibited from diffusing to the substrate side through the insulator 211, the insulator 212, and the insulator 214. In this manner, the transistor 200 is preferably surrounded by the insulator 211, the insulator 212, the insulator 214, the insulator 282, the insulator 283, and the insulator 284 having a function of inhibiting diffusion of oxygen and impurities such as water and hydrogen.

The resistivities of the insulator 211, the insulator 284, and the insulator 286 are preferably low in some cases. For example, by setting the resistivities of the insulator 211, the insulator 284, and the insulator 286 to approximately $1 \times 10^{13}$ Ωcm, the insulator 211, the insulator 284, and the insulator 286 can sometimes reduce charge up of the conductor 205, the conductor 242a, the conductor 242b, the conductor 260, the conductor 246a, or the conductor 246b in treatment using plasma or the like in the manufacturing process of a semiconductor device. The resistivities of the insulator 211, the insulator 284, and the insulator 286 are preferably higher than or equal to $1 \times 10^{10}$ Ωcm and lower than or equal to $1 \times 10^{15}$ Ωcm.

The insulator 211 or the insulator 212 is not necessarily provided, and the insulator 283 or the insulator 284 is not necessarily provided. This applies to, for example, the case where the insulator 212 and the insulator 284 are deposited by a CVD method using a compound gas containing no hydrogen atom or having a low hydrogen atom content.

The insulator 216 and the insulator 280 preferably have a lower dielectric constant than the insulator 214. When a material with a low dielectric constant is used for an interlayer film, parasitic capacitance generated between wirings can be reduced. As the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be lower in the case where a negative potential is applied to the conductor 205 than in the case where the negative potential is not applied.

The conductor 205 is positioned to overlap with the oxide 230 and the conductor 260. Furthermore, the conductor 205 is preferably provided to be embedded in the insulator 214 and/or the insulator 216.

As illustrated in FIG. 1A, the conductor 205 is preferably larger than the region of the oxide 230 that does not overlap with the conductor 242a or the conductor 242b. In particular, as illustrated in FIG. 1C, the conductor 205 preferably extends to a region outside end portions of the oxide 230a and the oxide 230b that intersect with the channel width direction. That is, the conductor 205 and the conductor 260 preferably overlap with each other with the insulator therebetween, in a region beyond the side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode. In this specification, such a transistor structure in which the channel formation region is electrically surrounded by the electric fields of the first gate electrode and the second gate electrode is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

Furthermore, as illustrated in FIG. 1C, the conductor 205 extends to function as a wiring as well. However, without limitation to this structure, a structure in which a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205 has a stacked structure of the conductor 205a and the conductor 205b is illustrated, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, the conductor 205a is preferably formed using a conductive material having a function of inhibiting diffusion of oxygen (e.g., at least one of oxygen atoms, oxygen molecules, and the like).

When a conductive material having a function of inhibiting oxygen diffusion is used for the conductor 205a, the conductivity of the conductor 205b can be inhibited from being lowered because of oxidation. As a conductive material having a function of inhibiting oxygen diffusion, for example, tantalum, tantalum nitride, ruthenium, or ruthenium oxide is preferably used. Thus, the conductor 205a is a single layer or a stacked layer of the above conductive materials. For example, the conductor 205a may be a stack of tantalum, tantalum nitride, ruthenium, or ruthenium oxide and titanium or titanium nitride.

The conductor 205b is preferably formed using a conductive material containing tungsten, copper, or aluminum as its main component. Note that the conductor 205b is illustrated as a single layer but may have a stacked-layer structure, for example, a stack of any of the above conductive materials and titanium or titanium nitride.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium that is an insulating material is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Furthermore, the conductor 205 can be inhibited from reacting with oxygen contained in the insulator 224 or the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) may be used as the insulator 222. With miniaturization and high integration of a transistor, a problem such as leakage current may arise because of a thinner gate insulator. When a high-k material is used for an insulator functioning as the gate insulator, a gate potential at the time of operating the transistor can be reduced while the physical thickness of the gate insulator is kept.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating, in other words, an insulating material including an excess-oxygen region is preferably used. An oxide film that releases oxygen by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. For example, in the oxide 230, dehydrogenation can be performed when a reaction in which a bond of a defect where hydrogen enters an oxygen vacancy ($V_O$H) is cut occurs, i.e., a reaction of "$V_O$H→$V_O$+H" occurs. Part of hydrogen generated at this time is bonded to oxygen to be $H_2O$, and removed from the oxide 230 or an insulator near the oxide 230 in some cases. Part of hydrogen is diffused into or gettered by the conductor 242a and the conductor 242b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and RF application to the substrate side allows the oxygen radicals generated by the high-density plasma to be efficiently introduced into the oxide 230 or an insulator near the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 200, the heat treatment is preferably performed with the surface of the oxide 230 exposed. The heat treatment is performed at higher than or equal to 100° C. and lower than or equal to 450° C., preferably higher than or equal to 350° C. and lower than or equal to 400° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 230 can promote a reaction in which oxygen vacancies in the oxide 230 are filled with supplied oxygen, i.e., a reaction of "$V_O$+O→null". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of $V_O$H.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 243a and the oxide 243b may be provided over the oxide 230b.

The oxide 243a and the oxide 243b preferably have a function of inhibiting the passage of oxygen. The oxide 243a (the oxide 243b) having a function of inhibiting the passage of oxygen is preferably provided between the oxide 230b and the conductor 242a (the conductor 242b) functioning as the source electrode or the drain electrode, in which case the electric resistance between the conductor 242a (the conductor 242b) and the oxide 230b can be reduced. Such a structure can improve the electrical characteristics of the transistor 200 and the reliability of the transistor 200. In the case where the electric resistance between the oxide 230b and the conductor 242a (the conductor 242b) can be sufficiently reduced, the oxide 243a (the oxide 243b) is not necessarily provided.

A metal oxide containing the element M may be used as the oxide 243a and the oxide 243b. In particular, aluminum, gallium, yttrium, or tin is preferably used as the element M. The concentration of the element M in the oxide 243a and the oxide 243b is preferably higher than that in the oxide 230b. Alternatively, gallium oxide may be used as the oxide 243a and the oxide 243b. Further alternatively, a metal oxide such as an In—M—Zn oxide may be used as the oxide 243a and the oxide 243b. Specifically, the atomic ratio of the element M to In in the metal oxide used as the oxide 243a and the oxide 243b is preferably greater than the atomic ratio of the element M to In in the metal oxide used as the oxide 230b. The thicknesses of the oxide 243a and the oxide 243b are preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243a and the oxide 243b preferably have crystallinity. With the oxide 243a and the oxide 243b having crystallinity, release of oxygen in the oxide 230 can be suitably inhibited. When the oxide 243a and the oxide 243b have a hexagonal crystal structure, for example, release of oxygen in the oxide 230 can sometimes be inhibited.

The conductor 242a is provided over the oxide 243a and the conductor 242b is provided over the oxide 243b. The conductor 242a and the conductor 242b function as the source electrode and the drain electrode of the transistor 200.

For the conductor 242a and the conductor 242b, for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

When the oxide 243a and the oxide 243b are not provided, the contact between the conductor 242a or the conductor 242b and the oxide 230b or the oxide 230c may make oxygen in the oxide 230b or the oxide 230c diffuse into the conductor 242a and the conductor 242b, resulting in oxidation of the conductor 242a and the conductor 242b. It is highly probable that oxidation of the conductor 242a and the conductor 242b lowers the conductivity of the conductor 242a and the conductor 242b. Note that diffusion of oxygen in the oxide 230b or the oxide 230c into the conductor 242a and the conductor 242b can be rephrased as absorption of oxygen in the oxide 230b or the oxide 230c by the conductor 242a and the conductor 242b.

When oxygen in the oxide 230b or the oxide 230c diffuses into the conductor 242a and the conductor 242b, a layer is sometimes formed between the conductor 242a and the oxide 230b and between the conductor 242b and the oxide 230b, or between the conductor 242a and the oxide 230c and between the conductor 242b and the oxide 230c. Since the layer contains a larger amount of oxygen than the conductor 242a or the conductor 242b, the layer seems to have an insulating property. In this case, a three-layer structure of the conductor 242a or the conductor 242b, the layer, and the oxide 230b or the oxide 230c can be regarded as a three-layer structure of a metal, an insulator, and a semiconductor and is sometimes referred to as an MIS (Metal-Insulator-Semiconductor) structure or a diode junction structure mainly with an MIS structure.

Note that hydrogen contained in the oxide 230b, the oxide 230c, or the like diffuses into the conductor 242a or the conductor 242b in some cases. In particular, when a nitride containing tantalum is used for the conductor 242a and the conductor 242b, hydrogen contained in the oxide 230b, the oxide 230c, or the like is likely to diffuse into the conductor 242a or the conductor 242b, and the diffused hydrogen is bonded to nitrogen contained in the conductor 242a or the conductor 242b in some cases. That is, hydrogen contained in the oxide 230b, the oxide 230c, or the like is sometimes absorbed by the conductor 242a or the conductor 242b.

Note that it is preferable that the insulator 271a functioning as a barrier layer be provided between the insulator 280 and the top surface of the conductor 242a, and the insulator 271b functioning as a barrier layer be provided between the insulator 280 and the top surface of the conductor 242b. With the structure, absorption of excess oxygen contained in the insulator 280 by the conductor 242a and the conductor 242b can be inhibited. Furthermore, inhibiting oxidation of the conductor 242a and the conductor 242b can inhibit an increase in the contact resistance between the transistor 200 and a wiring. Consequently, the transistor 200 can have favorable electrical characteristics and reliability.

Thus, the insulator 271a and the insulator 271b preferably have a function of inhibiting diffusion of oxygen. For example, the insulator 271a and the insulator 271b preferably have a function of further inhibiting diffusion of oxygen as compared to the insulator 280.

An insulator containing an oxide of one or both of aluminum and hafnium is preferably deposited as the insulator 271a and the insulator 271b, for example. In particular, aluminum oxide is preferably deposited by an atomic layer deposition (ALD) method. With the use of an ALD method, a dense film with a smaller number of defects such as cracks and pinholes or with a uniform thickness can be formed. Alternatively, aluminum oxide may be deposited by a sputtering method. An insulator containing aluminum nitride is used as the insulator 271a and the insulator 271b, for example.

The layer 244a (the layer 244b) is in contact with the side surface of the oxide 230a, the side surface of the oxide 230b, the side surface of the oxide 243a (the oxide 243b), and the side surface of the conductor 242a (the conductor 242b). Note that the layer 244a and the layer 244b may be in contact with the insulator 271a and the insulator 271b, respectively.

As described above, layers to be the layer 244a and the layer 244b are formed over the insulator 224 or the like through a step of forming the island-shaped oxide 230a and oxide 230b, for example. The layers contain elements derived from components contained in films parts of which are removed in the step (a conductive layer 247B, an insulating layer 271B, a conductive layer 242B, and the like described later) and components contained in the members of apparatuses used in the step, for example. The layers are processed to form the layer 244a and the layer 244b.

The layer 244a and the layer 244b sometimes have a function of inhibiting diffusion of oxygen. The above structure can inhibit entry of oxygen contained in the insulator 280 from the side surfaces of the oxide 230b and the oxide 230a in a region overlapping with the conductor 242a and the conductor 242b. Thus, the n-type of the side surface of the oxide 230b and its vicinity and the side surface of the oxide 230a and its vicinity in the region overlapping with the conductor 242a and the conductor 242b can be maintained.

In this manner, when the side surface of the oxide 230a and the side surface of the oxide 230b overlapping with the conductor 242a and the conductor 242b functioning as the source electrode and the drain electrode become n-type, the on-state current of the transistor 200 can be increased.

As described above, the layer 244a and the layer 244b contain oxygen and one or more kinds of elements derived from the components contained in the films parts of which are removed in the above step, for example. In the case where a nitride containing tantalum is used for the conductive layer 247B or the conductive layer 242B, for example, the layer 244a and the layer 244b may contain tantalum and oxygen. In the case where a nitride containing titanium is used for the conductive layer 247B or the conductive layer 242B, for example, the layer 244a and the layer 244b may contain titanium and oxygen. An oxide containing a metal element such as an oxide containing tantalum or an oxide containing titanium is preferable because of its function of inhibiting diffusion of oxygen.

The thicknesses of the layer 244a and the layer 244b are greater than or equal to 0.1 nm and less than or equal to 3.0 nm, preferably greater than or equal to 0.2 nm and less than or equal to 2.0 nm, further preferably greater than or equal to 0.5 nm and less than or equal to 1.5 nm.

The insulator 272a (the insulator 272b) is provided to cover the side surface of the oxide 230a, the side surface of the oxide 230b, the side surface of the oxide 243a (the oxide 243b), and the side surface of the conductor 242a (the conductor 242b) with the layer 244a (the layer 244b) therebetween.

The insulator 272a and the insulator 272b preferably have a function of inhibiting diffusion of oxygen. For example, the insulator 272a and the insulator 272b preferably have a function of further inhibiting diffusion of oxygen as compared to the insulator 280. An insulator containing an oxide of one or both of aluminum and hafnium is preferably deposited as the insulator 272a and the insulator 272b, for example. An insulator containing aluminum nitride is used as the insulator 272a and the insulator 272b, for example.

Providing the insulator 271a (the insulator 271b), the insulator 272a (the insulator 272b), and the layer 244a (the layer 244b) described above can isolate the oxide 230a, the oxide 230b, the oxide 243a (the oxide 243b), and the conductor 242a (the conductor 242b) from the insulator 280. Thus, oxygen can be inhibited from directly diffusing from the insulator 280 to the oxide 230a, the oxide 230b, the oxide 243a, the oxide 243b, the conductor 242a, and the conductor 242b. This can prevent a reduction in the carrier concentration in the source region and the drain region of the oxide 230 due to supply of excess oxygen to the source region and the drain region. Furthermore, the conductor 242a and the conductor 242b can be inhibited from being excessively oxidized to have increased resistivity, and thus a reduction in on-state current can be inhibited.

The insulator 250 is preferably positioned in contact with at least part of the oxide 230d. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator that releases oxygen by heating. When an insulator that releases oxygen by heating is provided as the insulator 250 in contact with at least part of the oxide 230d, oxygen can be effectively supplied to the channel formation region of the oxide 230b and oxygen vacancies in the channel formation region of the oxide 230b can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is a single layer in FIG. 1B and FIG. 1C, a stacked-layer structure of two or more layers may be employed. In the case where the insulator 250 has a stacked-layer structure including two layers, it is preferable that a lower layer of the insulator 250 be formed using an insulator that releases oxygen by heating and an upper layer of the insulator 250 be formed using an insulator having a function of inhibiting diffusion of oxygen. With such a structure, oxygen contained in the lower layer of the insulator 250 can be inhibited from diffusing into the conductor 260. That is, a reduction in the amount of oxygen supplied to the oxide 230 can be inhibited. In addition, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative dielectric constant. The gate insulator having a stacked-layer structure of the lower layer of the insulator 250 and the upper layer of the insulator 250 can be thermally stable and can have a high relative dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like, or a metal oxide that can be used as the oxide 230 can be used as the upper layer of the insulator 250. In particular, an insulator containing an oxide of one or both of aluminum and hafnium is preferably used.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

The metal oxide preferably has a function of part of the first gate electrode. For example, a metal oxide that can be used as the oxide 230 can be used as the metal oxide. In that case, when the conductor 260a is deposited by a sputtering method, the metal oxide can have a reduced electric resistance value to be a conductor. Such a conductor can be referred to as an OC (Oxide Conductor) electrode.

With the metal oxide, the on-state current of the transistor 200 can be increased without a reduction in the influence of the electric field from the conductor 260.

The conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 1B and FIG. 1C, the top surface of the conductor 260 is substantially level with the top surface of the insulator 250 and the top surface of the oxide 230c. Although the conductor 260 has a two-layer structure of the conductor 260a and the conductor 260b in FIG. 1B and FIG. 1C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 242a and the conductor 242b without alignment.

As illustrated in FIG. 1C, in the channel width direction of the transistor 200, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side surface and the top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics can be improved. When the bottom surface of the insulator 222 is a reference, the difference between the level of the bottom surface of the conductor 260 in a region where the oxide 230a and the oxide 230b do not overlap with the conductor 260 and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 224, the oxide 230, the conductor 242a, the conductor 242b, the insulator 271a, and the insulator 271b. In addition, the top surface of the insulator 280 may be planarized.

The insulator 280 functioning as an interlayer film preferably has a low dielectric constant. When a material with a low dielectric constant is used for the interlayer film, parasitic capacitance generated between wirings can be reduced. The insulator 280 is preferably formed using a material similar to that for the insulator 216, for example. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. The insulator 280 may have a stacked-layer structure of the above materials; silicon oxide deposited by a sputtering method and silicon oxynitride deposited by a chemical vapor deposition (CVD) method stacked thereover. Furthermore, silicon nitride may be stacked thereover.

The insulator 282 or the insulator 283 preferably functions as a barrier insulating film that inhibits impurities such as water and hydrogen from diffusing into the insulator 280 from above. The insulator 282 or the insulator 283 preferably functions as a barrier insulating film for inhibiting passage of oxygen. As the insulator 282 and the insulator 283, for example, an insulator such as aluminum oxide, silicon nitride, or silicon nitride oxide may be used. The insulator 282 may be formed using aluminum oxide that has a high blocking property against oxygen and the insulator 283 may be formed using silicon nitride that has a high blocking property against hydrogen, for example.

For the conductor 240a and the conductor 240b, a conductive material containing tungsten, copper, or aluminum as its main component is preferably used. The conductor 240a and the conductor 240b may have a stacked-layer structure.

In the case where the conductor 240a and the conductor 240b each have a stacked-layer structure, a conductive material having a function of inhibiting the passage of impurities such as water and hydrogen is preferably used for a conductor in contact with the insulator 284, the insulator 283, the insulator 282, the insulator 280, and the insulator 271a or the insulator 271b. For example, tantalum, tantalum nitride, titanium, titanium nitride, ruthenium, ruthenium oxide, or the like is preferably used. The conductive material having a function of inhibiting the passage of impurities such as water and hydrogen may be used as a single layer or stacked layers. Moreover, impurities such as water and hydrogen contained in a layer above the insulator 284 can be inhibited from entering the oxide 230 through the conductor 240a and the conductor 240b.

As the insulator 241a and the insulator 241b, for example, an insulator such as silicon nitride, aluminum oxide, or silicon nitride oxide may be used. Since the insulator 241a and the insulator 241b are provided in contact with the insulator 271a and the insulator 271b, respectively, impurities such as water and hydrogen contained in the insulator 280 or the like can be inhibited from entering the oxide 230 through the conductor 240a and the conductor 240b. In particular, silicon nitride is suitable because of its high blocking property against hydrogen. Furthermore, oxygen contained in the insulator 280 can be prevented from being absorbed by the conductor 240a and the conductor 240b.

The conductor 246a functioning as a wiring may be provided in contact with the top surface of the conductor 240a, and the conductor 246b functioning as a wiring may be provided in contact with the top surface of the conductor 240b. For the conductor 246a and the conductor 246b, a conductive material containing tungsten, copper, or aluminum as its main component is preferably used. The conductor 246a and the conductor 246b may each have a stacked-layer structure, for example, may be stacked layers of titanium or titanium nitride and the above conductive material. Note that the conductor 246a and the conductor 246b may be formed to be embedded in an opening formed in an insulator.

The insulator 286 is provided over the conductor 246a, the conductor 246b, and the insulator 284. Thus, the top surface of the conductor 246a, the side surface of the conductor 246a, the top surface of the conductor 246b, and the side surface of the conductor 246b are in contact with the insulator 286, and the bottom surface of the conductor 246a and the bottom surface of the conductor 246b are in contact with the insulator 284. In other words, the conductor 246a and the conductor 246b can be surrounded by the insulator 284 and the insulator 286. With such a structure, the passage of oxygen from the outside can be inhibited and oxidation of the conductor 246 can be prevented. Furthermore, the above structure is preferably employed, in which case impurities such as water and hydrogen can be prevented from diffusing from the conductor 246a and the conductor 246b to the outside.

Constituent Material of Semiconductor Device

Constituent materials that can be used for the semiconductor device will be described below.

Substrate

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

Insulator

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. By contrast, when a material with a low relative dielectric constant is used for the insulator functioning as an interlayer film, parasitic capacitance generated between wirings can be reduced. Accordingly, a material is preferably selected in accordance with the function of an insulator.

Examples of the insulator with a high relative dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by insulators having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention will be described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In—M—Zn oxide that contains indium, the element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an a-like OS, and an amorphous oxide semiconductor.

Oxide semiconductors might be classified in a manner different from the above-described one when classified in terms of the crystal structure. The classification of the crystal structures of an oxide semiconductor is explained with FIG. 4A. FIG. 4A is a diagram showing the classification of crystal structures of an oxide semiconductor, typically IGZO (a metal oxide containing In, Ga, and Zn).

As shown in FIG. 4A, IGZO is roughly classified into "Amorphous", "Crystalline", and "Crystal". Amorphous includes completely amorphous. Crystalline includes CAAC (c-axis aligned crystalline), nc (nanocrystalline), and CAC (Cloud-Aligned Composite). Note that single crystal, poly crystal, and completely amorphous are excluded from the category of "Crystalline". Crystal includes single crystal and poly crystal.

Note that the structures in the thick frame in FIG. 4A are in an intermediate state between "Amorphous" and "Crystal", and belong to a new crystalline phase. These structures are positioned in a boundary region between Amorphous and Crystal. In other words, these structures are completely different from "Amorphous", which is energetically unstable, and "Crystal".

A crystal structure of a film or a substrate can be evaluated with X-ray diffraction (XRD) patterns. Here, XRD spectra of quartz glass and IGZO, which has a crystal structure classified into Crystalline (also referred to as crystalline IGZO), are shown in FIG. 4B and FIG. 4C. FIG. 4B shows an XRD spectrum of quartz glass and FIG. 4C shows an XRD spectrum of crystalline IGZO. Note that the crystalline IGZO shown in FIG. 4C has a composition in the vicinity of In:Ga:Zn=4:2:3 [atomic ratio]. Furthermore, the crystalline IGZO shown in FIG. 4C has a thickness of 500 nm.

As indicated by arrows in FIG. 4B, the XRD spectrum of the quartz glass shows a peak with a substantially bilaterally symmetrical shape. By contrast, as indicated by arrows in FIG. 4C, the XRD spectrum of the crystalline IGZO shows a peak with an asymmetrical shape. The asymmetrical peak of the XRD spectrum clearly shows the existence of crystal. In other words, the structure cannot be regarded as Amorphous unless it has a bilaterally symmetrical peak in the XRD spectrum. Note that in FIG. 4C, a crystal phase (IGZO crystal phase) is denoted at 2 θ of 31° or in the vicinity thereof. The asymmetrical shape of the peak of the XRD spectrum is presumably attributed to the crystal phase (microcrystal).

Specifically, in the XRD spectrum of the crystalline IGZO shown in FIG. 4C, the peak appears at 2θ of 34° or in the vicinity thereof. The microcrystal has a peak at 2 θ of 31° or in the vicinity thereof. When an oxide semiconductor film is evaluated using an X-ray diffraction pattern, the spectrum becomes wide in the lower angle side than the peak at 2 θ of 34° or in the vicinity thereof as shown in FIG. 4C. This indicates that the oxide semiconductor film includes a microcrystal having a peak at 2 θ of 31° or in the vicinity thereof.

A crystal structure of a film can also be evaluated with a diffraction pattern obtained by a nanobeam electron diffraction method (NBED) (also referred to as nanobeam electron diffraction pattern). FIG. 4D shows a diffraction pattern of an IGZO film formed with the substrate temperature set at room temperature. Note that the IGZO film of FIG. 4D is formed by a sputtering method using an oxide target with In:Ga:Zn=1:1:1 [atomic ratio]. In the nanobeam electron diffraction method, electron diffraction is performed with a probe diameter of 1 nm.

As shown in FIG. 4D, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

As an oxide semiconductor other than the above, a CAC (Cloud-Aligned Composite)-OS may be used.

A CAC-OS has a conducting function in part of the material and has an insulating function in another part of the material; as a whole, the CAC-OS has a function of a semiconductor. In the case where the CAC-OS is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS. In the CAC-OS, separation of the functions can maximize each function.

The CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS includes components having different band gaps. For example, the CAC-OS includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, high current drive capability in the on state of the transistor, that is, a high on-state current and high field-effect mobility can be obtained.

In other words, the CAC-OS can also be referred to as a matrix composite or a metal matrix composite.

[Impurities]

Here, the influence of impurities in the metal oxide will be described.

Entry of impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Therefore, when the channel formation region includes oxygen vacancies, the transistor tends to have normally-on characteristics (the channel is generated even when no voltage is applied to the gate electrode and current flows through the transistor).

The transistor using a metal oxide is likely to have normally-on characteristics due to impurities and oxygen vacancies in the metal oxide that affect the electrical characteristics. In the case where the transistor is driven in the state where excess oxygen exceeding the proper amount is included in the metal oxide, the valence of the excess oxygen atoms is changed and the electrical characteristics of the transistor are changed, so that the reliability is decreased in some cases.

Thus, a metal oxide having a low carrier concentration is preferably used for a channel formation region of a transistor. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Note that in this specification and the like, the case where the carrier concentration of the metal oxide in the channel formation region is lower than or equal to $1\times10^{16}$ cm$^{-3}$ is defined as a substantially highly purified intrinsic state.

The carrier concentration of the metal oxide in the channel formation region is preferably lower than or equal to $1\times10^{18}$ cm$^{-3}$, further preferably lower than or equal to $1\times10^{17}$ cm$^{-3}$, still further preferably lower than or equal to $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

Examples of impurities in a metal oxide include hydrogen, nitrogen, alkali metal, alkaline earth metal, iron, nickel, and silicon. In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. Moreover, in the case where hydrogen enters an oxygen vacancy in the metal oxide, the oxygen vacancy and the hydrogen are bonded to each other to form V$_O$H in some cases. A defect in which hydrogen has entered an oxygen vacancy (V$_O$H) functions as a donor and generates an electron serving as a carrier in some cases. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be degraded when the metal oxide contains a large amount of hydrogen.

In one embodiment of the present invention, V$_O$H in the oxide 230 is preferably reduced as much as possible so that the oxide 230 becomes a highly purified intrinsic or substantially highly purified intrinsic oxide. It is important to remove impurities such as moisture and hydrogen in a metal oxide (sometimes described as dehydration or dehydrogenation treatment) and to fill oxygen vacancies by supplying oxygen to the metal oxide (sometimes described as oxygen adding treatment) to obtain a metal oxide whose V$_O$H is sufficiently reduced. When a metal oxide in which impurities such as V$_O$H are sufficiently reduced is used for the channel formation region of a transistor, stable electrical characteristics can be given.

A defect in which hydrogen has entered an oxygen vacancy (V$_O$H) can function as a donor in the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

Therefore, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, stable electrical characteristics can be given.

The above-described defect states may include a trap state. Charge trapped by a trap state in the metal oxide takes a long time to be released and may behave like fixed charge. Thus, a transistor including the metal oxide having a high density of trap states in the channel formation region has unstable electrical characteristics in some cases.

If impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, alkali metal, alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region that is the same as the region whose concertation of the impurities is calculated or may be a concentration in the oxide semiconductor.

A metal oxide with a low impurity concentration has a low density of defect states and thus has a low density of trap states in some cases.

In a transistor using an oxide semiconductor, the resistance of the oxide semiconductor may be reduced when impurities and oxygen vacancies exist in a channel formation region of the oxide semiconductor. In addition, the electrical characteristics are likely to be changed, and thus the reliability is degraded in some cases.

Silicon has a higher bonding energy with oxygen than indium and zinc, for example. When an In—M—Zn oxide is used as the oxide semiconductor, for example, silicon entering the oxide semiconductor may deprive oxygen contained in the oxide semiconductor, whereby oxygen vacancies are formed in the vicinity of indium or zinc in some cases.

When a low-resistance region is formed in the channel formation region of the transistor using an oxide semiconductor in the channel formation region, leakage current (parasitic channel) between the source electrode and the drain electrode of the transistor is likely to be generated in the low-resistance region. Furthermore, the parasitic channel facilitates generation of defects of transistor characteristics, such as normally on of transistors, an increase in leakage current, and a change (shift) of threshold voltage caused by stress application. When the processing accuracy of the transistor is low, the parasitic channel varies between transistors, which causes a variation in transistor characteristics.

Therefore, the impurities and oxygen vacancies are preferably reduced as much as possible in and around the channel formation region of the oxide semiconductor.

<<Other Semiconductor Material>>

A semiconductor material that can be used for the oxide 230 is not limited to the above metal oxides. A semiconductor material having a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Here, in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as the van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used for the oxide 230, for example. Specific examples of chalcogenide of transition metals that can be used for the oxide 230 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

Modification Example of Semiconductor Device

An example of the semiconductor device of one embodiment of the present invention will be described below with reference to FIG. 5A to FIG. 5D and FIG. 26A to FIG. 26D.

Figure 5A:
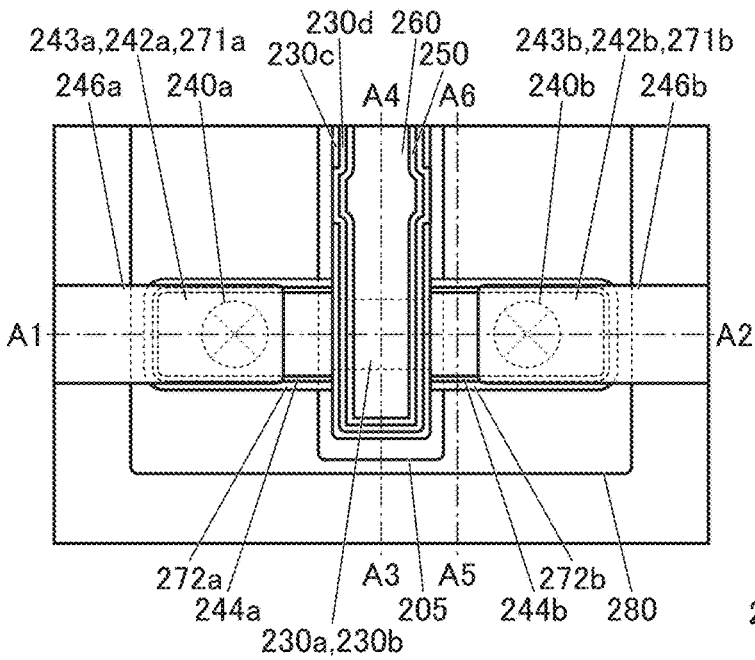
FIG. 5A is a top view of a semiconductor device of one embodiment of the present invention.
Figure 5C:
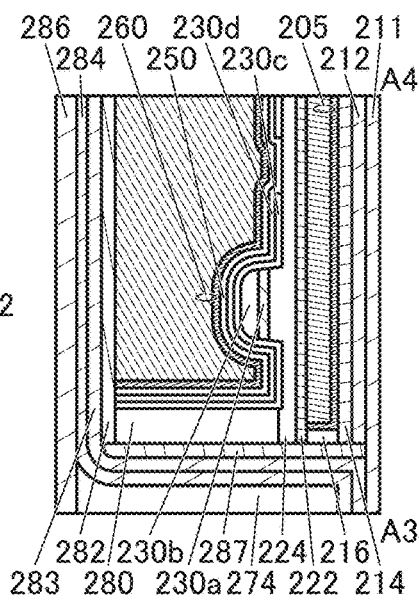
FIG. 5B to FIG. 5D are cross-sectional views of a semiconductor device of one embodiment of the present invention.
Figure 5B:
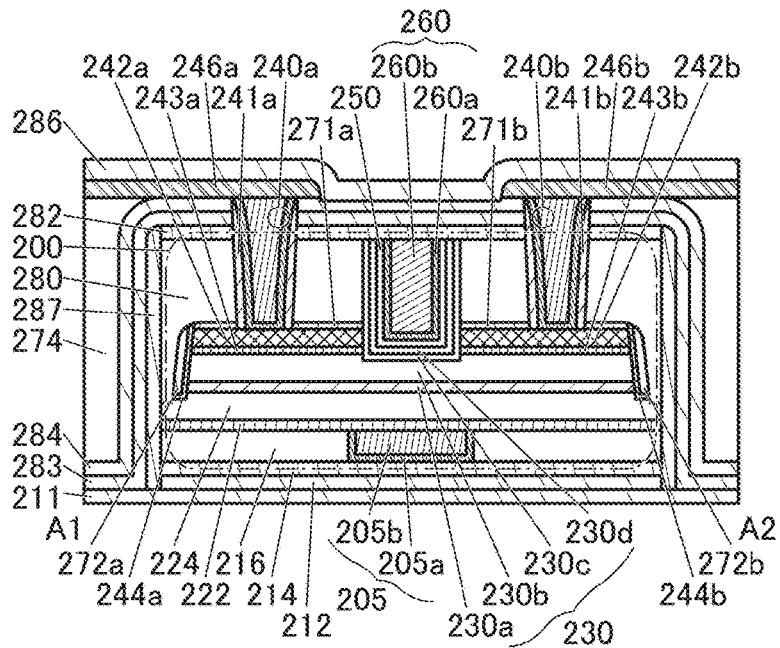
Figure 5D:
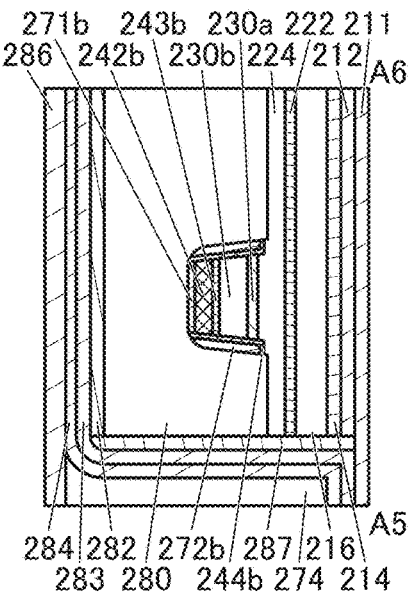
Figure 26A:
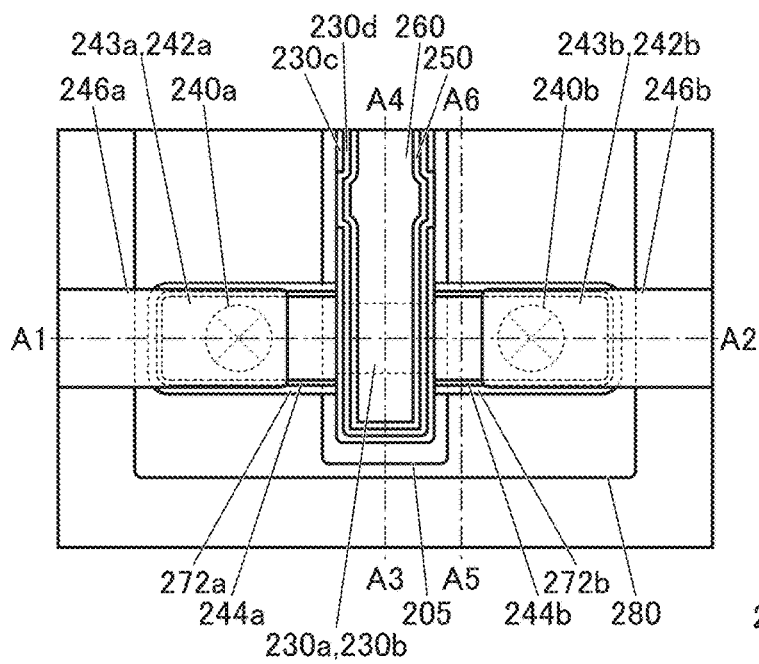
FIG. 26A is a top view of a semiconductor device of one embodiment of the present invention.
Figure 26C:
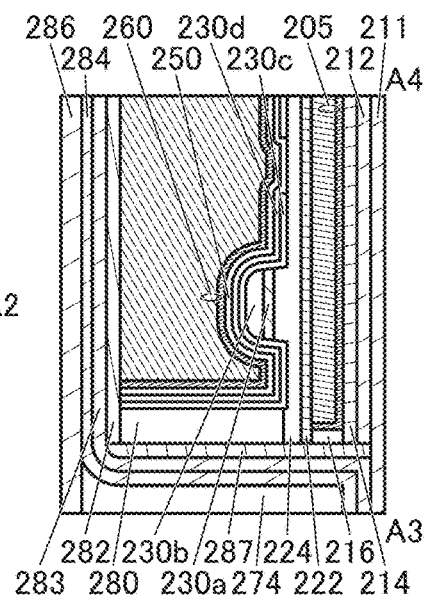
FIG. 26B to FIG. 26D are cross-sectional views of a semiconductor device of one embodiment of the present invention.
Figure 26B:
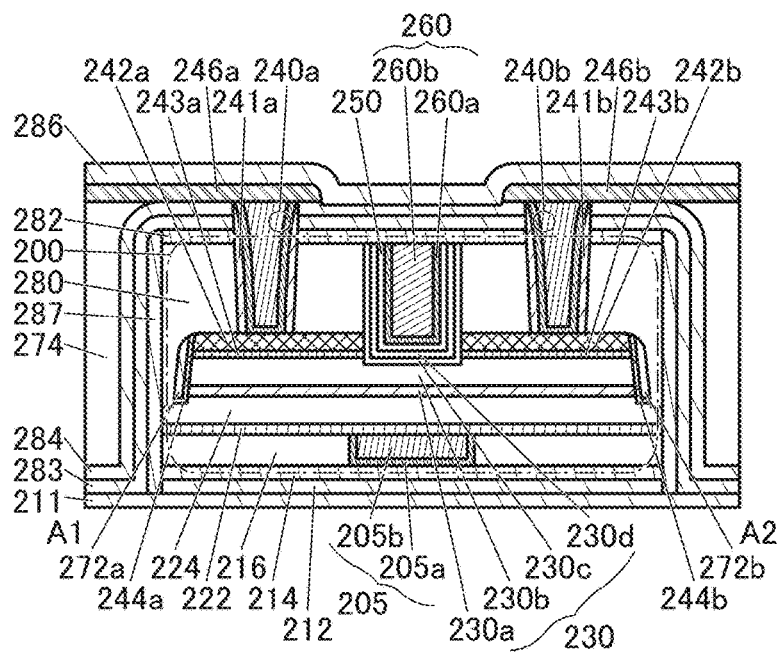
Figure 26D:
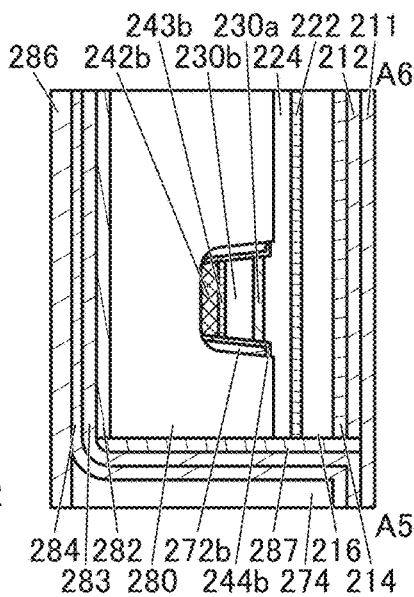
Figure 27A:
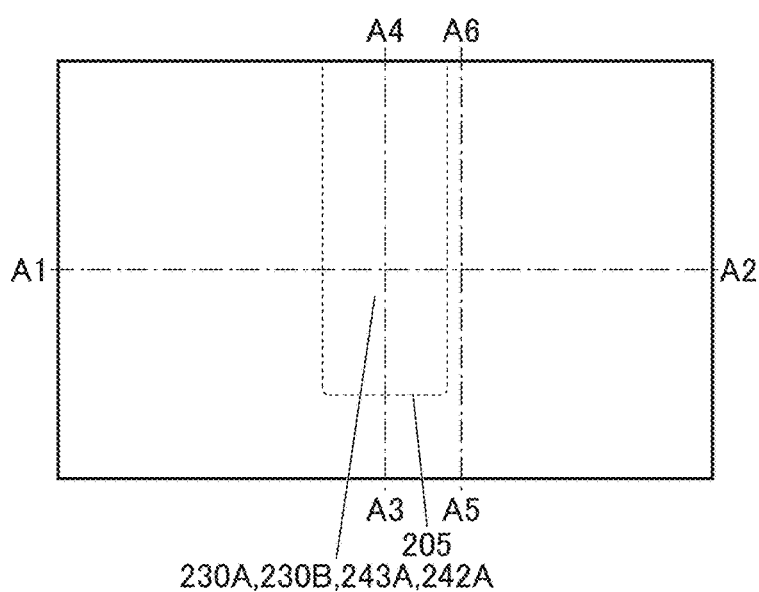
FIG. 27A is a top view illustrating a method for manufacturing a semiconductor device of one embodiment of the present invention.
Figure 27C:
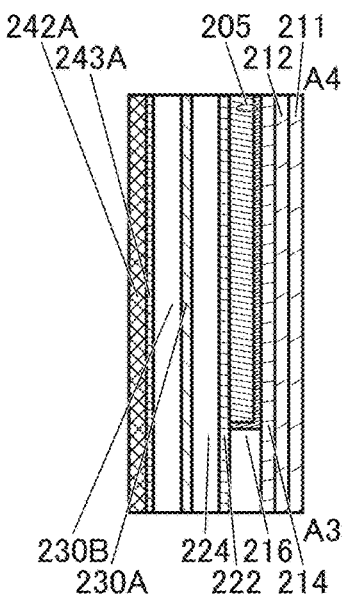
FIG. 27B to FIG. 27D are cross-sectional views illustrating a method for manufacturing a semiconductor device of one embodiment of the present invention.
Figure 27B:
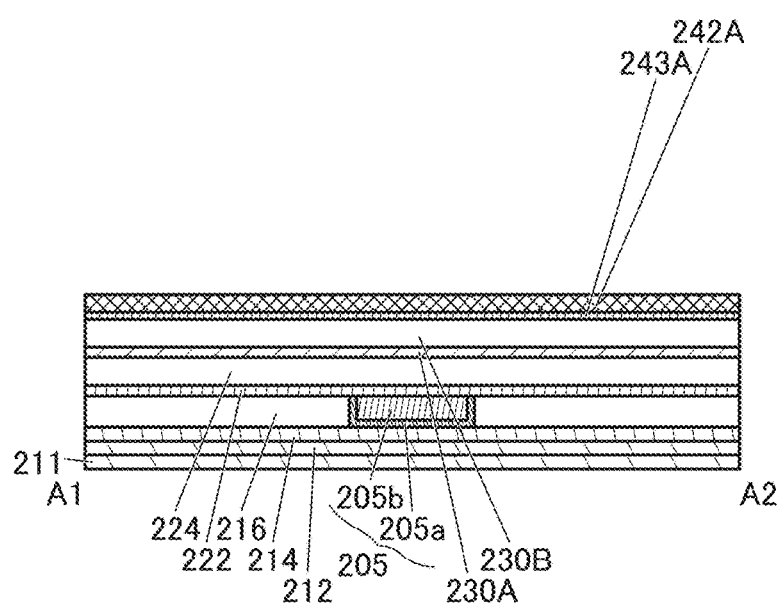
Figure 27D:
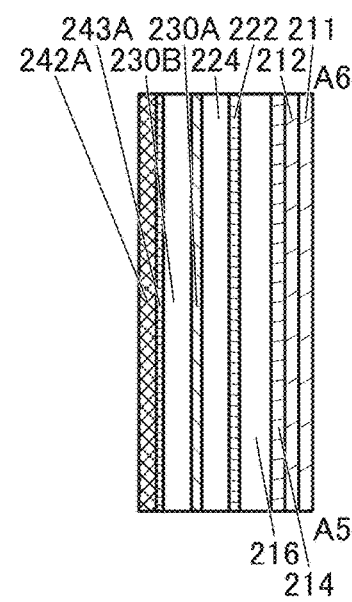
Figure 30A:
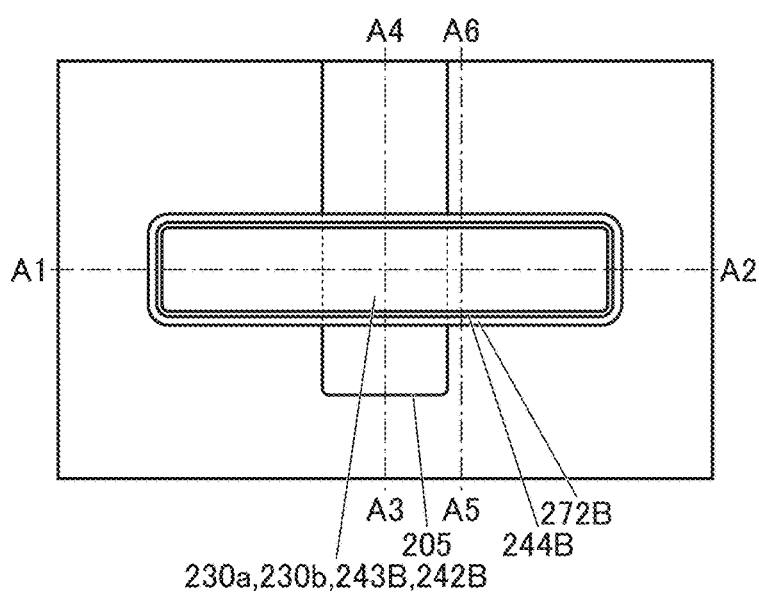
FIG. 30A is a top view illustrating a method for manufacturing a semiconductor device of one embodiment of the present invention.
Figure 30C:
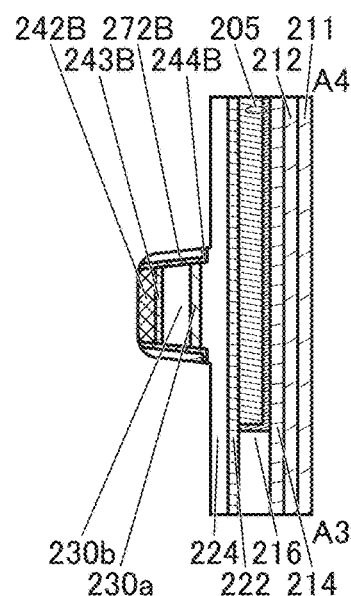
FIG. 30B to FIG. 30D are cross-sectional views illustrating a method for manufacturing a semiconductor device of one embodiment of the present invention.
Figure 30B:
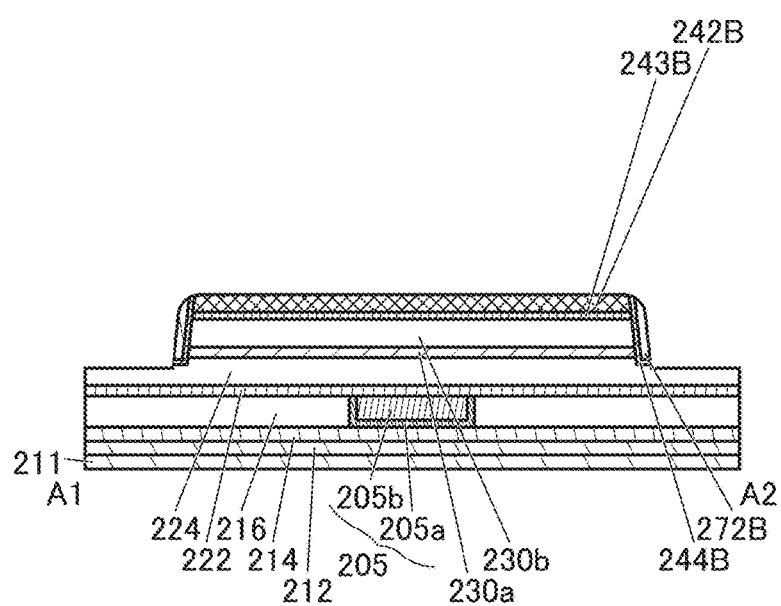
Figure 30D:
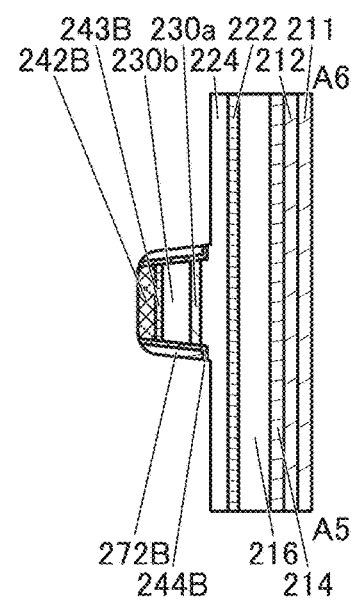

FIG. 5A and FIG. 26A are top views of the semiconductor devices. FIG. 5B and FIG. 26B are cross-sectional views of portions indicated by the dashed-dotted line A1-A2 in FIG. 5A and FIG. 26A, respectively. FIG. 5C and FIG. 26C are cross-sectional views of portions indicated by the dashed-dotted line A3-A4 in FIG. 5A and FIG. 26A, respectively. FIG. 5D and FIG. 26D are cross-sectional views of portions indicated by the dashed-dotted line A5-A6 in FIG. 5A and FIG. 26A, respectively. For simplification of the drawing, some components are not illustrated in the top views of FIG. 5A and FIG. 26A.

Note that in the semiconductor devices illustrated in FIG. 5A to FIG. 5D and FIG. 26A to FIG. 26D, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

Modification Example 1 of Semiconductor Device

The semiconductor device illustrated in FIG. 5A to FIG. 5D is a modification example of the semiconductor device illustrated in FIG. 1A to FIG. 1D. The semiconductor device illustrated in FIG. 5A to FIG. 5D is different from the semiconductor device illustrated in FIG. 1A to FIG. 1D in the shapes of the insulator 283 and the insulator 284 and in including an insulator 274 and an insulator 287.

In the semiconductor device illustrated in FIG. 5A to FIG. 5D, the insulator 212, the insulator 214, the insulator 216, the insulator 222, the insulator 224, the insulator 280, and the insulator 282 are patterned and the insulator 287 is provided in contact with side surfaces of the insulator 212, the insulator 214, the insulator 216, the insulator 222, the insulator 224, the insulator 280, and the insulator 282. The insulator 283 and the insulator 284 cover the insulator 212, the insulator 214, the insulator 216, the insulator 222, the insulator 224, the insulator 280, the insulator 282, and the insulator 287. That is, the insulator 283 is in contact with the top surface of the insulator 282, the top surface and the side surface of the insulator 287, and the top surface of the insulator 211, and the insulator 284 is in contact with the top surface and the side surface of the insulator 283. Accordingly, the insulator 214, the insulator 216, the insulator 222, the insulator 224, the insulator 280, the insulator 282, and the insulator 287 in addition to the oxide 230 and the like are isolated from the outside by the insulator 283, the insulator 284, and the insulator 211. In other words, the transistor 200 is located in a region sealed by the insulator 283, the insulator 284, and the insulator 211.

For example, the insulator 212, the insulator 214, the insulator 287, and the insulator 282 are preferably formed using materials having a function of capturing and fixing hydrogen, and the insulator 211, the insulator 283, and the insulator 284 are preferably formed using materials having a function of inhibiting diffusion of hydrogen and oxygen. Typically, aluminum oxide can be used for the insulator 212, the insulator 214, the insulator 287, and the insulator 282. Moreover, typically, silicon nitride can be used for the insulator 211, the insulator 283, and the insulator 284.

With the above structure, entry of hydrogen contained in the region outside the sealed region into the sealed region can be inhibited.

The transistor 200 illustrated in FIG. 5A to FIG. 5D has a structure in which the insulator 211, the insulator 283, and the insulator 284 are each provided as a single layer; however, the present invention is not limited thereto. For example, a structure in which the insulator 211, the insulator 283, and the insulator 284 each have a stacked-layer structure of two or more layers may be employed.

The insulator 274 functions as an interlayer film. The dielectric constant of the insulator 274 is preferably lower than that of the insulator 214. When a material with a low dielectric constant is used for the interlayer film, parasitic capacitance generated between wirings can be reduced. The insulator 274 can be formed using a material similar to that for the insulator 280, for example.

<Method for Manufacturing Semiconductor Device>

Next, a method for manufacturing the semiconductor device of one embodiment of the present invention illustrated in FIG. 5A to FIG. 5D will be described with reference to FIG. 6A to FIG. 25D.

FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, and FIG. 25A are top views. FIG. 6B, FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, FIG. 19B, FIG. 20B, FIG. 21B, FIG. 22B, FIG. 23B, FIG. 24B, and FIG. 25B are cross-sectional views corresponding to portions indicated by the dashed-dotted lines A1-A2 in FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, and FIG. 25A, respectively, and are also cross-sectional views of the transistor 200 in the channel length direction. FIG. 6C, FIG. 7C, FIG. 8C, FIG. 9C, FIG. 10C, FIG. 11C, FIG. 12C, FIG. 13C, FIG. 14C, FIG. 15C, FIG. 16C, FIG. 17C, FIG. 18C, FIG. 19C, FIG. 20C, FIG. 21C, FIG. 22C, FIG. 23C, FIG. 24C, and FIG. 25C are cross-sectional views corresponding to portions indicated by the dashed-dotted lines A3-A4 in FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, and FIG. 25A, respectively, and are also cross-sectional views of the transistor 200 in the channel width direction. FIG. 6D, FIG. 7D, FIG. 8D, FIG. 9D, FIG. 10D, FIG. 11D, FIG. 12D, FIG. 13D, FIG. 14D, FIG. 15D, FIG. 16D, FIG. 17D, FIG. 18D, FIG. 19D, FIG. 20D, FIG. 21D, FIG. 22D, FIG. 23D, FIG. 24D, and FIG. 25D are cross-sectional views of portions indicated by the dashed-dotted lines A5-A6 in FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, and FIG. 25A, respectively. Note that for simplification of the drawings, some components are not illustrated in the top views of FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, and FIG. 25A.

First, a substrate (not illustrated) is prepared, and the insulator 211 is deposited over the substrate. The insulator 211 can be deposited by a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A plasma CVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charge from plasma. In that case, accumulated charge might break the wiring, electrode, element, or the like included in the semiconductor device. By contrast, in the case of a thermal CVD method not using plasma, such plasma damage is not caused and the yield of the semiconductor device can be increased. Furthermore, a film with few defects can be obtained with a thermal CVD method because plasma damage during deposition is not caused.

As an ALD method, a thermal ALD method, in which a precursor and a reactant react with each other only by thermal energy, a PEALD (Plasma Enhanced ALD) method, in which a plasma-enhanced reactant is used, or the like can be used.

In an ALD method, one atomic layer can be deposited at a time using self-regulating characteristics of atoms. Thus, the ALD method has advantages such as deposition of an extremely thin film, deposition on a component with a high aspect ratio, deposition of a film with few defects such as pinholes, deposition with good coverage, and low-temperature deposition. The use of plasma in a PEALD (Plasma Enhanced ALD) method is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in a deposition method in which particles ejected from a target or the like are deposited, a film is formed by reaction at a surface of an object in a CVD method and an ALD method. Thus, a CVD method and an ALD method are deposition methods that enable good step coverage almost regardless of the shape of an object. In particular, an ALD method has excellent step coverage and excellent thickness uniformity and thus is suitable for covering a surface of an opening portion with a high aspect ratio, for example. Note that an ALD method has a relatively low deposition rate; hence, in some cases, an ALD method is preferably combined with another deposition method with a high deposition rate, such as a CVD method.

A CVD method and an ALD method enable control of the composition of a film to be deposited with the flow rate ratio of the source gases. For example, by a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case where a film is deposited while the flow rate ratio of the source gases is changed, as compared to the case where a film is deposited using a plurality of deposition chambers, the time taken for the deposition can be shortened because the time taken for transfer and pressure adjustment is omitted. Consequently, the productivity of the semiconductor device can be increased in some cases.

In this embodiment, for the insulator 211, silicon nitride is deposited by a CVD method.

Next, the insulator 212 is deposited over the insulator 211. The insulator 212 can be deposited by a sputtering method, a CVD method, an MBE method, a PLD method, an ALD method, or the like. In this embodiment, for the insulator 212, silicon nitride is deposited by a sputtering method.

When an insulator through which copper is less likely to pass, such as silicon nitride, is used for the insulator 211 and the insulator 212 in such a manner, even in the case where a metal that is likely to diffuse, such as copper, is used for a conductor in a layer (not illustrated) below the insulator 211, diffusion of the metal into an upper portion through the insulator 211 and the insulator 212 can be inhibited. The use of an insulator through which impurities such as water and hydrogen are less likely to pass, such as silicon nitride, can inhibit diffusion of impurities such as water and hydrogen contained in a layer below the insulator 211.

Then, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

It is preferable that the hydrogen concentration of the insulator 212 be lower than the hydrogen concentration of the insulator 211, and the hydrogen concentration of the insulator 214 be lower than the hydrogen concentration of the insulator 212. The insulator 212 deposited using silicon nitride by a sputtering method can have lower hydrogen concentration than the insulator 211 deposited using silicon nitride by a CVD method. The insulator 214 deposited using aluminum oxide can have lower hydrogen concentration than the insulator 212.

The transistor 200 is formed over the insulator 214 in a later step. It is preferable that a film near the transistor 200 have a relatively low hydrogen concentration and a film with a relatively high hydrogen concentration be positioned away from the transistor 200.

Next, the insulator 216 is deposited over the insulator 214. The insulator 216 can be deposited by a sputtering method, a CVD method, an MBE method, a PLD method, an ALD method, or the like. In this embodiment, silicon oxide or silicon oxynitride is used for the insulator 216. The insulator 216 is preferably deposited by a deposition method using the gas in which hydrogen atoms are reduced or removed. Thus, the hydrogen concentration of the insulator 216 can be reduced.

Then, an opening reaching the insulator 214 is formed in the insulator 216. Examples of the opening include a groove and a slit. A region where an opening is formed may be referred to as an opening portion. The opening may be formed by wet etching; however, dry etching is preferable for microfabrication. As the insulator 214, it is preferable to select an insulator that functions as an etching stopper film used in forming a groove by etching of the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film preferably contains a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, the conductive film to be the conductor 205a has a multilayer structure. First, a tantalum nitride film is deposited by a sputtering method, and a titanium nitride film is stacked over the tantalum nitride film. Even when a metal that easily diffuses, such as copper, is used for a conductive film to be the conductor 205b described later, the use of such a metal nitride for a layer below the conductor 205b can prevent diffusion of the metal to the outside from the conductor 205a.

Next, the conductive film to be the conductor 205b is deposited. The conductive film can be deposited by a plating method, a sputtering method, a CVD method, an MBE method, a PLD method, an ALD method, or the like. In this embodiment, for the conductive film, a low-resistance conductive material such as copper is deposited.

Next, CMP treatment is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed (see FIG. 6A to FIG. 6D). Note that the insulator 216 is partly removed by the CMP treatment in some cases.

Although the conductor 205 is embedded in the opening of the insulator 216 in the above description, one embodiment of the present invention is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Then, the insulator 222 is deposited over the insulator 216 and the conductor 205. An insulator containing an oxide of one or both of aluminum and hafnium is preferably deposited as the insulator 222. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and generation of oxygen vacancies in the oxide 230 can be inhibited.

The insulator 222 can be deposited by a sputtering method, a CVD method, an MBE method, a PLD method, an ALD method, or the like.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, after the deposition of the insulator 222, heat treatment at 400° C. for one hour is performed with a flow rate of a nitrogen gas of 4 slm and a flow rate of an oxygen gas of 1 slm. By the heat treatment, impurities such as water and hydrogen contained in the insulator 222 can be removed, for example. In the case where an oxide containing hafnium is used for the insulator 222, the heat treatment can improve the crystallinity of the insulator 222. The heat treatment can also be performed after the deposition of the insulator 224, for example.

Then, the insulator 224 is deposited over the insulator 222. The insulator 224 can be deposited by a sputtering method, a CVD method, an MBE method, a PLD method, an ALD method, or the like. In this embodiment, for the insulator 224, silicon oxide or silicon oxynitride is deposited by a CVD method. The insulator 224 is preferably deposited by a deposition method using the gas in which hydrogen atoms are reduced or removed. Thus, the hydrogen concentration of the insulator 224 can be reduced. The hydrogen concentration of the insulator 224 is preferably reduced because the insulator 224 is in contact with the oxide 230a in a later step.

Here, in order to form an excess-oxygen region in the insulator 224, plasma treatment with oxygen may be performed under reduced pressure. The plasma treatment with oxygen is preferably performed with an apparatus including a power source for generating high-density plasma using microwaves, for example. Alternatively, a power source for applying an RF (Radio Frequency) to the substrate side may be included. The use of high-density plasma enables high-density oxygen radicals to be generated, and application of the RF to the substrate side allows the oxygen radicals generated by the high-density plasma to be efficiently introduced into the insulator 224. Furthermore, after plasma treatment with an inert gas is performed using the apparatus, plasma treatment with oxygen may be performed in order to compensate for released oxygen. Note that impurities such as water and hydrogen contained in the insulator 224 can be removed by selecting the conditions of the plasma treatment as appropriate. In that case, the heat treatment does not need to be performed.

Here, after aluminum oxide is deposited over the insulator 224 by a sputtering method, for example, CMP treatment may be performed until the insulator 224 is exposed. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can sometimes prevent deterioration of the coverage with an oxide deposited later and a decrease in yield of the semiconductor device. Moreover, it is preferable to deposit aluminum oxide over the insulator 224 by a sputtering method, in which case oxygen can be added to the insulator 224.

Next, an oxide film 230A and an oxide film 230B are deposited in this order over the insulator 224 (see FIG. 6A to FIG. 6D). Note that it is preferable to deposit the oxide film 230A and the oxide film 230B successively without exposure to the air. By the deposition without exposure to the air, impurities or moisture from the air can be prevented from being attached to the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

When the oxide film 230A and the oxide film 230B are deposited by a sputtering method, for example, oxygen or a mixed gas of oxygen and a rare gas is used as a sputtering gas. An increase in the proportion of oxygen contained in the sputtering gas can increase the amount of excess oxygen in the oxide film to be deposited. In the case where the oxide films are deposited by a sputtering method, the above In—M—Zn oxide target or the like can be used.

In particular, in the deposition of the oxide film 230A, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. A transistor using an oxygen-excess oxide semiconductor in a channel formation region can have relatively high reliability. However, one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. A transistor using an oxygen-deficient oxide semiconductor in a channel formation region can have relatively high field-effect mobility. Furthermore, when the deposition is performed while the substrate is being heated, the crystallinity of the oxide film can be improved.

In this embodiment, the oxide film 230A is deposited by a sputtering method using an oxide target with In:Ga:Zn=1:3:4 [atomic ratio]. In addition, the oxide film 230B is deposited by a sputtering method using an oxide target with In:Ga:Zn=4:2:4.1 [atomic ratio]. Note that each of the oxide films is formed to have characteristics required for the oxide 230a and the oxide 230b by selecting the deposition conditions and the atomic ratios as appropriate.

Next, an oxide film 243A is deposited over the oxide film 230B (see FIG. 6A to FIG. 6D). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited by a sputtering method using an oxide target with In:Ga:Zn=1:3:4 [atomic ratio].

Note that the insulator 222, the insulator 224, the oxide film 230A, the oxide film 230B, and the oxide film 243A are preferably deposited without exposure to the air. For example, a multi-chamber deposition apparatus is used.

Next, heat treatment is preferably performed. The heat treatment is performed in a temperature range where the oxide film 230A, the oxide film 230B, and the oxide film 243A do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the oxide film 230A, the oxide film 230B, the oxide film 243A, and the like as much as possible.

In this embodiment, the heat treatment is performed in such a manner that treatment is performed at 550° C. in a nitrogen atmosphere for one hour, and then another treatment is successively performed at 550° C. in an oxygen atmosphere for one hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with higher density. Thus, diffusion of oxygen or impurities in the oxide film 230B can be inhibited.

Next, a conductive film 242A is deposited over the oxide film 243A (see FIG. 6A to FIG. 6D). The conductive film 242A can be deposited by a sputtering method, a CVD method, an MBE method, a PLD method, an ALD method, or the like. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto a surface of the oxide film 243A and the like, and further can reduce the moisture concentration and the hydrogen concentration in the oxide film 230A, the oxide film 230B, and the oxide film 243A. The temperature of the heat treatment is preferably higher than or equal to 100° C. and lower than or equal to 400° C. In this embodiment, the temperature of the heat treatment is 200° C.

Next, an insulating film 271A is deposited over the conductive film 242A (see FIG. 6A to FIG. 6D). The insulating film 271A can be deposited by a sputtering method, a CVD method, an MBE method, a PLD method, an ALD method, or the like. As the insulating film 271A, an insulating film having a function of inhibiting passage of oxygen is preferably used. For example, an aluminum oxide film, a silicon nitride film, a silicon oxide film, or a gallium oxide film may be deposited by a sputtering method or an ALD method.

Next, a conductive film 247A is deposited over the insulating film 271A (see FIG. 6A to FIG. 6D). The conductive film 247A can be deposited by a sputtering method, a CVD method, an MBE method, a PLD method, an ALD method, or the like.

Next, the oxide film 230A, the oxide film 230B, the oxide film 243A, the conductive film 242A, the insulating film 271A, and the conductive film 247A are processed into island shapes by a lithography method, so that the oxide 230a, the oxide 230b, an oxide layer 243B, a conductive layer 242B, an insulating layer 271B, and a conductive layer 247B are formed (see FIG. 7A to FIG. 7D). A dry etching method or a wet etching method can be used for the processing. Processing by a dry etching method is suitable for microfabrication. The oxide film 230A, the oxide film 230B, the oxide film 243A, the conductive film 242A, the insulating film 271A, and the conductive film 247A may be processed under different conditions. Note that in this step, the thickness of the insulator 224 in a region not overlapping with the oxide 230a is reduced in some cases.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. A liquid immersion technique may be employed in which a portion between a substrate and a projection lens is filled with a liquid (e.g., water) in light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

Figure 7A:
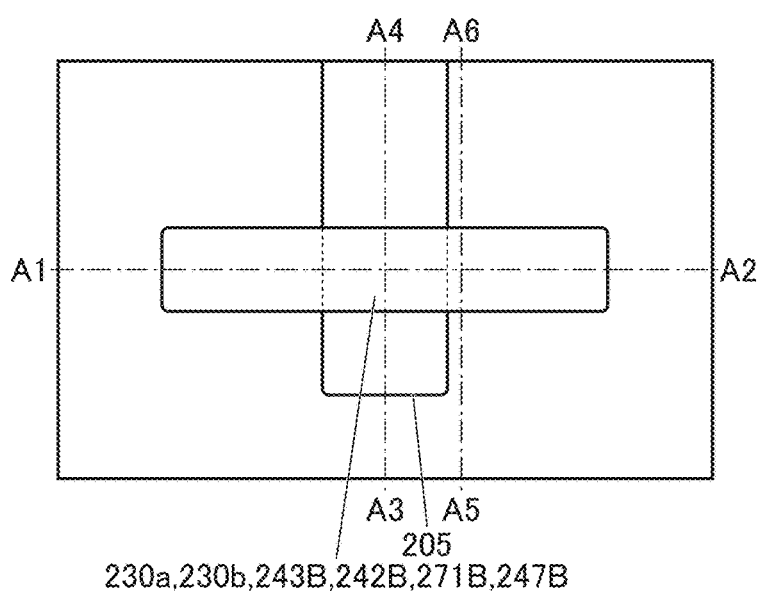
FIG. 7A is a top view illustrating a method for manufacturing a semiconductor device of one embodiment of the present invention.
Figure 7C:
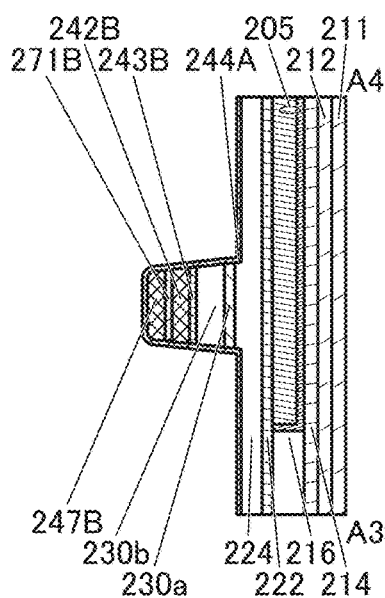
FIG. 7B to FIG. 7D are cross-sectional views illustrating a method for manufacturing a semiconductor device of one embodiment of the present invention.
Figure 7B:
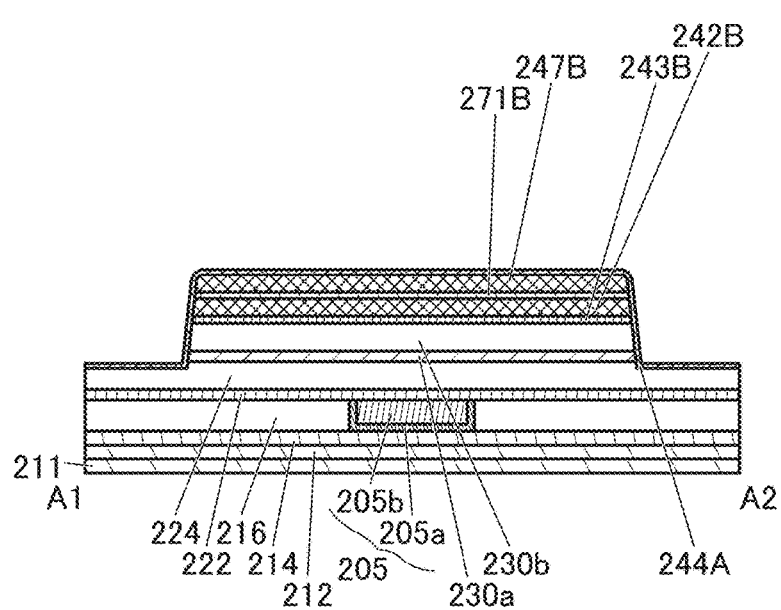
Figure 7D:
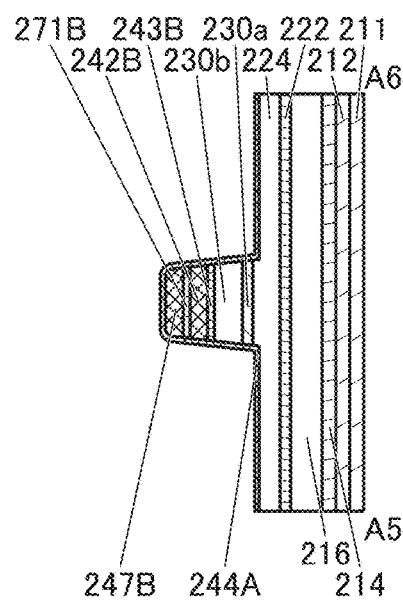

Here, the insulating layer 271B and the conductive layer 247B function as a mask for the conductive layer 242B; thus, as illustrated in FIG. 7B to FIG. 7D, the conductive layer 242B does not have a curved surface between the side surface and the top surface. Thus, end portions at the intersections of the side surfaces and the top surfaces of the conductor 242a and the conductor 242b illustrated in FIG. 5B and FIG. 5D are angular. The cross-sectional area of the conductor 242a (the conductor 242b) is larger in the case where the end portion at the intersection of the side surface and the top surface of the conductor 242a (the conductor 242b) is angular than in the case where the end portion is rounded. Accordingly, the resistance of the conductor 242a and the conductor 242b is reduced, so that the on-state current of the transistor 200 can be increased.

Here, the oxide 230a, the oxide 230b, the oxide layer 243B, the conductive layer 242B, the insulating layer 271B, and the conductive layer 247B are formed to at least partly overlap with the conductor 205. It is preferable that the side surfaces of the oxide 230a, the oxide 230b, the oxide layer 243B, the conductive layer 242B, the insulating layer 271B, and the conductive layer 247B be substantially perpendicular to the top surface of the insulator 222. When the side surfaces of the oxide 230a, the oxide 230b, the oxide layer 243B, the conductive layer 242B, the insulating layer 271B, and the conductive layer 247B are substantially perpendicular to the top surface of the insulator 222, a plurality of transistors 200 can be provided in a smaller area and at a higher density. Alternatively, a structure may be employed in which an angle formed by the side surfaces of the oxide 230a, the oxide 230b, the oxide layer 243B, the conductive layer 242B, the insulating layer 271B, and the conductive layer 247B and the top surface of the insulator 222 is a small angle. With such a shape, in later steps, the coverage with an insulating film 272A and the like can be improved, so that defects such as a void can be reduced.

In the above processing, a layer 244A is formed over the insulator 224, the oxide 230a, the oxide 230b, the oxide layer 243B, the conductive layer 242B, the insulating layer 271B, and the conductive layer 247B (see FIG. 7B to FIG. 7D).

Figure 8A:
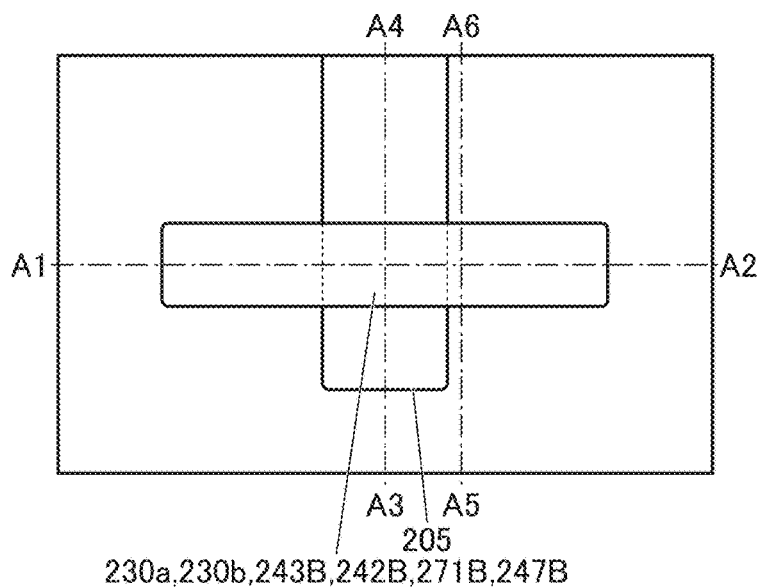
FIG. 8A is a top view illustrating a method for manufacturing a semiconductor device of one embodiment of the present invention.
Figure 8C:
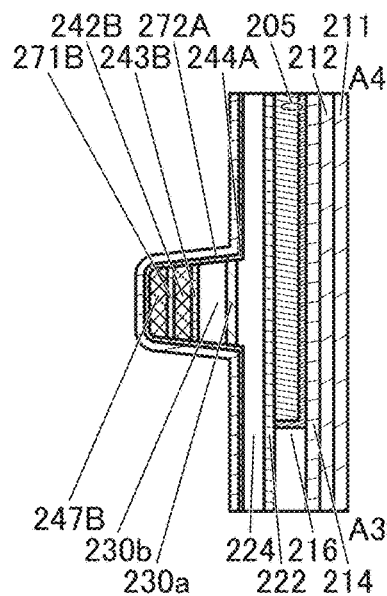
FIG. 8B to FIG. 8D are cross-sectional views illustrating a method for manufacturing a semiconductor device of one embodiment of the present invention.
Figure 8B:
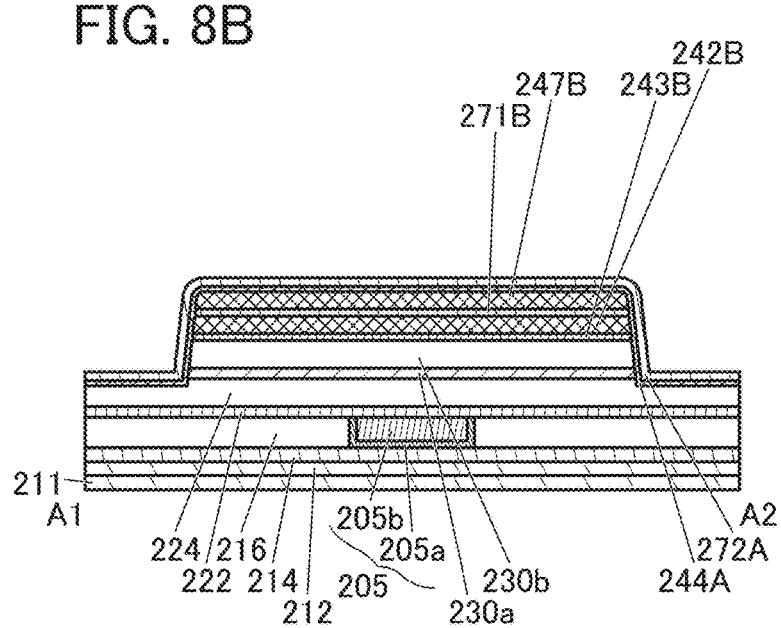
Figure 8D:
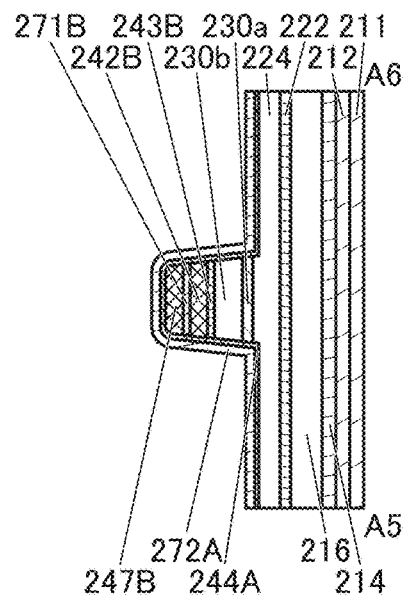
Figure 9A:
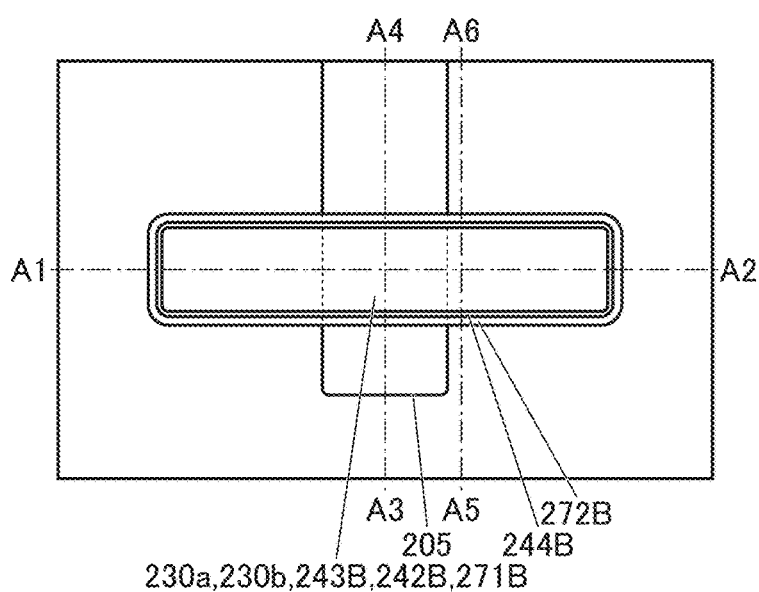
FIG. 9A is a top view illustrating a method for manufacturing a semiconductor device of one embodiment of the present invention.
Figure 9C:
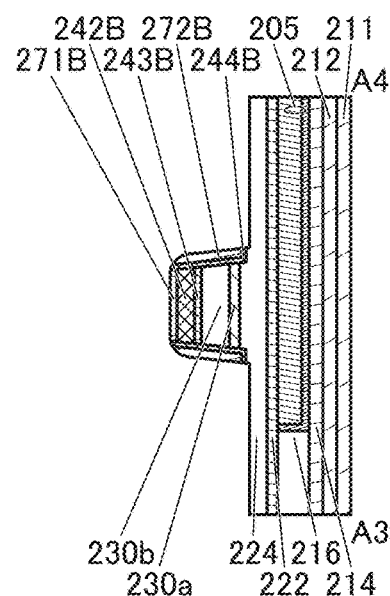
FIG. 9B to FIG. 9D are cross-sectional views illustrating a method for manufacturing a semiconductor device of one embodiment of the present invention.
Figure 9B:
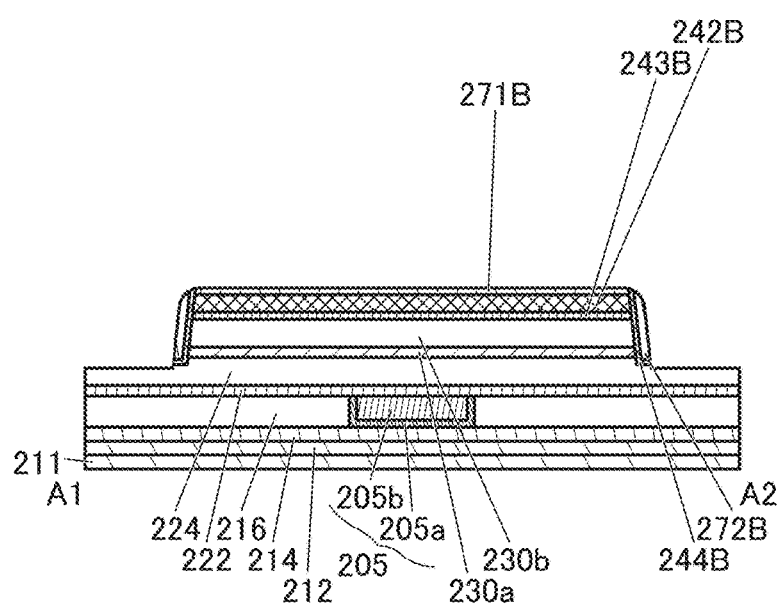
Figure 9D:
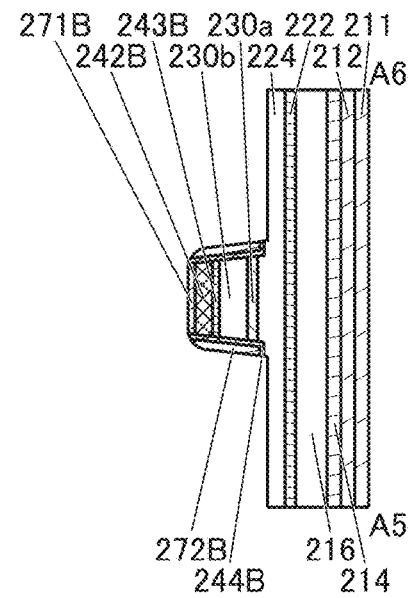

Next, the insulating film 272A is deposited over the layer 244A (see FIG. 8B to FIG. 8D). The insulating film 272A can be deposited by a sputtering method, a CVD method, an MBE method, a PLD method, an ALD method, or the like. In this embodiment, as the insulating film 272A, an aluminum oxide film is deposited by a sputtering method.

When an aluminum oxide film is deposited by a sputtering method as the insulating film 272A, the proportion of oxygen contained in a sputtering gas is lower than or equal to 20%, preferably lower than or equal to 10%, further preferably 0%. This can inhibit entry of oxygen from the side surfaces of the oxide 230a and the oxide 230b.

Next, anisotropic etching is performed on the insulating film 272A and the layer 244A to remove the insulating film 272A and the layer 244A over the conductive layer 247B and the insulating film 272A and the layer 244A over the insulator 224. Next, the conductive layer 247B is removed, whereby an insulating layer 272B and a layer 244B are formed. The layer 244B is preferably formed in contact with at least the side surface of the oxide 230a, the side surface of the oxide 230b, the side surface of the oxide layer 243B, and the side surface of the conductive layer 242B. The insulating layer 272B is preferably formed in contact with the layer 244B (see FIG. 9A to FIG. 9D).

Next, an insulating film to be the insulator 280 is deposited over the insulator 224, the insulating layer 271B, the layer 244B, and the insulating layer 272B. The insulating film can be deposited by a sputtering method, a CVD method, an MBE method, a PLD method, an ALD method, or the like. For example, as the insulating film, a silicon oxide film is deposited by a sputtering method, and a silicon oxide film is deposited thereover by a PEALD method or a thermal ALD method. The insulating film is preferably deposited by the deposition method using a gas in which hydrogen atoms are reduced or removed. Thus, the hydrogen concentration of the insulator 280 can be reduced. Note that heat treatment may be performed before the insulating film is deposited. The heat treatment may be performed under reduced pressure, and the insulating film may be successively deposited without exposure to the air. Such treatment can remove moisture and hydrogen adsorbed on a surface of the insulating layer 272B and the like, and further can reduce the moisture concentration and the hydrogen concentration of the oxide 230a, the oxide 230b, the oxide layer 243B, and the insulator 224. For the heat treatment, the conditions for the above heat treatment can be used.

The layer 244B over the insulator 224 is removed by the anisotropic etching. Thus, the concentration of metal contained in the layer 244B at and near the interface between the insulator 224 and the insulating film to be the insulator 280 is lower than or equal to the lower detection limit. Note that the metal contained in the layer 244B might be detected at and near the interface depending on a method for the anisotropic etching, or the like. In any case, the concentration of metal contained in the layer 244B at and near the interface is lower than the concentration of metal in the layer 244B.

Figure 10A:
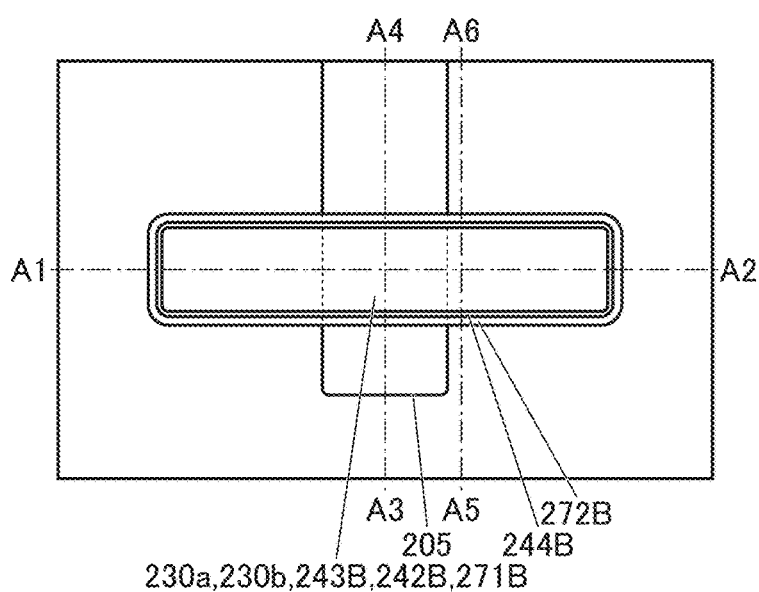
FIG. 10A is a top view illustrating a method for manufacturing a semiconductor device of one embodiment of the present invention.
Figure 10C:
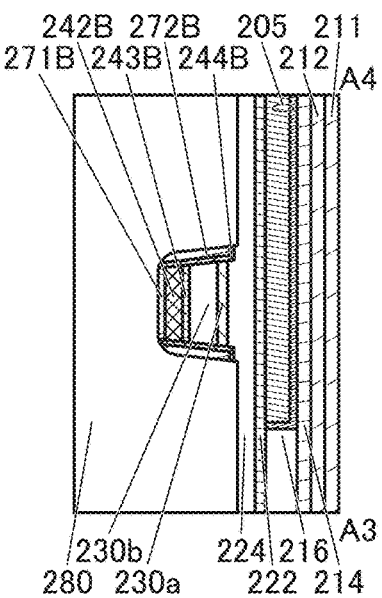
FIG. 10B to FIG. 10D are cross-sectional views illustrating a method for manufacturing a semiconductor device of one embodiment of the present invention.
Figure 10B:
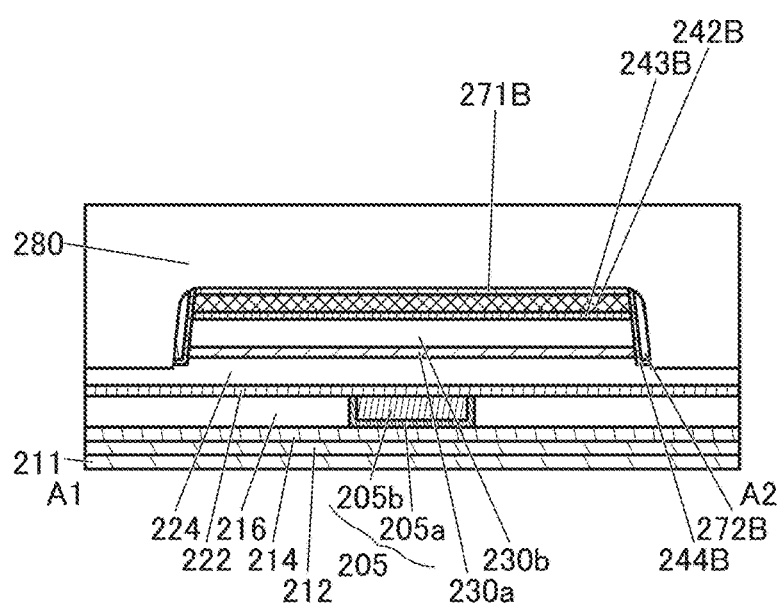
Figure 10D:
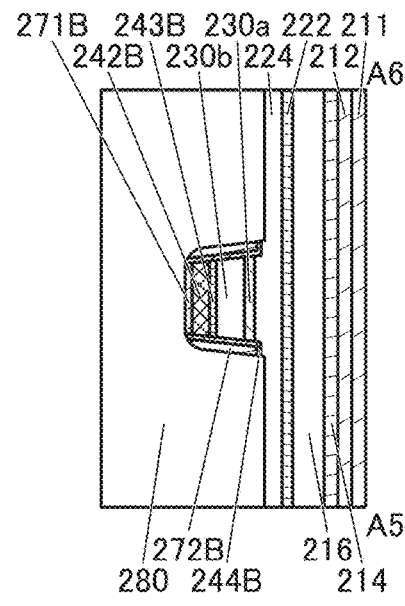
Figure 11A:
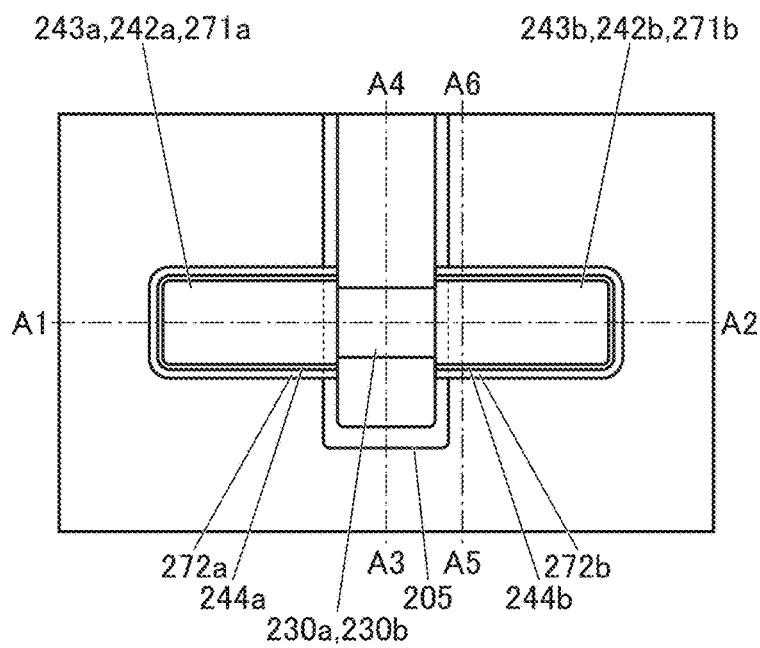
FIG. 11A is a top view illustrating a method for manufacturing a semiconductor device of one embodiment of the present invention.
Figure 11C:
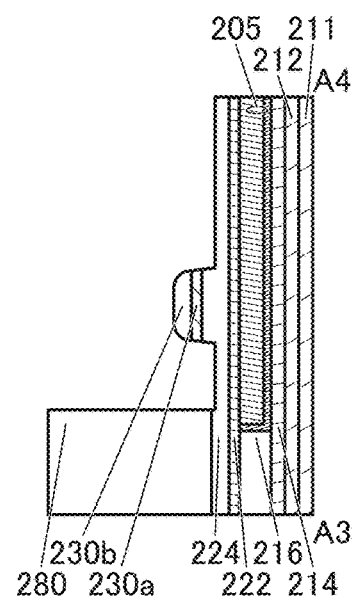
FIG. 11B to FIG. 11D are cross-sectional views illustrating a method for manufacturing a semiconductor device of one embodiment of the present invention.
Figure 11B:
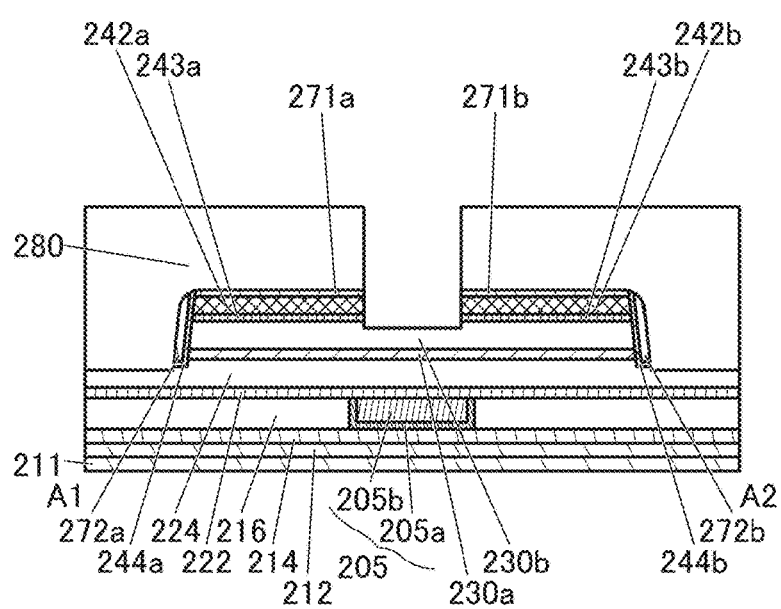
Figure 11D:
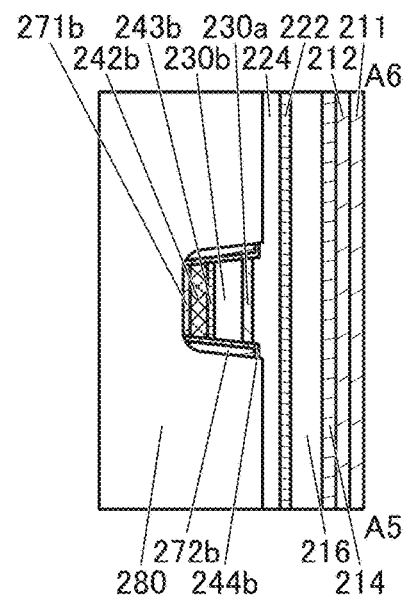
Figure 12A:
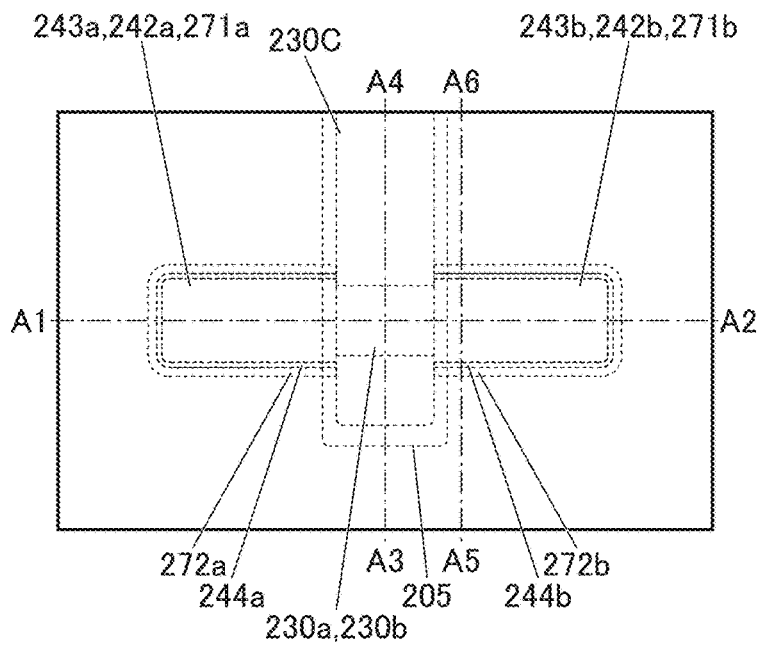
FIG. 12A is a top view illustrating a method for manufacturing a semiconductor device of one embodiment of the present invention.
Figure 12B:
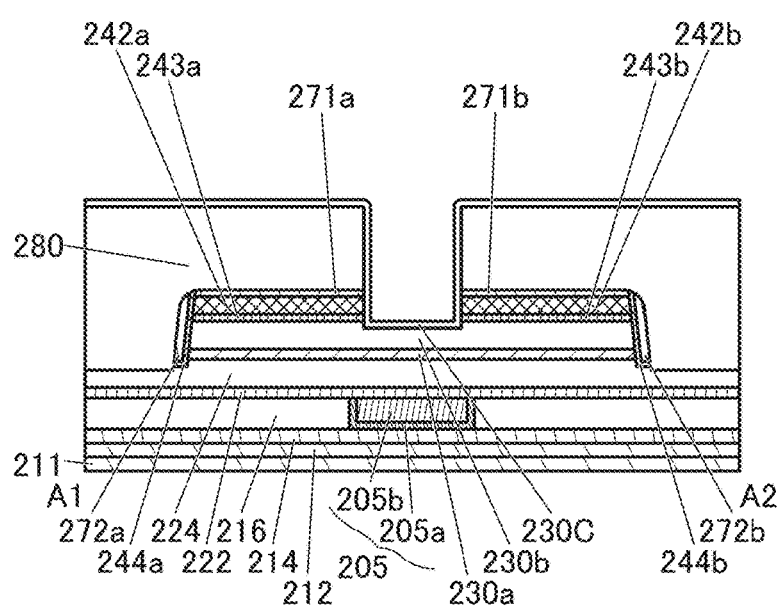
FIG. 12B to FIG. 12D are cross-sectional views illustrating a method for manufacturing a semiconductor device of one embodiment of the present invention.
Figure 12C:
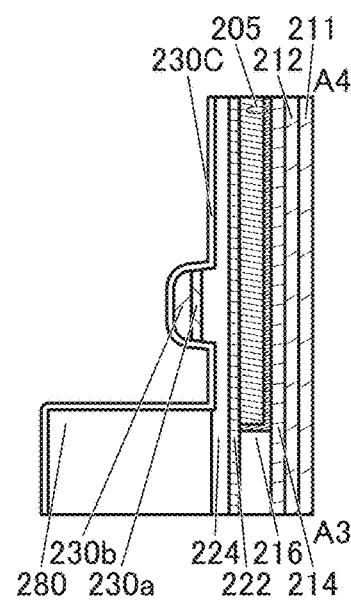
Figure 12D:
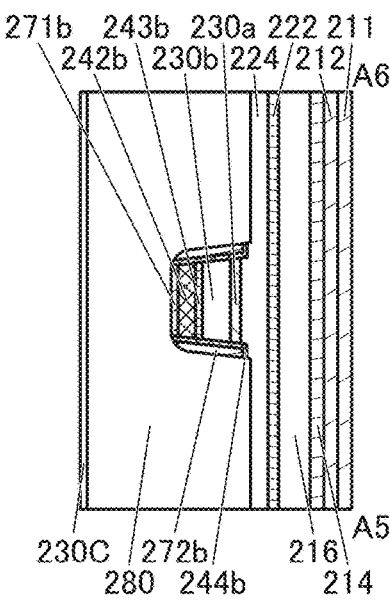

Next, the insulating film is subjected to CMP treatment, so that the insulator 280 having a flat top surface is formed (see FIG. 10B to FIG. 10D). Note that as in the insulator 224, aluminum oxide may be deposited over the insulator 280 by a sputtering method, for example, and the aluminum oxide may be subjected to CMP until the insulator 280 is exposed. Through the above step, the insulator 280 is in contact with at least part of the insulator 224.

Here, microwave treatment may be performed. The microwave treatment is preferably performed in an atmosphere containing oxygen under reduced pressure. By performing the microwave treatment, an electric field by a microwave can be supplied to the insulator 280, the oxide 230b, the oxide 230a, and the like to divide $V_OH$ in the oxide 230b and the oxide 230a into oxygen vacancy ($V_O$) and hydrogen (H). Part of hydrogen divided at this time is bonded to oxygen contained in the insulator 280 and is removed as water molecules in some cases. Part of hydrogen is gettered by the conductive layer 242B through the insulating layer 272B in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 in the following step after the formation of the insulator 280, heat treatment, or the like.

Then, part of the insulator 280, part of the insulating layer 271B, part of the conductive layer 242B, part of the oxide layer 243B, part of the insulating layer 272B, part of the layer 244B, and part of the oxide 230b are processed to form an opening reaching the oxide 230b. The opening is preferably formed to overlap with the conductor 205. By formation of the opening, the conductor 242a, the conductor 242b, the oxide 243a, the oxide 243b, the layer 244a, the layer 244b, the insulator 272a, the insulator 272b, the insulator 271a, and the insulator 271b are formed (see FIG. 11A to FIG. 11D).

An upper portion of the oxide 230b is removed when the opening is formed. Removal of part of the oxide 230b forms a groove in the oxide 230b. The groove may be formed in the same step as the formation of the opening or in a step different from the formation of the opening in accordance with the depth of the groove.

The part of the insulator 280, the part of the insulating layer 271B, the part of the conductive layer 242B, the part of the oxide layer 243B, the part of the insulating layer 272B, the part of the layer 244B, and the part of the oxide 230b can be processed by a dry etching method or a wet etching method. Processing by a dry etching method is suitable for microfabrication. The processing may be performed under different conditions. For example, the part of the insulator 280 may be processed by a dry etching method, the part of the insulating layer 271B and the part of the insulating layer 272B may be processed by a wet etching method, and the part of the oxide layer 243B, the part of the conductive layer 242B, and the part of the oxide 230b may be processed by a dry etching method. Processing of the part of the oxide layer 243B and the part of the conductive layer 242B and processing of the part of the oxide 230b may be performed under different conditions. The part of the layer 244B may be processed at the time of processing the part of the insulating layer 271B and the part of the insulating layer 272B or may be processed at the time of processing the part of the oxide layer 243B and the part of the conductive layer 242B.

When the oxide 230b is partly removed to form a groove by a dry etching method, a strong bias power is preferably applied during treatment. A bias power density is, for example, preferably more than or equal to 0.03 W/cm$^2$, further preferably more than or equal to 0.06 W/cm$^2$. The dry etching treatment time may be set as appropriate depending on the depth of the groove.

When the opening is formed, the surface of the oxide 230b at the bottom portion of the opening is sometimes damaged. In the damaged region of the oxide 230b, crystal defects such as oxygen vacancies may be formed and impurities (hydrogen, nitrogen, silicon, and a metal element such as aluminum) may exist. In the damaged region, oxygen vacancies and impurities such as hydrogen are likely to exist; thus, the reaction, $V_O+H\rightarrow V_OH$, is likely to occur. Accordingly, a large amount of $V_OH$ is formed in the damaged region. Thus, when the damaged region of the oxide 230b is left and the oxide 230c is formed thereover, the transistor is likely to have normally-on characteristics. Furthermore, in-plane variation in the damaged region leads to variation in the characteristics of the semiconductor device including the transistor.

Here, it is preferable to remove impurities that are attached onto the surfaces of the oxide 230a, the oxide 230b, and the like or diffused into the oxide 230a, the oxide 230b, and the like. It is also preferable to remove the damaged region that is formed on the surface of the oxide 230b by the above dry etching. The impurities result from components contained in the insulator 280, the insulating layer 272B, the insulating layer 271B, the layer 244B, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the damaged region, the impurities, and the like, cleaning treatment is performed. Examples of the cleaning method include wet cleaning using a cleaning solution and the like, plasma treatment using plasma, and cleaning by heat treatment, and any of these cleanings may be performed in appropriate combination. The cleaning treatment sometimes makes the groove deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid may be higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, first cleaning treatment may be performed using diluted hydrofluoric acid or diluted ammonia water, and second cleaning treatment may be performed using pure water or carbonated water.

As the cleaning treatment in this embodiment, wet cleaning using diluted hydrofluoric acid is performed, and then wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. The crystallinity of the oxide 230c formed over the oxide 230b can be increased.

By the processing such as dry etching or the cleaning treatment, the thickness of the insulator 224 in a region that overlaps with the opening and does not overlap with the oxide 230b might become smaller than the thickness of the insulator 224 in a region that overlaps with the oxide 230b.

After the etching or the cleaning, heat treatment may be performed. The heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce oxygen vacancies. This heat treatment can improve the crystallinity of the oxide 230b and the crystallinity of the oxide 230c formed in the groove of the oxide 230b. The heat treatment may be performed under reduced pressure. Alternatively, the heat treatment may be performed in an oxygen atmosphere, and then another heat treatment may be successively performed in a nitrogen atmosphere without exposure to the air.

When the damaged region is removed, the oxide 230c including a CAAC-OS can be formed in the groove of the oxide 230b from which the damaged region is removed. The damaged region may be removed by formation of a groove in the upper portion of the oxide 230b in the cross-sectional view of the transistor in the channel length direction.

Next, an oxide film 230C is deposited (see FIG. 12A to FIG. 12D). The heat treatment may be performed before the oxide film 230C is deposited. It is preferable that the heat treatment be performed under reduced pressure and the oxide film 230C be successively deposited without exposure to the air. The heat treatment is preferably performed in an oxygen-containing atmosphere. Such treatment can remove moisture and hydrogen adsorbed on the surface of the oxide 230b or the like and can reduce the moisture concentration and the hydrogen concentration of the oxide 230a and the oxide 230b. The temperature of the heat treatment is preferably higher than or equal to 100° C. and lower than or equal to 400° C. In this embodiment, the temperature of the heat treatment is 200° C.

Here, the oxide film 230C is preferably provided in contact with at least the inner wall of the groove formed in the oxide 230b, part of the side surface of the oxide 243a, part of the side surface of the oxide 243b, part of the side surface of the conductor 242a, part of the side surface of the conductor 242b, part of the side surface of the layer 244a, part of the side surface of the layer 244b, part of the side surface of the insulator 271a, part of the side surface of the insulator 271b, and part of the side surface of the insulator 280. The conductor 242a (the conductor 242b) is surrounded by the oxide 243a (the oxide 243b), the insulator 271a (the insulator 271b), the layer 244a (the layer 244b), and the oxide film 230C; thus, a reduction in the conductivity of the conductor 242a and the conductor 242b due to the oxidation thereof in the following steps can be inhibited.

The oxide film 230C can be deposited by a sputtering method, a CVD method, an MBE method, a PLD method, an ALD method, or the like. The oxide film 230C may be deposited by a deposition method similar to that for the oxide film 230A or the oxide film 230B depending on characteristics required for the oxide film 230C. In this embodiment, the oxide film 230C is deposited by a sputtering method using an oxide target with In:Ga:Zn=4:2:3 [atomic ratio], an oxide target with In:Ga:Zn=5:1:3 [atomic ratio], an oxide target with In:Ga:Zn=10:1:3 [atomic ratio], or an indium oxide target.

Part of oxygen contained in the sputtering gas is sometimes supplied to the oxide 230a and the oxide 230b during the deposition of the oxide film 230C. Alternatively, during the deposition of the oxide film 230C, part of oxygen contained in the sputtering gas is sometimes supplied to the insulator 280. Therefore, the proportion of oxygen contained in the sputtering gas for the oxide film 230C is 70% or higher, preferably 80% or higher, further preferably 100%. By depositing the oxide film 230C under an atmosphere containing much oxygen, the oxide film 230C is likely to be a CAAC-OS.

The oxide film 230C is preferably deposited while the substrate is being heated. In that case, the substrate temperature is set to higher than or equal to 200° C., so that oxygen vacancies in the oxide film 230C and the oxide 230b can be reduced. The deposition is performed while the substrate is being heated, whereby the crystallinity of the oxide film 230C and the oxide 230b can be improved.

Next, a mask is formed over the oxide film 230C by a lithography method. Note that a hard mask or a resist mask may be used as the mask.

Then, part of the oxide film 230C is selectively removed using the mask. Note that the part of the oxide film 230C is preferably removed by a wet etching method or the like. Through this step, the part of the oxide film 230C located between the adjacent transistors 200 in the channel width direction can be removed.

In a region where part of the oxide film 230C is removed through the above step, the surface of the insulator 224 and the surface of the insulator 280 are exposed. In that case, the thickness of the insulator 224 and the thickness of the insulator 280 in the region are sometimes reduced. In some cases, the insulator 224 in the region is removed and the surface of the insulator 222 is exposed. The step of forming the mask may also serve as the step of removing the part of the oxide film 230C.

Figure 13A:
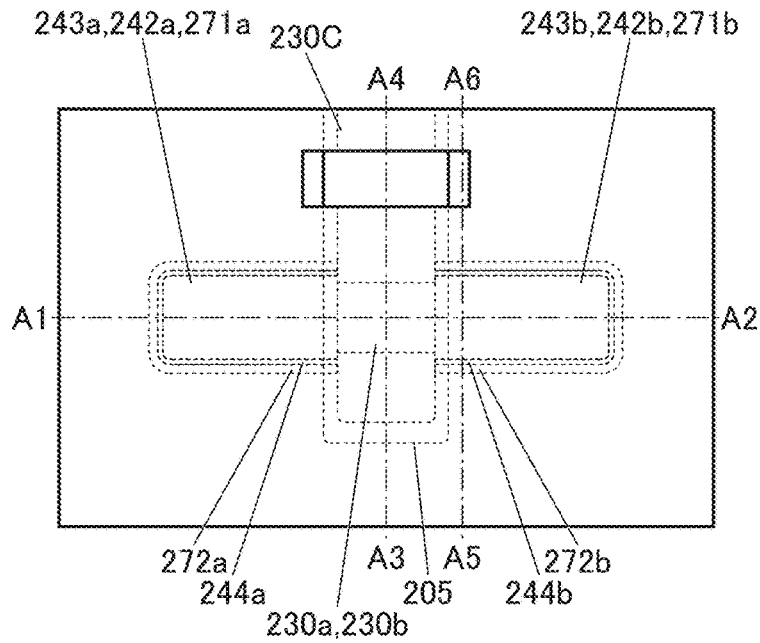
FIG. 13A is a top view illustrating a method for manufacturing a semiconductor device of one embodiment of the present invention.
Figure 13C:
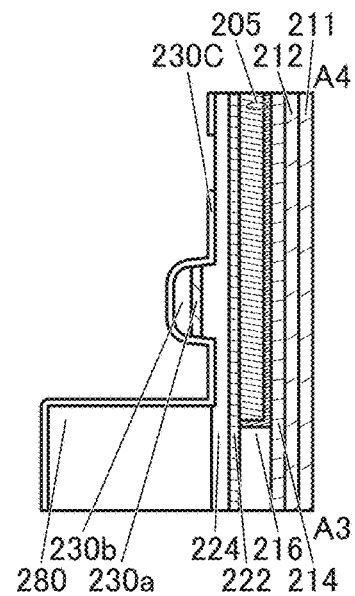
FIG. 13B to FIG. 13D are cross-sectional views illustrating a method for manufacturing a semiconductor device of one embodiment of the present invention.
Figure 13B:
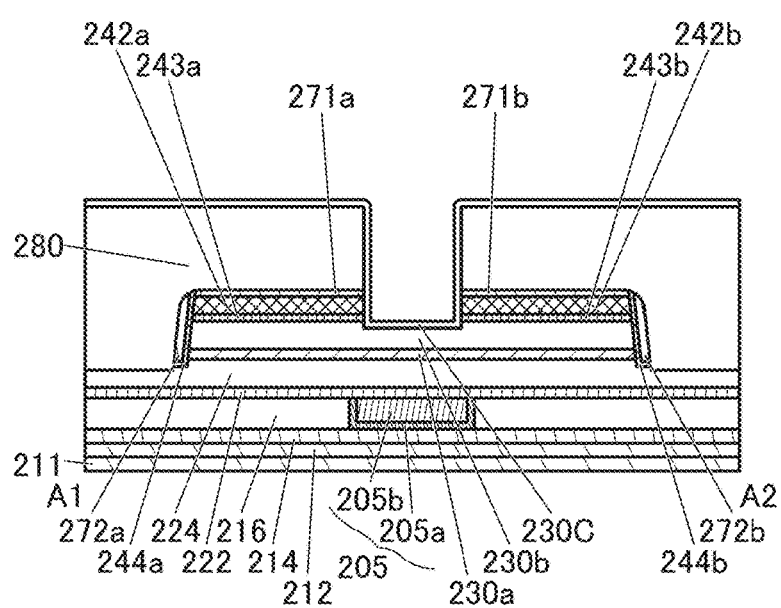
Figure 13D:
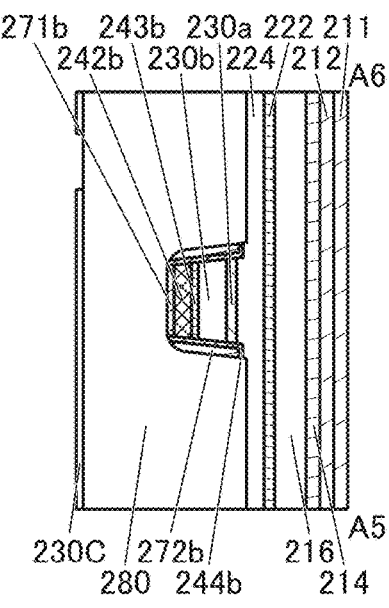
Figure 14A:
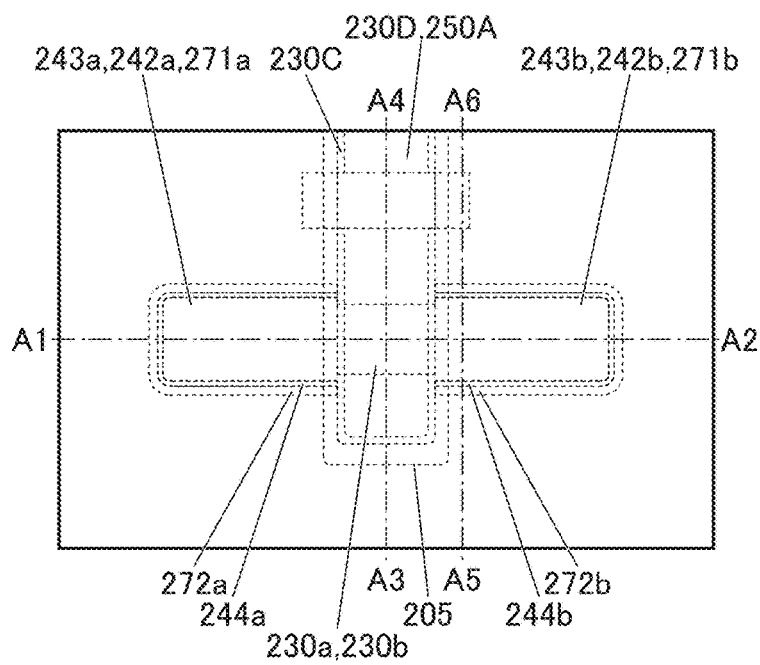
FIG. 14A is a top view illustrating a method for manufacturing a semiconductor device of one embodiment of the present invention.
Figure 14C:
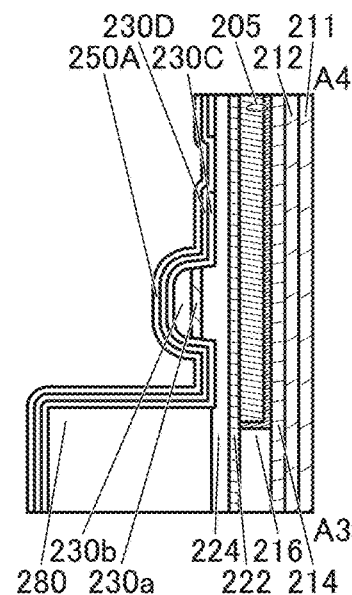
FIG. 14B to FIG. 14D are cross-sectional views illustrating a method for manufacturing a semiconductor device of one embodiment of the present invention.
Figure 14B:
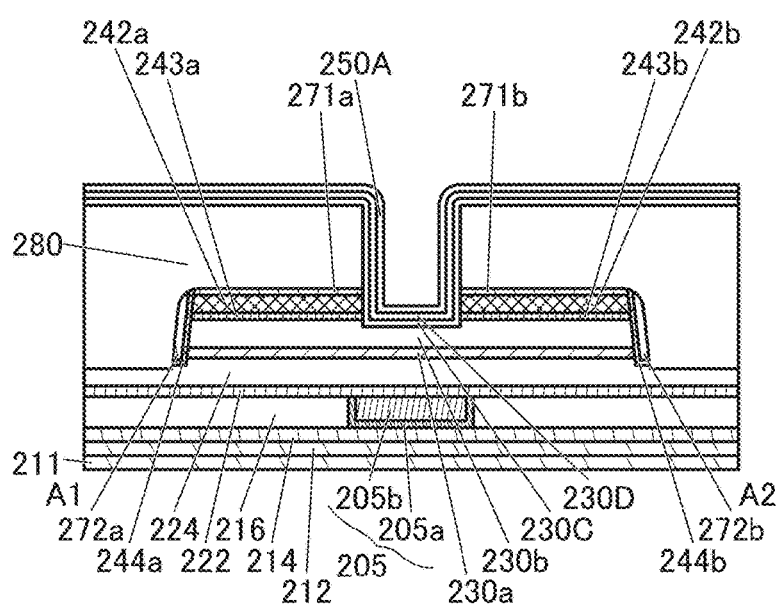
Figure 14D:
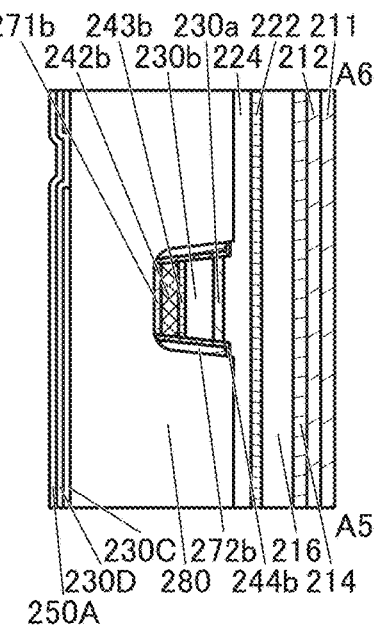
Figure 15A:
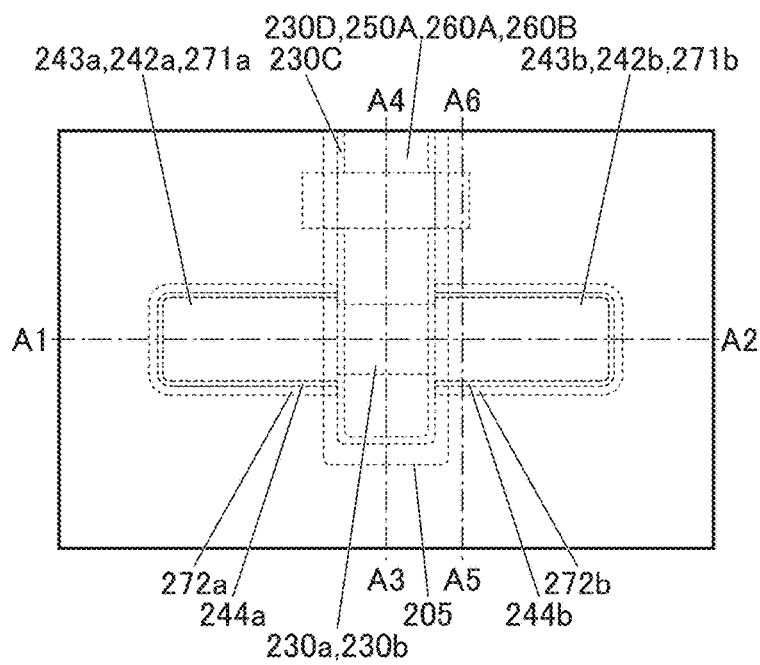
FIG. 15A is a top view illustrating a method for manufacturing a semiconductor device of one embodiment of the present invention.
Figure 15C:
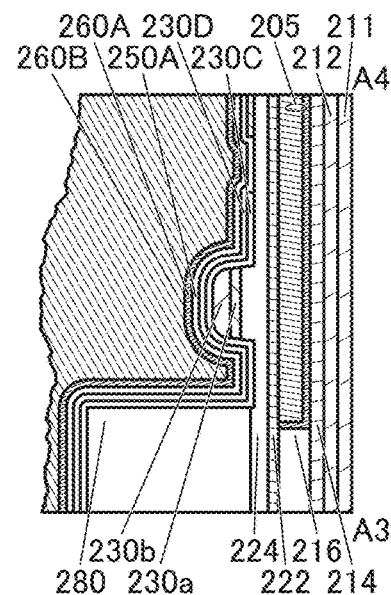
FIG. 15B to FIG. 15D are cross-sectional views illustrating a method for manufacturing a semiconductor device of one embodiment of the present invention.
Figure 15B:
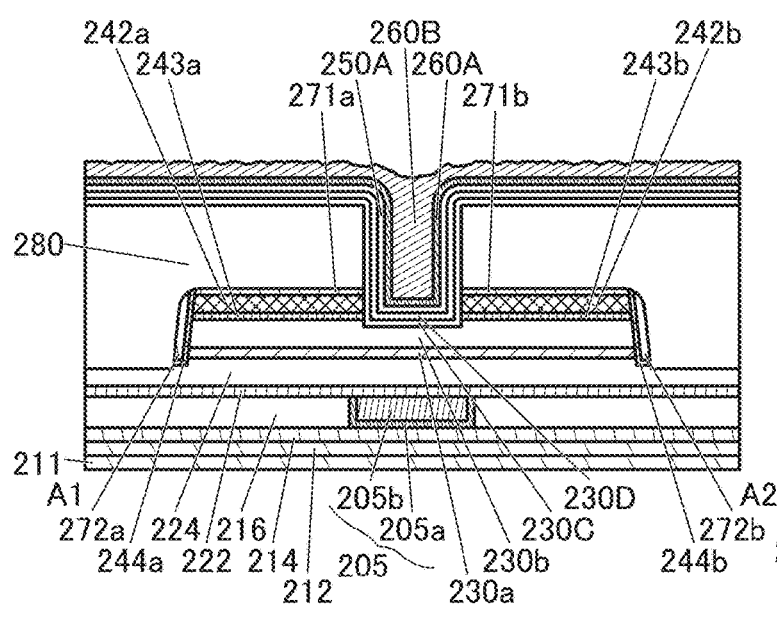
Figure 15D:
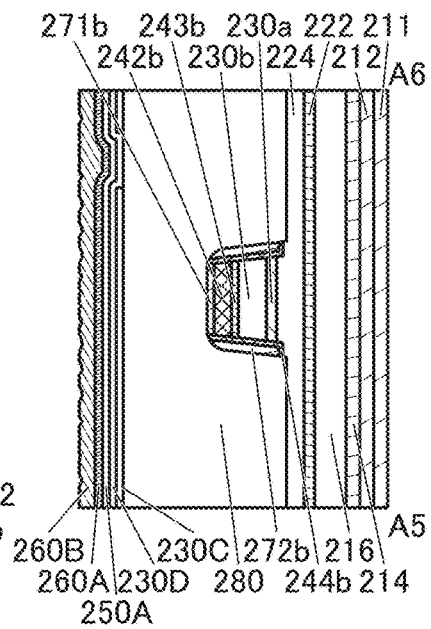
Figure 16A:
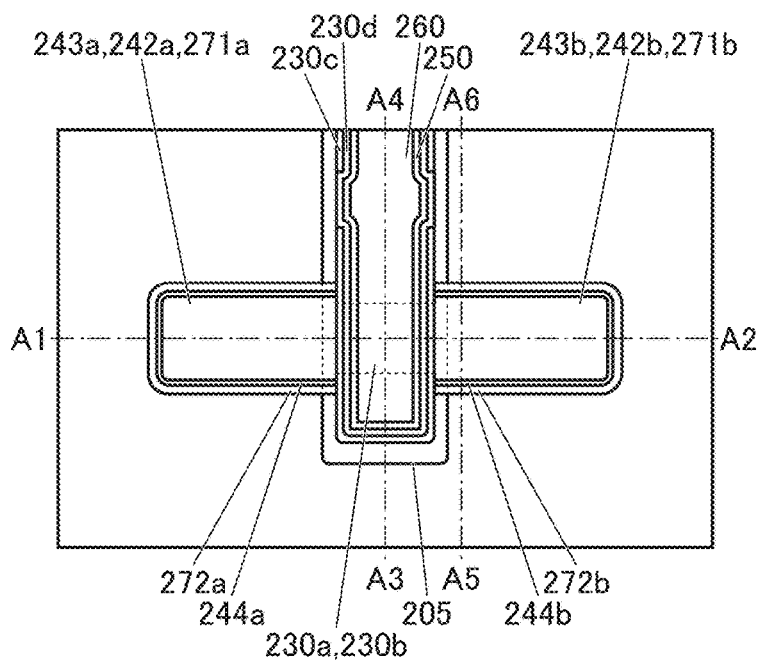
FIG. 16A is a top view illustrating a method for manufacturing a semiconductor device of one embodiment of the present invention.
Figure 16C:
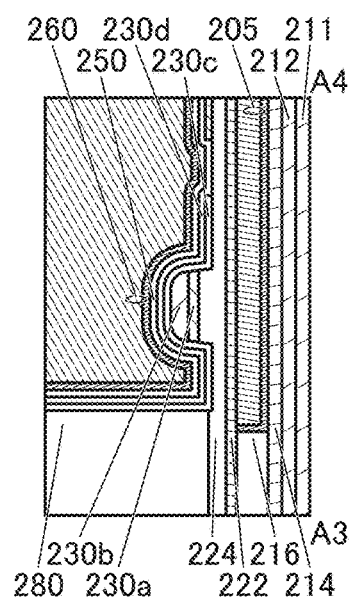
FIG. 16B to FIG. 16D are cross-sectional views illustrating a method for manufacturing a semiconductor device of one embodiment of the present invention.
Figure 16B:
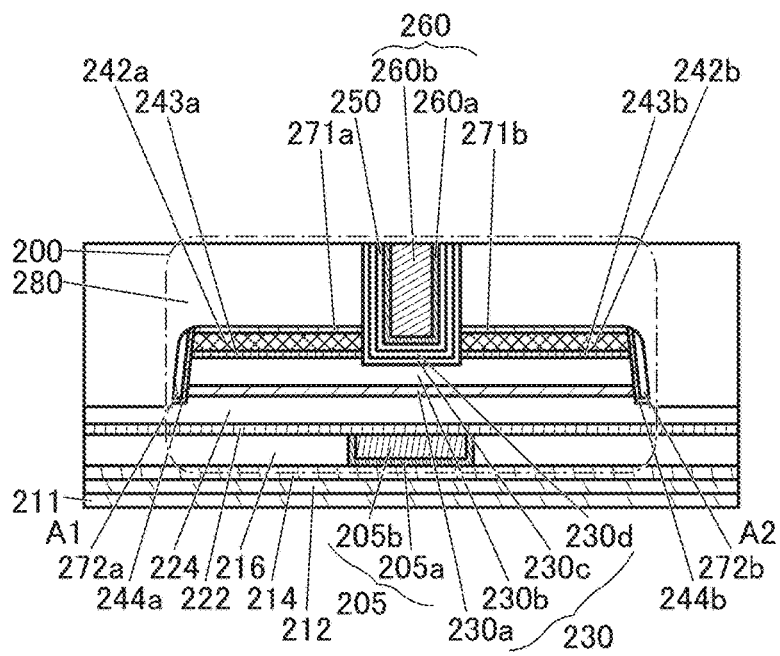
Figure 16D:
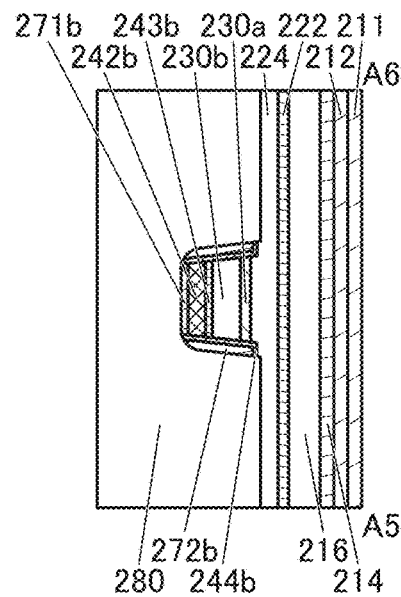

Next, the mask is removed (see FIG. 13A, FIG. 13C, and FIG. 13D). The mask is preferably removed by an etching method or the like.

Next, an oxide film 230D is deposited (see FIG. 14A to FIG. 14D). The oxide film 230D may be successively deposited after the deposition of the oxide film 230C without exposure to the air.

The oxide film 230D can be deposited by a sputtering method, a CVD method, an MBE method, a PLD method, an ALD method, or the like. The oxide film 230D is deposited by a deposition method similar to that for the oxide film 230A or the oxide film 230B in accordance with characteristics required for the oxide film 230D. In this embodiment, the oxide film 230D is deposited by a sputtering method using an oxide target with In:Ga:Zn=1:3:4 [atomic ratio].

Part of oxygen contained in the sputtering gas is sometimes supplied to the oxide film 230C during the deposition of the oxide film 230D. Alternatively, during the deposition of the oxide film 230D, part of oxygen contained in the sputtering gas is sometimes supplied to the insulator 280. Therefore, the proportion of oxygen contained in the sputtering gas for the oxide film 230D is higher than or equal to 70%, preferably higher than or equal to 80%, further preferably 100%.

Next, an insulating film 250A is deposited (see FIG. 14A to FIG. 14D). Heat treatment may be performed before the insulating film 250A is deposited; the heat treatment may be performed under reduced pressure, and the insulating film 250A may be successively deposited without exposure to the air. The heat treatment is preferably performed in an oxygen-containing atmosphere. The treatment can remove moisture and hydrogen adsorbed onto the surface of the oxide film 230D and the like, and further can reduce the moisture concentration and the hydrogen concentration in the oxide 230a, the oxide 230b, the oxide film 230C, and the oxide film 230D. The temperature of the heat treatment is preferably higher than or equal to 100° C. and lower than or equal to 400° C.

The insulating film 250A can be deposited by a sputtering method, a CVD method, an MBE method, a PLD method, an ALD method, or the like. The insulating film 250A is preferably deposited by a deposition method using the gas in which hydrogen atoms are reduced or removed. Thus, the hydrogen concentration of the insulating film 250A can be reduced. The hydrogen concentration is preferably reduced because the insulating film 250A becomes the insulator 250 that is in contact with the oxide 230d in a later step.

Note that in the case where the insulator 250 has a two-layer stacked structure, an insulating film to be the lower layer of the insulator 250 and an insulating film to be the upper layer of the insulator 250 are preferably deposited successively without exposure to the air. When the deposition is performed without exposure to the air, the impurities or moisture from the air can be prevented from being attached onto the insulating film to be the lower layer of the insulator 250 and the insulating film to be the upper layer of the insulator 250, whereby the vicinity of the interface between the insulating film to be the lower layer of the insulator 250 and the insulating film to be the upper layer of the insulator 250 can be kept clean.

Here, after the insulating film 250A is deposited, the microwave treatment may be performed in an atmosphere containing oxygen under reduced pressure. By performing the microwave treatment, an electric field by a microwave is applied to the insulating film 250A, the oxide film 230D, the oxide film 230C, the oxide 230b, the oxide 230a, and the like, so that $V_OH$ in the oxide film 230D, the oxide film 230C, the oxide 230b, and the oxide 230a can be divided into $V_O$ and hydrogen. Part of hydrogen divided at this time is bonded to oxygen and is removed as $H_2O$ from the insulating film 250A, the oxide film 230D, the oxide film 230C, the oxide 230b, and the oxide 230a in some cases. Part of hydrogen is sometimes gettered by the conductor 242a and the conductor 242b. Performing the microwave treatment in such a manner can reduce the hydrogen concentration in the insulating film 250A, the oxide film 230D, the oxide film 230C, the oxide 230b, and the oxide 230a. Furthermore, oxygen is supplied to $V_O$ that can exist after $V_OH$ in the oxide 230a, the oxide 230b, the oxide film 230C, and the oxide film 230D is divided into $V_O$ and hydrogen, so that $V_O$ can be repaired or filled.

After the microwave treatment, heat treatment may be performed with the reduced pressure being maintained. Such treatment enables hydrogen in the insulating film 250A, the oxide film 230D, the oxide film 230C, the oxide 230b, and the oxide 230a to be removed efficiently. Part of hydrogen is sometimes gettered by the conductor 242a and the conductor 242b. Alternatively, it is possible to repeat the step of performing microwave treatment and the step of performing heat treatment with the reduced pressure being maintained after the microwave treatment. The repetition of the heat treatment enables hydrogen in the insulating film 250A, the oxide film 230D, the oxide film 230C, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, whereby diffusion of hydrogen, water, impurities, and the like can be inhibited. Accordingly, hydrogen, water, impurities, and the like can be inhibited from diffusing into the oxide 230b, the oxide 230a, and the like through the insulator 250 in the following step such as deposition of a conductive film to be the conductor 260 or the following treatment such as heat treatment.

Next, a conductive film 260A and a conductive film 260B are deposited in this order (see FIG. 15A to FIG. 15D). The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method.

Then, the oxide film 230C, the oxide film 230D, the insulating film 250A, the conductive film 260A, and the conductive film 260B are polished by CMP treatment until the insulator 280 is exposed, whereby the oxide 230c, the oxide 230d, the insulator 250, and the conductor 260 (the conductor 260a and the conductor 260b) are formed (see FIG. 16A to FIG. 16D). Accordingly, the oxide 230c is positioned to cover the inner wall (the side wall and bottom surface) of the opening reaching the oxide 230b and the groove of the oxide 230b. The oxide 230d is positioned to cover the inner wall of the opening and the groove with the oxide 230c therebetween. The insulator 250 is positioned to cover the inner wall of the opening and the groove with the oxide 230c and the oxide 230d therebetween. The conductor 260 is positioned to fill the opening and the groove with the oxide 230c, the oxide 230d, and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively deposited without exposure to the air.

Figure 17A:
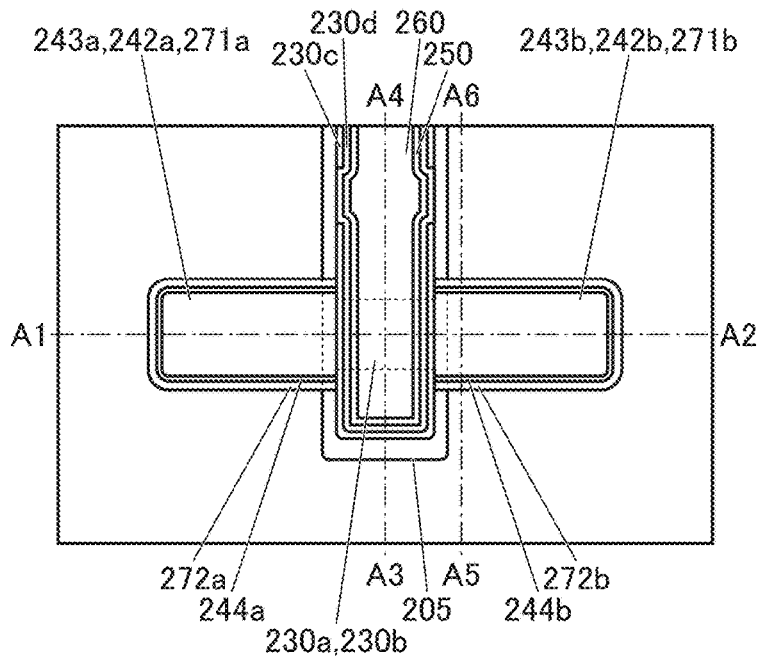
FIG. 17A is a top view illustrating a method for manufacturing a semiconductor device of one embodiment of the present invention.
Figure 17C:
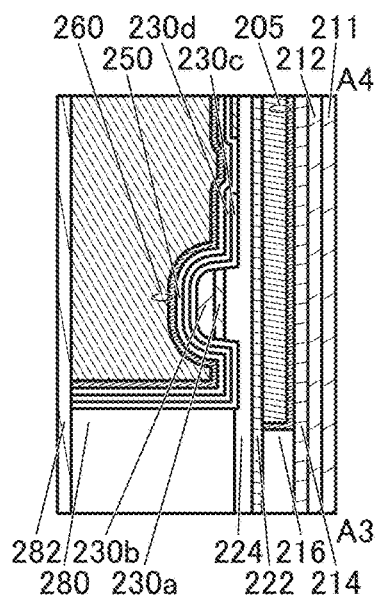
FIG. 17B to FIG. 17D are cross-sectional views illustrating a method for manufacturing a semiconductor device of one embodiment of the present invention.
Figure 17B:
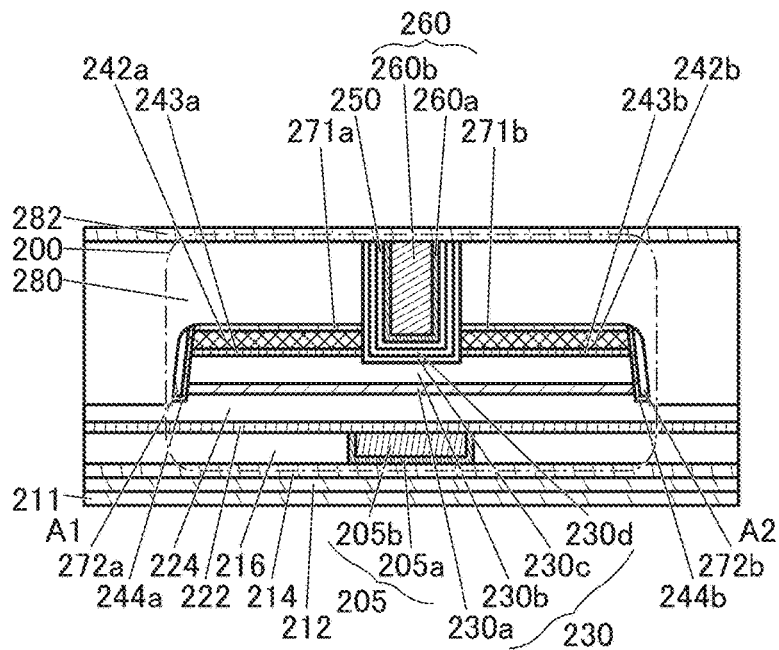
Figure 17D:
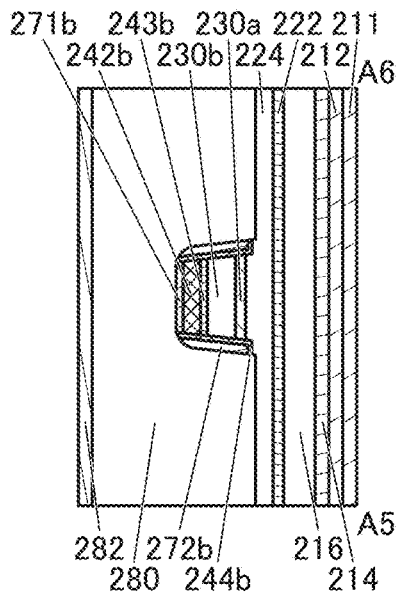
Figure 18A:
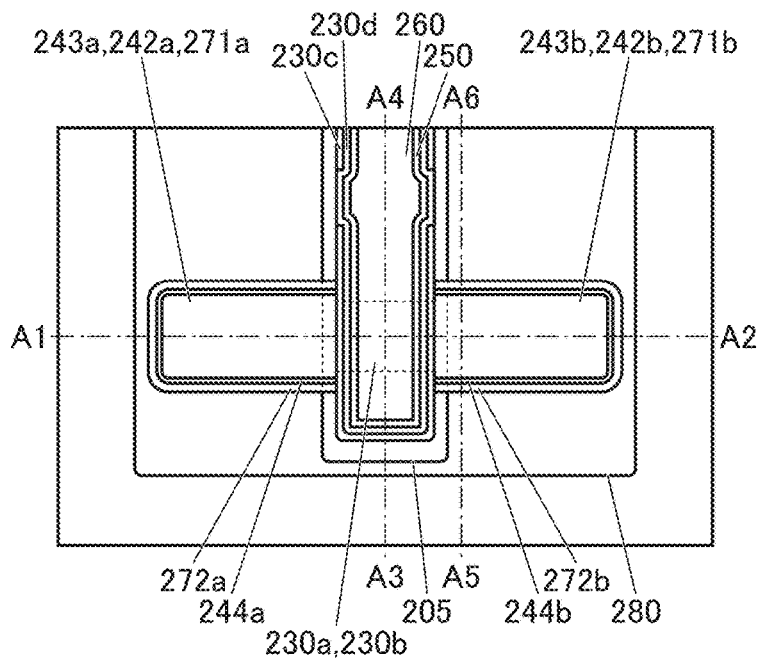
FIG. 18A is a top view illustrating a method for manufacturing a semiconductor device of one embodiment of the present invention.
Figure 18C:
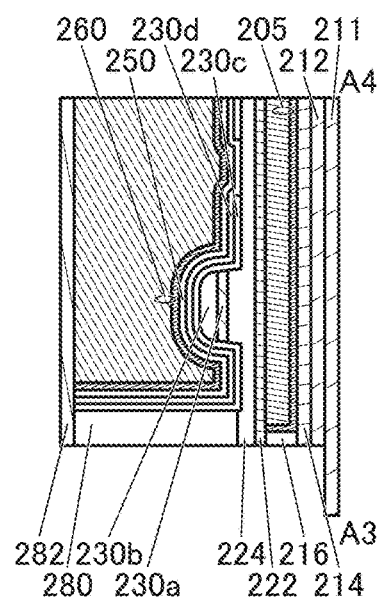
FIG. 18B to FIG. 18D are cross-sectional views illustrating a method for manufacturing a semiconductor device of one embodiment of the present invention.
Figure 18B:
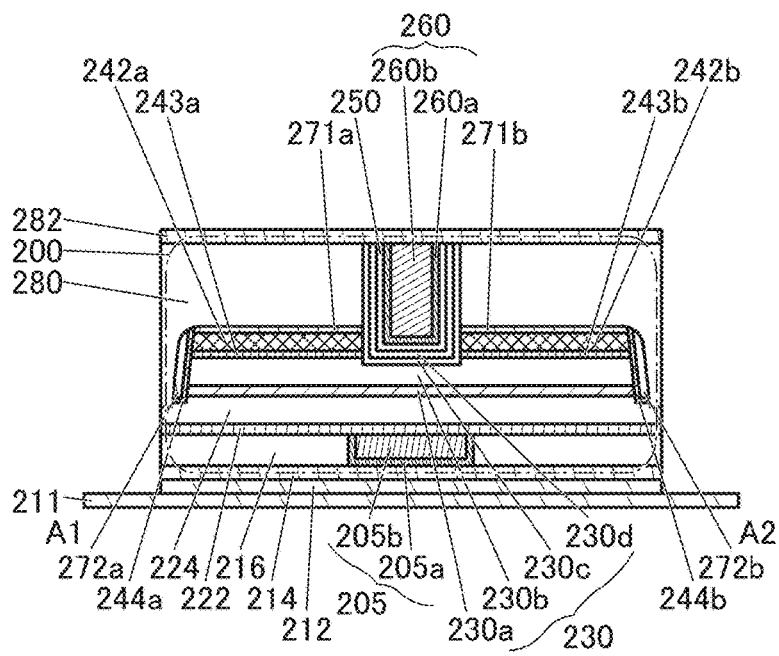
Figure 18D:
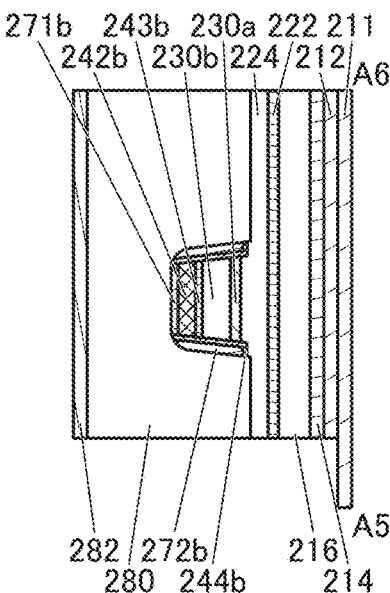

Next, the insulator 282 is formed over the oxide 230c, the oxide 230d, the insulator 250, the conductor 260, and the insulator 280 (see FIG. 17B to FIG. 17D). The insulator 282 can be deposited by a sputtering method, a CVD method, an MBE method, a PLD method, an ALD method, or the like. Aluminum oxide is preferably deposited for the insulator 282 by a sputtering method, for example. The insulator 282 is deposited by a sputtering method in an oxygen-containing atmosphere, whereby oxygen can be added to the insulator 280 during the deposition. At this time, the insulator 282 is preferably deposited while the substrate is being heated. It is preferable to form the insulator 282 in contact with the top surface of the conductor 260 because oxygen contained in the insulator 280 can be inhibited from being absorbed into the conductor 260 in later heat treatment.

Next, part of the insulator 282, part of the insulator 280, part of the insulator 224, part of the insulator 222, part of the insulator 216, part of the insulator 214, and part of the insulator 212 are processed, and an opening reaching the insulator 211 is formed (see FIG. 18A to FIG. 18D). The opening is formed to surround the transistor 200 in some cases. In other cases, the opening is formed to surround the plurality of transistors 200. Accordingly, part of the side surface of the insulator 282, part of the side surface of the insulator 280, part of the side surface of the insulator 224, part of the side surface of the insulator 222, part of the side surface of the insulator 216, part of the side surface of the insulator 214, and part of the side surface of the insulator 212 are exposed in the opening.

The part of the insulator 282, the part of the insulator 280, the part of the insulator 224, the part of the insulator 222, the part of the insulator 216, the part of the insulator 214, and the part of the insulator 212 can be processed by a dry etching method or a wet etching method. Processing by a dry etching method is suitable for microfabrication. The processing may be performed under different conditions.

Figure 19A:
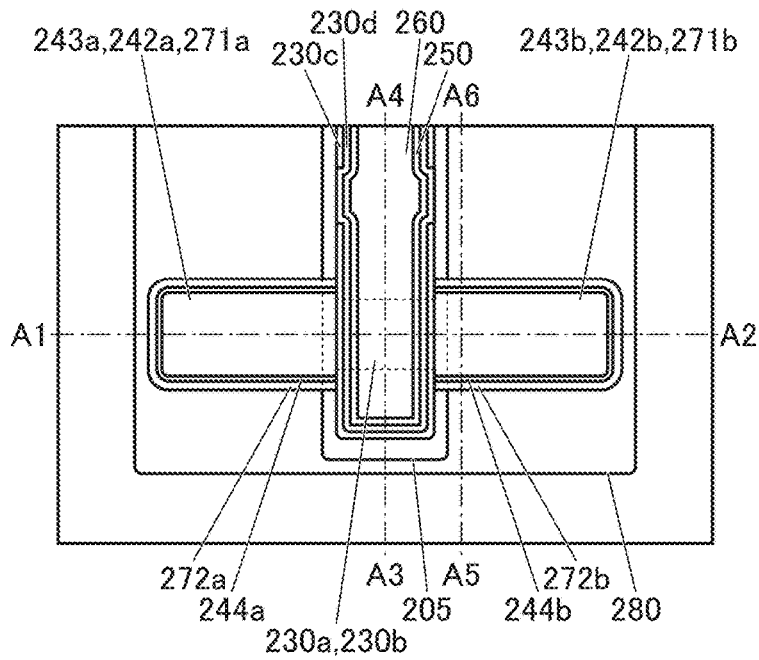
FIG. 19A is a top view illustrating a method for manufacturing a semiconductor device of one embodiment of the present invention.
Figure 19C:
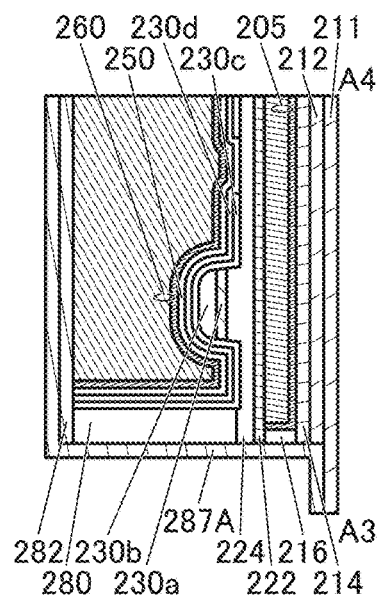
FIG. 19B to FIG. 19D are cross-sectional views illustrating a method for manufacturing a semiconductor device of one embodiment of the present invention.
Figure 19B:
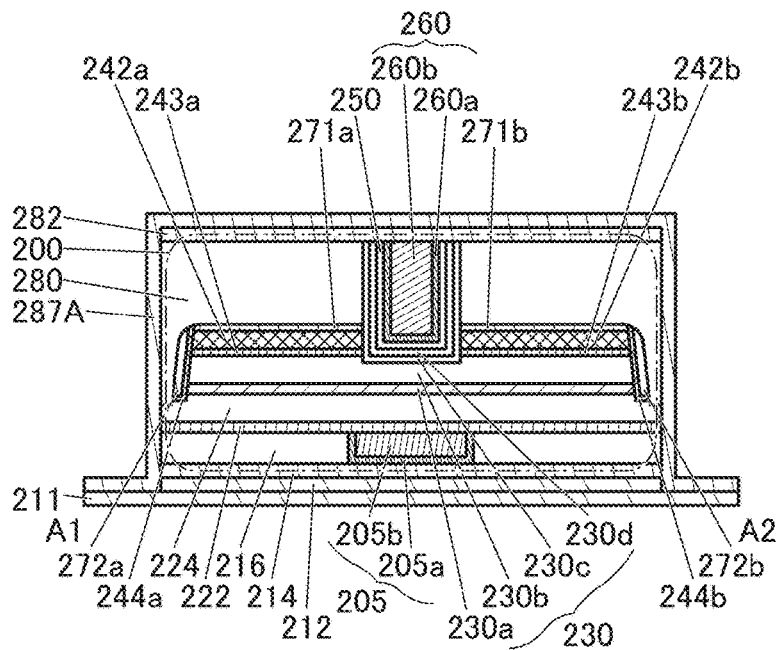
Figure 19D:
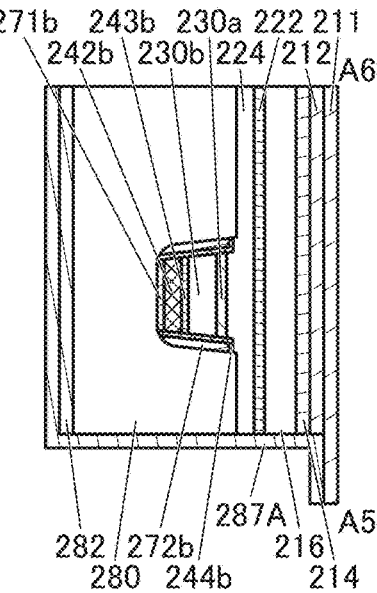

Next, an insulating film 287A is formed to cover the insulator 282, the insulator 280, the insulator 224, the insulator 222, the insulator 216, the insulator 214, and the insulator 212 (see FIG. 19B to FIG. 19D). The insulating film 287A is preferably formed under conditions similar to those for the insulator 282. For example, the insulating film 287A can be deposited by a sputtering method, a CVD method, an MBE method, a PLD method, an ALD method, or the like.

Specifically, as the insulating film 287A, an aluminum oxide film is preferably deposited by a sputtering method, for example. When the insulating film 287A is deposited in an atmosphere containing oxygen by a sputtering method, oxygen can be added to the insulator 280 during the deposition. At this time, the insulating film 287A is preferably deposited while the substrate is being heated. Since the insulator 282 is formed in contact with the top surface of the conductor 260, oxygen contained in the insulator 280 can be inhibited from being absorbed by the conductor 260 during the treatment for depositing the insulating film 287A.

Figure 20A:
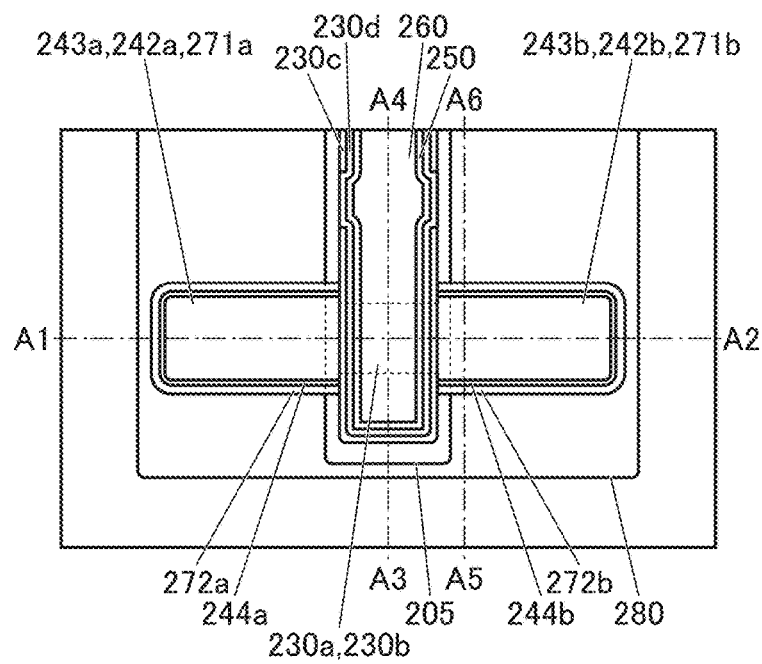
FIG. 20A is a top view illustrating a method for manufacturing a semiconductor device of one embodiment of the present invention.
Figure 20C:
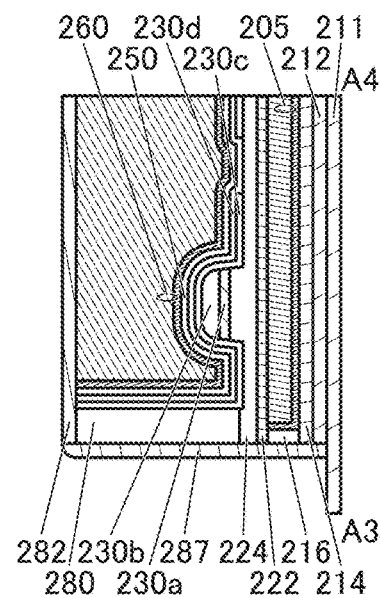
FIG. 20B to FIG. 20D are cross-sectional views illustrating a method for manufacturing a semiconductor device of one embodiment of the present invention.
Figure 20B:
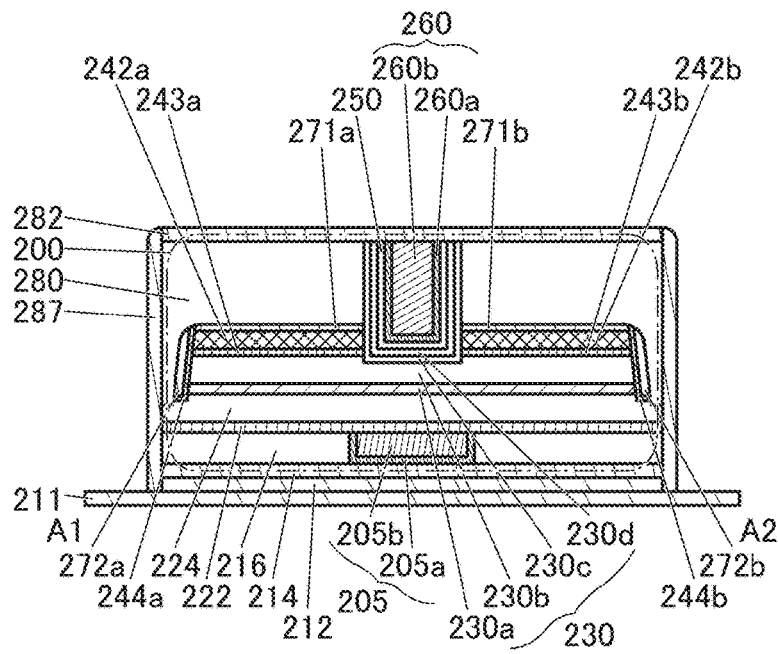
Figure 20D:
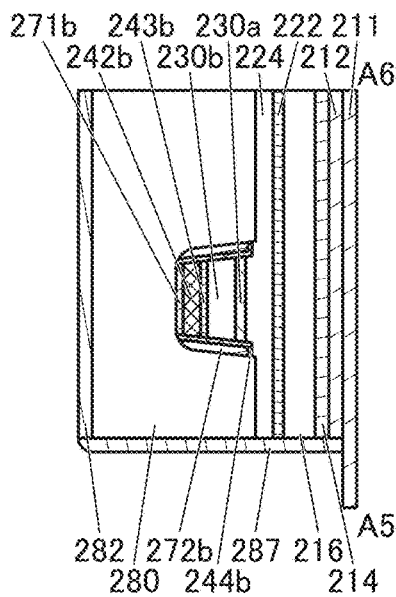

Subsequently, anisotropic etching treatment is performed on the insulating film 287A, whereby the insulator 287 is formed on the side surfaces of the insulator 282, the insulator 280, the insulator 224, the insulator 222, the insulator 216, the insulator 214, and the insulator 212 (see FIG. 20B to FIG. 20D).

Here, the side end portion of the insulator 282 and the upper end portion of the insulator 287 are in contact with each other, and the side end portion of the insulator 214 and the lower end portion of the insulator 287 are in contact with each other, whereby the structure for sealing the transistor 200 and the insulator 280 can be formed.

Dry etching treatment is preferably performed as the anisotropic etching treatment. In this manner, the insulating film deposited on a plane substantially parallel to the substrate surface can be removed, so that the insulator 287 can be formed in a self-aligned manner.

Figure 21A:
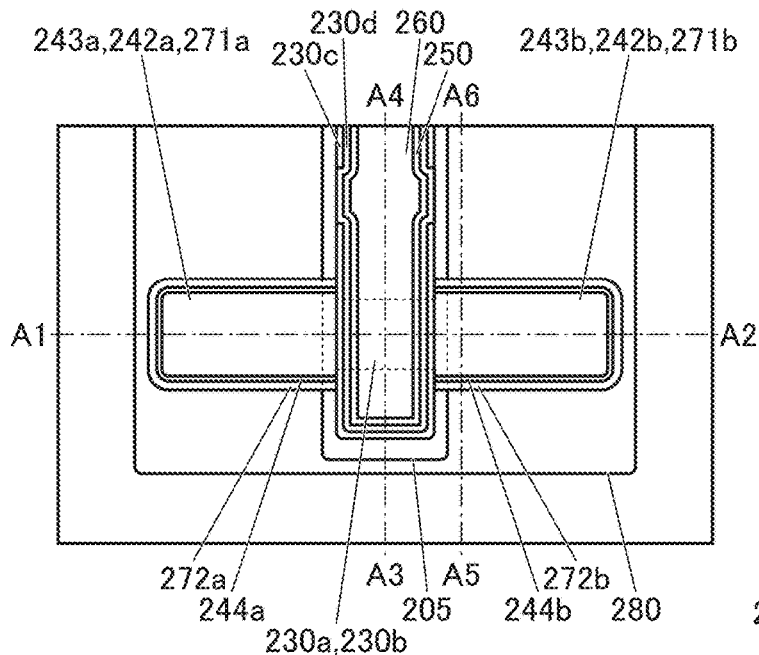
FIG. 21A is a top view illustrating a method for manufacturing a semiconductor device of one embodiment of the present invention.
Figure 21C:
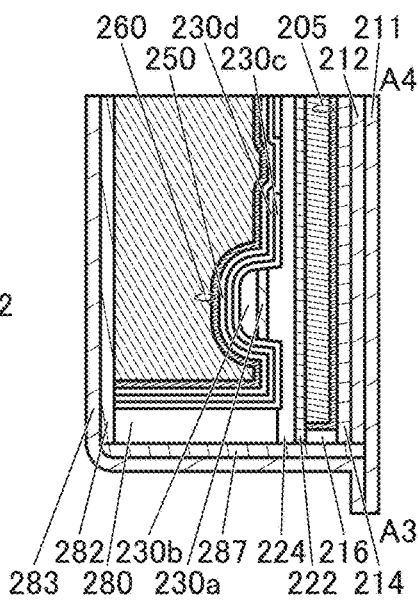
FIG. 21B to FIG. 21D are cross-sectional views illustrating a method for manufacturing a semiconductor device of one embodiment of the present invention.
Figure 21B:
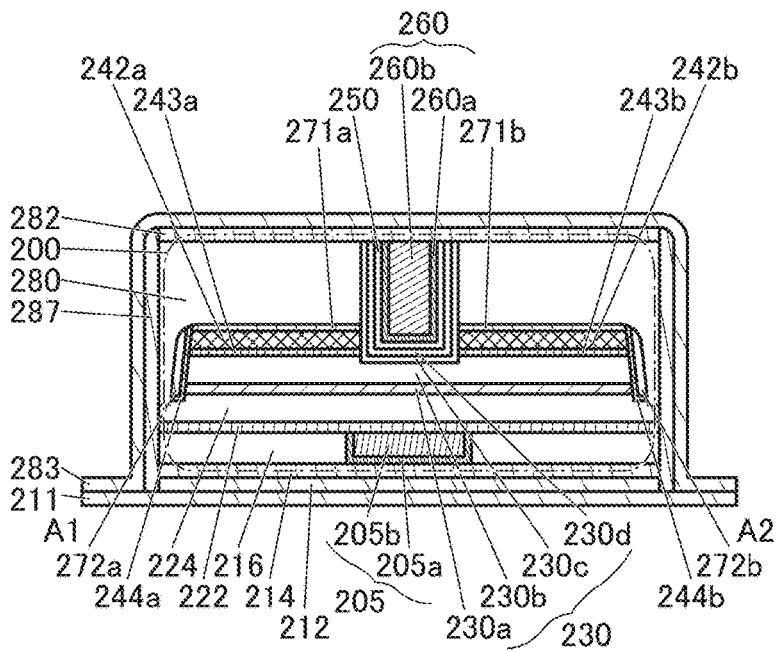
Figure 21D:
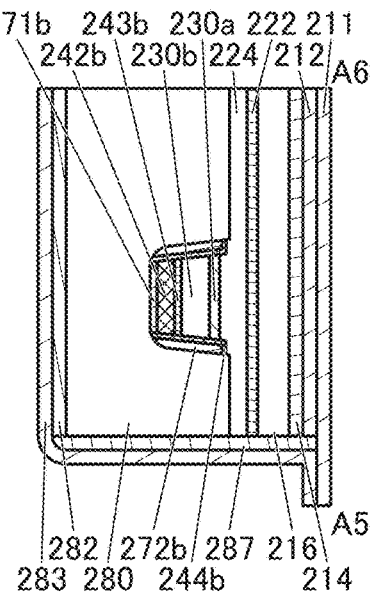

Next, the insulator 283 is formed to cover the insulator 282, the insulator 287, and the insulator 211 (see FIG. 21B to FIG. 21D). The insulator 283 can be deposited by a sputtering method, a CVD method, an MBE method, a PLD method, an ALD method, or the like. The insulator 283 may be a multilayer. For example, silicon nitride may be deposited by a sputtering method, and silicon nitride may be deposited over the silicon nitride by a CVD method. As illustrated in FIG. 21B to FIG. 21D, the insulator 283 is in contact with the insulator 211 at the bottom surface of the opening. That is, the top surface and the side surface of the transistor 200 are surrounded by the insulator 283 and the bottom surface of the transistor 200 is surrounded by the insulator 211. Surrounding the transistor 200 by the insulator 283 and the insulator 211 having high barrier properties can prevent entry of moisture and hydrogen from the outside.

Figure 22A:
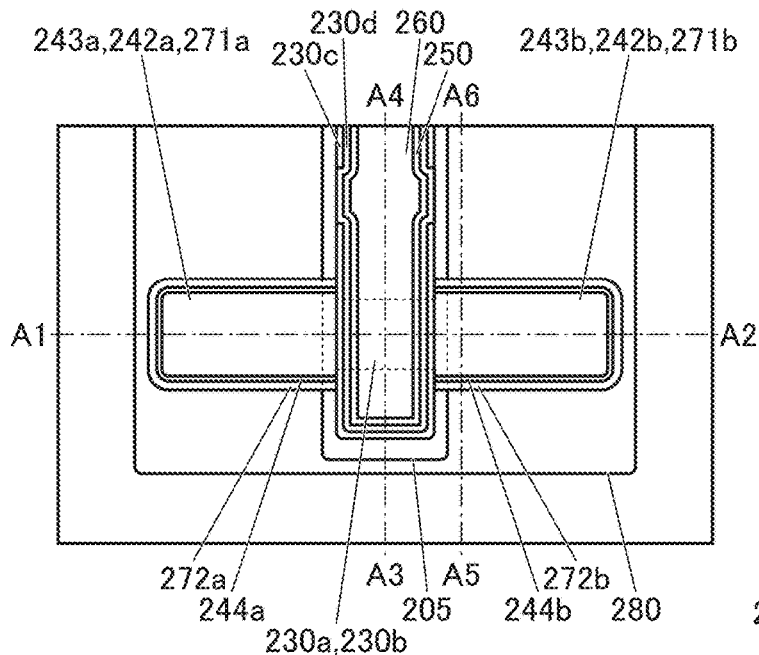
FIG. 22A is a top view illustrating a method for manufacturing a semiconductor device of one embodiment of the present invention.
Figure 22C:
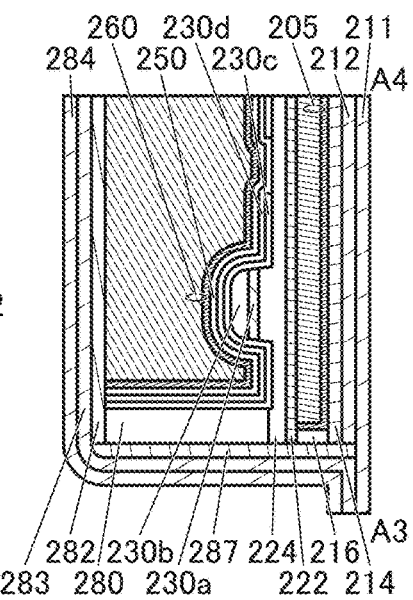
FIG. 22B to FIG. 22D are cross-sectional views illustrating a method for manufacturing a semiconductor device of one embodiment of the present invention.
Figure 22B:
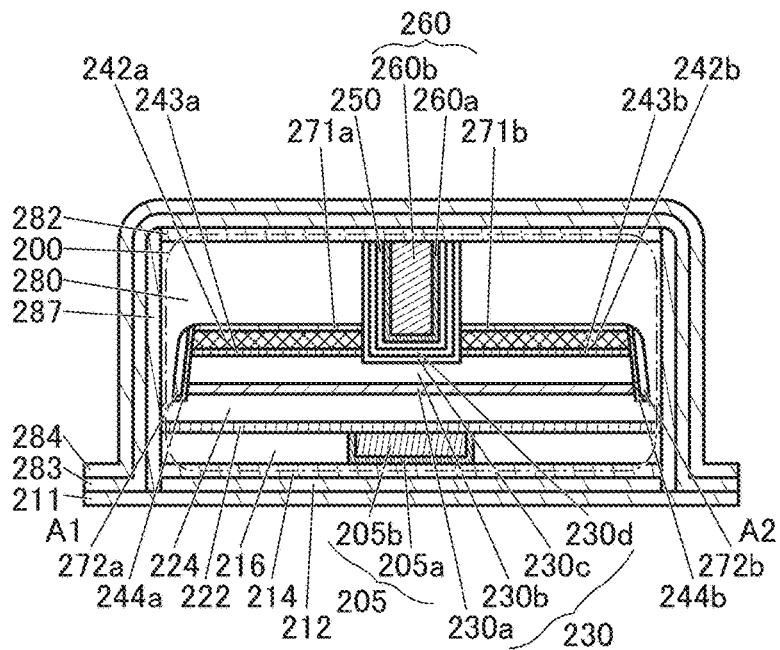
Figure 22D:
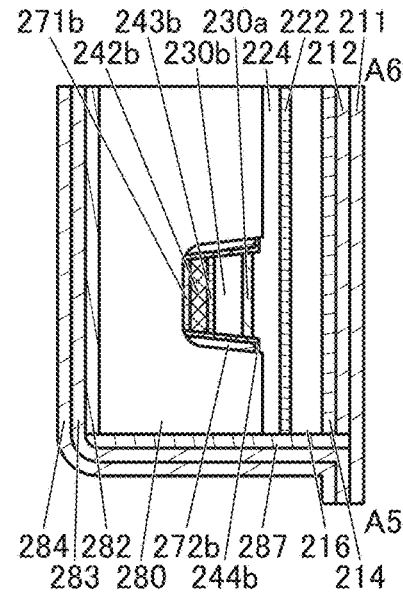

Next, the insulator 284 may be formed over the insulator 283 (see FIG. 22B to FIG. 22D). Note that the insulator 284 is preferably deposited by a deposition method that enables high coverage. For example, the insulator 284 can be deposited by a sputtering method, a CVD method, an MBE method, a PLD method, an ALD method, or the like. The insulator 284 is preferably deposited using the same material as those for the insulator 212 and the insulator 283.

Specifically, silicon nitride is preferably deposited by a CVD method. It is particularly preferable that the insulator 284 be deposited by a CVD method using a compound gas containing no hydrogen atom or having a low hydrogen atom content.

Then, an insulating film to be the insulator 274 is deposited over the insulator 284. The insulating film can be deposited by a sputtering method, a CVD method, an MBE method, a PLD method, an ALD method, or the like. For example, a silicon oxide film is preferably deposited by a CVD method. The insulating film is preferably deposited by a deposition method using the gas in which hydrogen atoms are reduced or removed. Thus, the hydrogen concentration of the insulating film can be reduced.

Figure 23A:
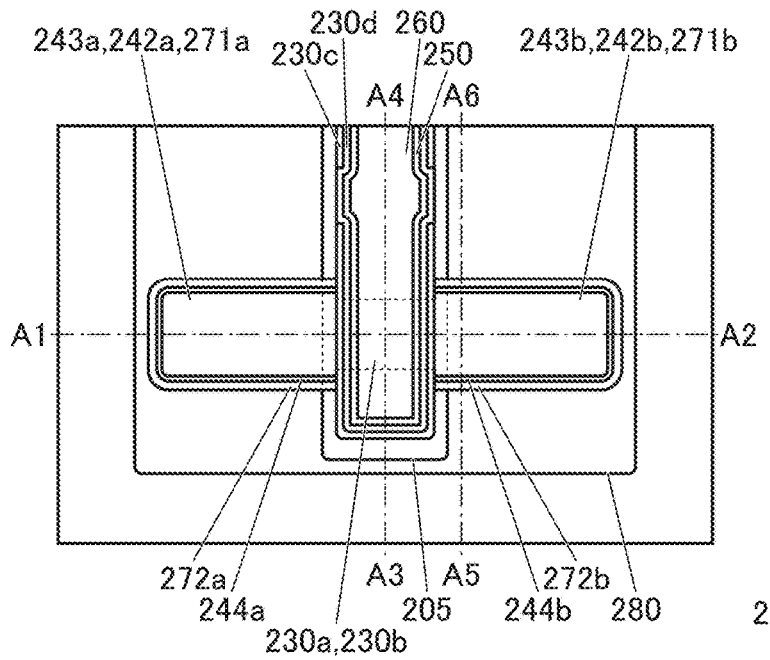
FIG. 23A is a top view illustrating a method for manufacturing a semiconductor device of one embodiment of the present invention.
Figure 23C:
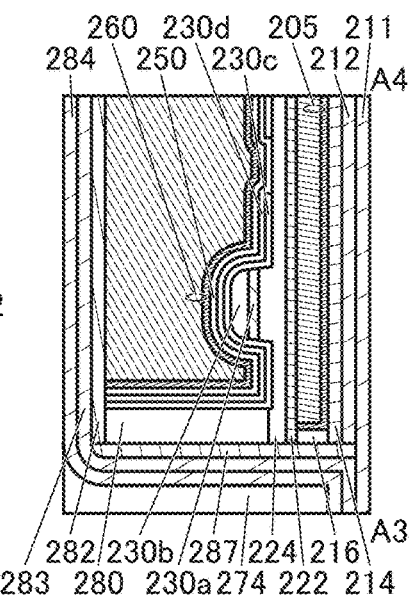
FIG. 23B to FIG. 23D are cross-sectional views illustrating a method for manufacturing a semiconductor device of one embodiment of the present invention.
Figure 23B:
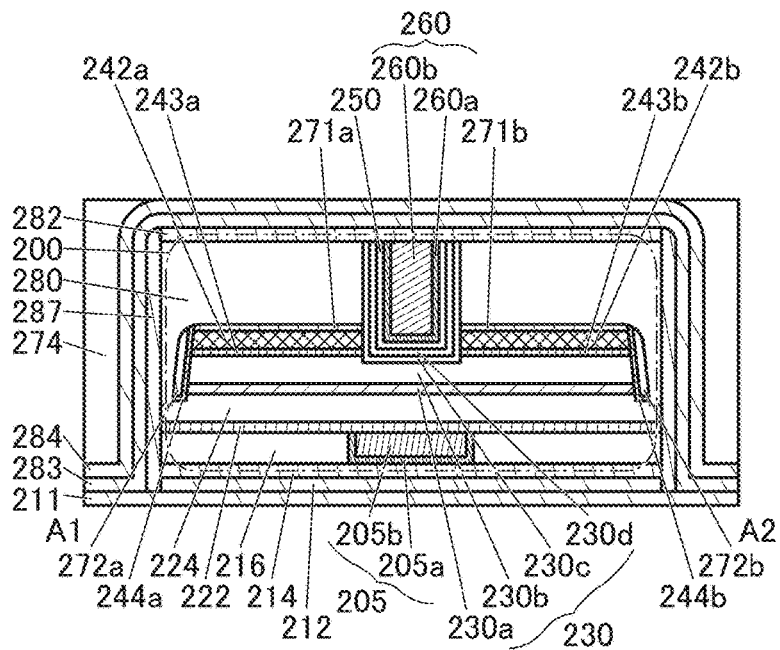
Figure 23D:
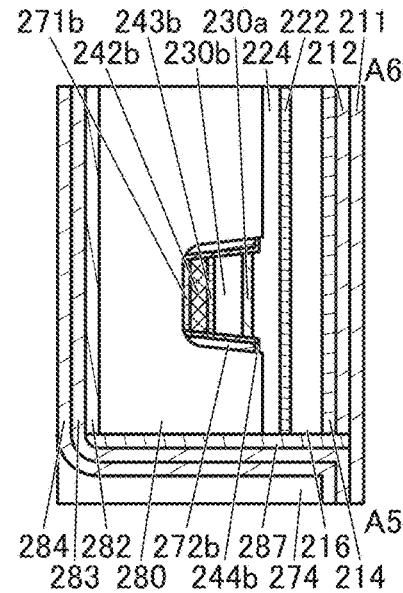

Next, the insulating film to be the insulator 274 is subjected to CMP treatment, whereby the insulator 274 having a flat top surface is formed (see FIG. 23B to FIG. 23D).

Next, heat treatment may be performed. In this embodiment, treatment is performed at 400° C. in a nitrogen atmosphere for one hour. Through the heat treatment, oxygen added at the time of depositing the insulator 282 can diffuse into the insulator 280 and then can be supplied to the oxide 230a and the oxide 230b through the oxide 230c. Note that the heat treatment is not necessarily performed after the formation of the insulator 274 and may be performed after the deposition of the insulator 282 or the deposition of the insulator 284, for example.

Figure 24A:
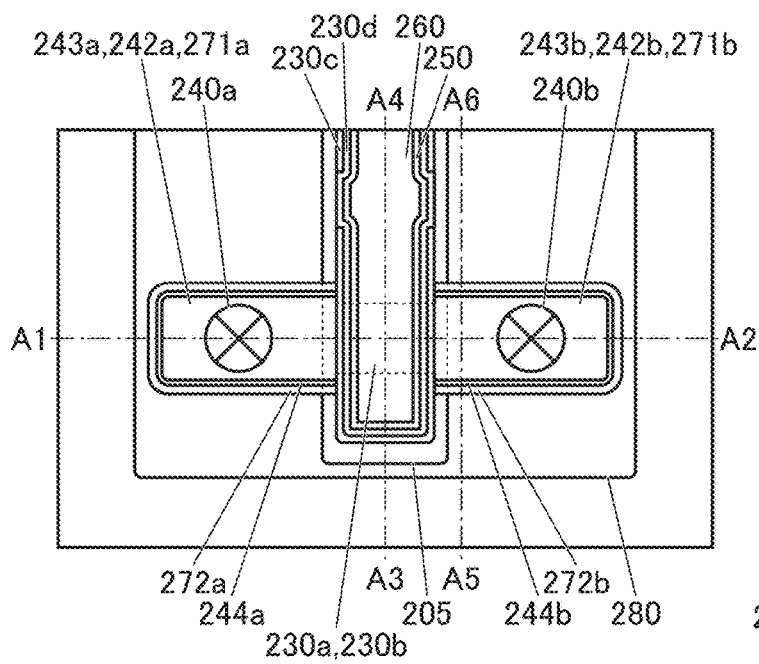
FIG. 24A is a top view illustrating a method for manufacturing a semiconductor device of one embodiment of the present invention.
Figure 24C:
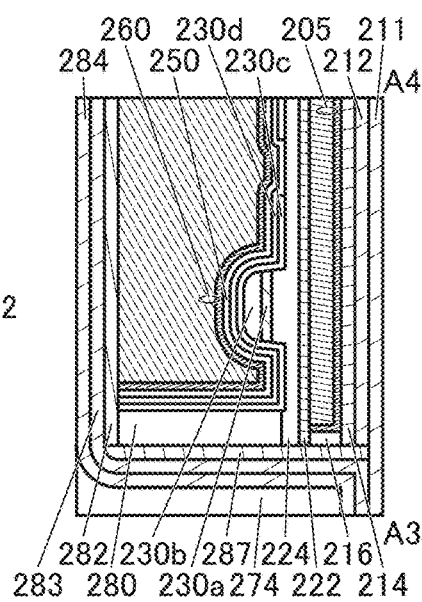
FIG. 24B to FIG. 24D are cross-sectional views illustrating a method for manufacturing a semiconductor device of one embodiment of the present invention.
Figure 24B:
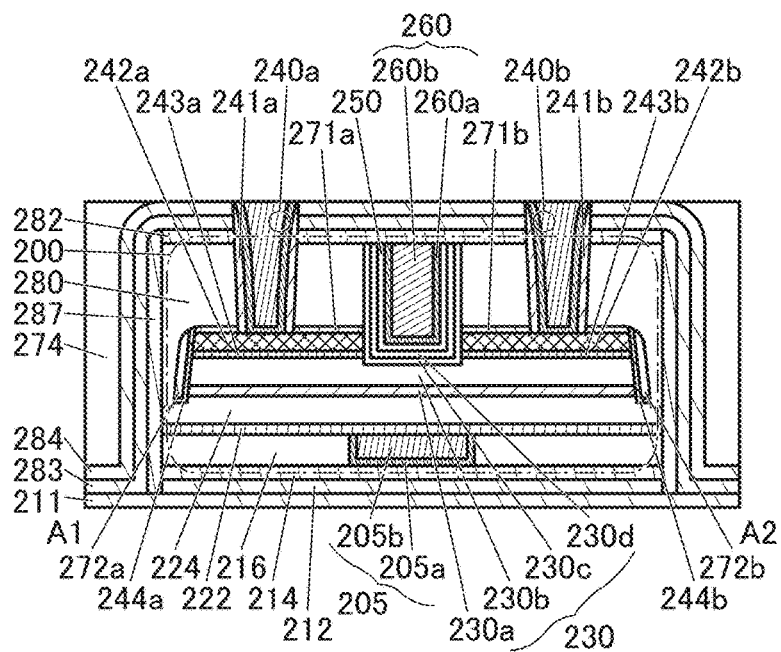
Figure 24D:
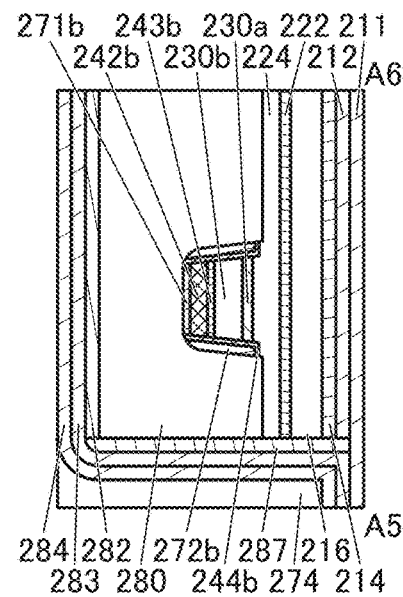
Figure 25A:
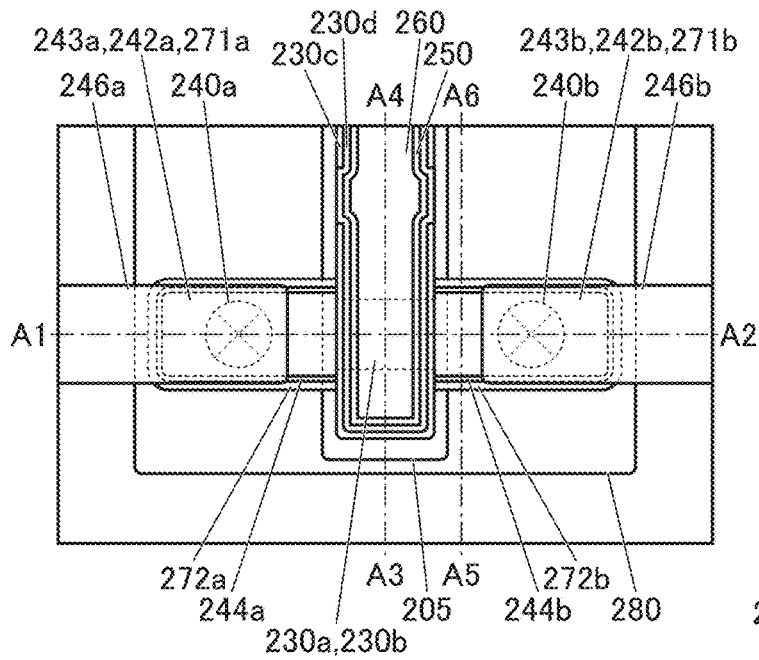
FIG. 25A is a top view illustrating a method for manufacturing a semiconductor device of one embodiment of the present invention.
Figure 25C:
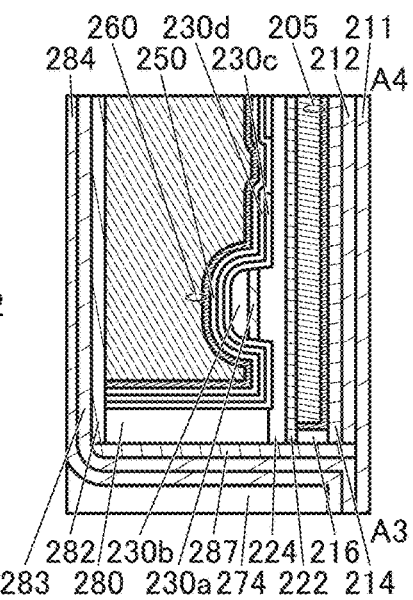
FIG. 25B to FIG. 25D are cross-sectional views illustrating a method for manufacturing a semiconductor device of one embodiment of the present invention.
Figure 25B:
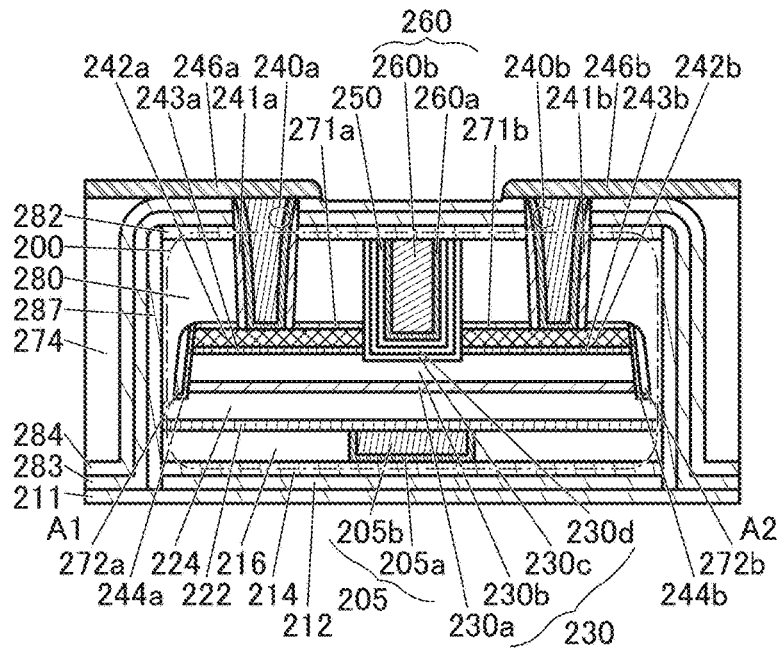
Figure 25D:
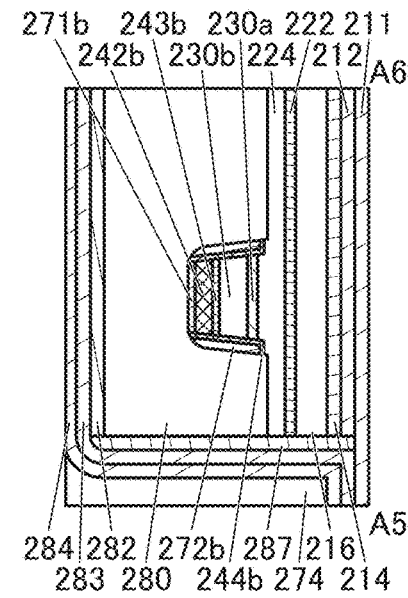

Subsequently, openings reaching the conductor 242a (the conductor 242b) are formed in the insulator 271a (the insulator 271b), the insulator 280, the insulator 282, the insulator 283, and the insulator 284 (see FIG. 24A and FIG. 24B). The openings are formed by a lithography method. Note that the openings in the top view in FIG. 24A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Subsequently, an insulating film to be the insulator 241a and the insulator 241b is deposited and the insulating film is subjected to anisotropic etching, so that the insulator 241a and the insulator 241b are formed (see FIG. 24A and FIG. 24B). The insulating film can be deposited by a sputtering method, a CVD method, an MBE method, a PLD method, an ALD method, or the like. As the insulating film, an insulating film having a function of inhibiting passage of oxygen is preferably used. For example, an aluminum oxide film is preferably deposited by an ALD method. Alternatively, a silicon nitride film is preferably deposited by a PEALD method. Silicon nitride is preferable because of its high blocking property against hydrogen.

For the anisotropic etching of the insulating film to be the insulator 241a and the insulator 241b, a dry etching method is employed, for example. Providing the insulator 241a and the insulator 241b on the side wall portions of the openings can inhibit passage of oxygen from the outside and can prevent oxidation of the conductor 240a and the conductor 240b to be formed next. Furthermore, impurities such as water and hydrogen can be prevented from diffusing from the conductor 240a and the conductor 240b to the outside.

Next, a conductive film to be the conductor 240a and the conductor 240b is deposited. The conductive film preferably has a stacked-layer structure including a conductor having a function of inhibiting passage of impurities such as water and hydrogen. For example, stacked layers of a film of tantalum nitride, titanium nitride, or the like and a film of tungsten, molybdenum, copper, or the like can be employed. The conductive film can be deposited by a sputtering method, a CVD method, an MBE method, a PLD method, an ALD method, or the like.

Then, part of the conductive film to be the conductor 240a and the conductor 240b is removed by CMP treatment to expose the top surfaces of the insulator 284 and the insulator 274. As a result, the conductive film remains only in the openings, so that the conductor 240a and the conductor 240b having flat top surfaces can be formed (see FIG. 24A and FIG. 24B). Note that the top surfaces of the insulator 284 and the insulator 274 are partly removed by the CMP treatment in some cases.

Next, a conductive film to be the conductor 246*a* and the conductor 246*b* is deposited. The conductive film can be deposited by a sputtering method, a CVD method, an MBE method, a PLD method, an ALD method, or the like.

Next, the conductive film to be the conductor 246*a* and the conductor 246*b* is processed by a lithography method to form the conductor 246*a* in contact with the top surface of the conductor 240*a* and the conductor 246*b* in contact with the top surface of the conductor 240*b*. At this time, the insulator 284 in a region not overlapping with the conductor 246*a* or the conductor 246*b* is sometimes partly removed (see FIG. 25A to FIG. 25D).

Next, the insulator 286 is deposited over the conductor 246*a*, the conductor 246*b*, and the insulator 284 (see FIG. 5A to FIG. 5D). The insulator 286 can be deposited by a sputtering method, a CVD method, an MBE method, a PLD method, an ALD method, or the like. The insulator 286 may be a multilayer. For example, silicon nitride may be deposited by a sputtering method, and silicon nitride may be deposited over the silicon nitride by a CVD method.

Through the above process, the semiconductor device including the transistor 200 illustrated in FIG. 5A to FIG. 5D can be manufactured. As illustrated in FIG. 6A to FIG. 25D, the transistor 200 can be manufactured by the method for manufacturing the semiconductor device described in this embodiment. Note that when the semiconductor device including the transistor 200 illustrated in FIG. 1A to FIG. 1D is manufactured, the steps illustrated in FIG. 18A to FIG. 18D, FIG. 19A to FIG. 19D, FIG. 20A to FIG. 20D, and FIG. 23A to FIG. 23D are omitted in the manufacture of the semiconductor device.

Modification Example 2 of Semiconductor Device

The semiconductor device illustrated in FIG. 26A to FIG. 26D is a modification example of the semiconductor device illustrated in FIG. 5A to FIG. 5D. The semiconductor device illustrated in FIG. 26A to FIG. 26D is different from the semiconductor device illustrated in FIG. 5A to FIG. 5D in that the insulator 271*a* and the insulator 271*b* are not included.

In the case where the insulator 271*a* (the insulator 271*b*) is not provided, a curved surface is sometimes included between the side surface of the conductor 242*a* (the conductor 242*b*) and the top surface of the conductor 242*a* (the conductor 242*b*). That is, an end portion of the side surface and an end portion of the top surface might be curved. The radius of curvature of the curved surface at end portions of the conductor 242*a* and the conductor 242*b* is greater than or equal to 3 nm and less than or equal to 10 nm, preferably greater than or equal to 5 nm and less than or equal to 6 nm, for example. When the end portions are not angular, coverage with films in later deposition steps is improved.

Next, a method for manufacturing the semiconductor device of one embodiment of the present invention, which is illustrated in FIG. 26A to FIG. 26D, will be described with reference to FIG. 27A to FIG. 30D.

FIG. 27A, FIG. 28A, FIG. 29A, and FIG. 30A are top views. FIG. 27B, FIG. 28B, FIG. 29B, and FIG. 30B are cross-sectional views corresponding to portions indicated by the dashed-dotted lines A1-A2 in FIG. 27A, FIG. 28A, FIG. 29A, and FIG. 30A, respectively, and are also cross-sectional views of the transistor 200 in the channel length direction. FIG. 27C, FIG. 28C, FIG. 29C, and FIG. 30C are cross-sectional views corresponding to portions indicated by the dashed-dotted lines A3-A4 in FIG. 27A, FIG. 28A, FIG. 29A, and FIG. 30A, respectively, and are also cross-sectional views of the transistor 200 in the channel width direction. FIG. 27D, FIG. 28D, FIG. 29D, and FIG. 30D are cross-sectional views corresponding to portions indicated by the dashed-dotted lines A5-A6 in FIG. 27A, FIG. 28A, FIG. 29A, and FIG. 30A, respectively. Note that for simplification of the drawings, some components are not illustrated in the top views of FIG. 27A, FIG. 28A, FIG. 29A, and FIG. 30A. Note that the description of portions that are similar to those in <Method for manufacturing semiconductor device> is omitted.

First, a substrate (not illustrated) is prepared; the insulator 211, the insulator 212, and the insulator 214 are formed in this order over the substrate; the conductor 205 and the insulator 216 are formed over the insulator 214; the insulator 222 is formed over the conductor 205 and the insulator 216; the insulator 224 is formed over the insulator 222; the oxide film 230A and the oxide film 230B are formed in this order over the insulator 224; the oxide film 243A is formed over the oxide film 230B; and the conductive film 242A is formed over the oxide film 243A (see FIG. 27A to FIG. 27D).

Note that the steps up to the formation of the conductive film 242A in the semiconductor device illustrated in FIG. 26A to FIG. 26D are similar to the steps in <Method for manufacturing semiconductor device>; thus, the detailed description of the steps up to the formation of the conductive film 242A is omitted.

Next, the oxide film 230A, the oxide film 230B, the oxide film 243A, and the conductive film 242A are processed into island shapes by a lithography method, so that the oxide 230*a*, the oxide 230*b*, the oxide layer 243B, and the conductive layer 242B are formed (see FIG. 28A to FIG. 28D). A dry etching method or a wet etching method can be used for the processing. Processing by a dry etching method is suitable for microfabrication. The oxide film 230A, the oxide film 230B, the oxide film 243A, and the conductive film 242A may be processed under different conditions. Note that in this step, the thickness of the insulator 224 in a region not overlapping with the oxide 230*a* is reduced in some cases.

Here, the oxide 230*a*, the oxide 230*b*, the oxide layer 243B, and the conductive layer 242B are formed to at least partly overlap with the conductor 205. It is preferable that the side surfaces of the oxide 230*a*, the oxide 230*b*, the oxide layer 243B, and the conductive layer 242B be substantially perpendicular to the top surface of the insulator 222. When the side surfaces of the oxide 230*a*, the oxide 230*b*, the oxide layer 243B, and the conductive layer 242B are substantially perpendicular to the top surface of the insulator 222, a plurality of transistors 200 can be provided in a smaller area and at a higher density. Alternatively, a structure may be employed in which an angle formed by the side surfaces of the oxide 230*a*, the oxide 230*b*, the oxide layer 243B, and the conductive layer 242B and the top surface of the insulator 222 is a small angle. With such a shape, in later steps, the coverage with the insulating film 272A and the like can be improved, so that defects such as a void can be reduced.

In the above processing, the layer 244A is formed over the insulator 224, the oxide 230*a*, the oxide 230*b*, the oxide layer 243B, and the conductive layer 242B (see FIG. 28B to FIG. 28D).

There is a curved surface between the side surface of the conductive layer 242B and the top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, the coverage with films in later deposition steps is improved.

Next, the insulating film 272A is deposited over the layer 244A (see FIG. 29B to FIG. 29D). The insulating film 272A can be deposited by a sputtering method, a CVD method, an MBE method, a PLD method, an ALD method, or the like. In this embodiment, as the insulating film 272A, an aluminum oxide film is deposited by a sputtering method.

Next, anisotropic etching is performed on the insulating film 272A and the layer 244A to remove the insulating film 272A and the layer 244A over the conductive layer 242B and the insulating film 272A and the layer 244A over the insulator 224. Accordingly, the insulating layer 272B and the layer 244B are formed. The layer 244B is preferably formed in contact with at least the side surface of the oxide 230a, the side surface of the oxide 230b, the side surface of the oxide layer 243B, and the side surface of the conductive layer 242B. The insulating layer 272B is preferably formed in contact with the layer 244B (see FIG. 30A to FIG. 30D).

Note that the steps after the anisotropic etching in the semiconductor device illustrated in FIG. 26A to FIG. 26D are similar to the steps in <Method for manufacturing semiconductor device>; thus, the detailed description of the steps after the anisotropic etching is omitted. Through the above process, the semiconductor device including the transistor 200 illustrated in FIG. 26A to FIG. 26D can be manufactured.

Application Example of Semiconductor Device

An example of a semiconductor device including the transistor 200 of one embodiment of the present invention which is different from the semiconductor device described above in <Structure example of semiconductor device> and <Modification example of semiconductor device> will be described below with reference to FIG. 31A and FIG. 31B. Note that in the semiconductor device illustrated in FIG. 31A and FIG. 31B, components having the same functions as the components in the semiconductor device described in <<Modification example 1 of semiconductor device>> (see FIG. 5A to FIG. 5D) are denoted by the same reference numerals. Note that in this section, the materials described in detail in <Structure example of semiconductor device> and <Modification example of semiconductor device> can be used as the materials for the transistor 200.

FIG. 31A and FIG. 31B each illustrate a structure in which a plurality of transistors (a transistor 200_1 to a transistor 200_n) are collectively sealed by the insulator 283 and the insulator 211. Note that although the transistor 200_1 to the transistor 200_n appear to be arranged in the channel length direction in FIG. 31A and FIG. 31B, the present invention is not limited to this structure. The transistor 200_1 to the transistor 200_n may be arranged in the channel width direction or in a matrix. Depending on the design, the transistors may be arranged without regularity.

As illustrated in FIG. 31A, a portion where the insulator 283 is in contact with the insulator 211 (hereinafter, sometimes referred to as a sealing portion 265) is formed outside the plurality of transistors (the transistor 200_1 to the transistor 200_n). The sealing portion 265 is formed to surround the plurality of transistors (also referred to as a transistor group). With such a structure, the transistor group can be surrounded by the insulator 283 and the insulator 211. Thus, a plurality of transistor groups surrounded by the sealing portion 265 are provided over a substrate.

A dicing line (sometimes referred to as a scribe line, a dividing line, or a cutting line) may be provided to overlap with the sealing portion 265. The above substrate is divided at the dicing line, so that the transistor groups surrounded by the sealing portion 265 are taken out as one chip.

Although FIG. 31A illustrates an example in which the plurality of transistors (the transistor 200_1 to the transistor 200_n) are surrounded by one sealing portion 265, the present invention is not limited thereto. As illustrated in FIG. 31B, the plurality of transistors (the transistor 200_1 to the transistor 200_n) may be surrounded by a plurality of sealing portions. In FIG. 31B, the transistor 200_1 to the transistor 200_n are surrounded by a sealing portion 265a and are further surrounded by an outer sealing portion 265b.

When the plurality of transistors are surrounded by a plurality of sealing portions in this manner, the area of a portion where the insulator 283 is in contact with the insulator 211 increases, which can further improve adhesion between the insulator 283 and the insulator 211. Accordingly, the plurality of transistors can be more reliably sealed.

In that case, a dicing line may be provided to overlap with the sealing portion 265a or the sealing portion 265b, or a dicing line may be provided between the sealing portion 265a and the sealing portion 265b.

According to one embodiment of the present invention, a semiconductor device with a small variation in transistor characteristics can be provided. According to another embodiment of the present invention, a semiconductor device having high reliability can be provided. According to another embodiment of the present invention, a semiconductor device having favorable electrical characteristics can be provided. According to another embodiment of the present invention, a semiconductor device having a high on-state current can be provided. According to another embodiment of the present invention, a semiconductor device that can be miniaturized or highly integrated can be provided. According to another embodiment of the present invention, a semiconductor device with low power consumption can be provided.

The structure, method, and the like described above in this embodiment can be used in an appropriate combination with structures, methods, and the like described in the other embodiments.

Embodiment 2

In this embodiment, one embodiment of a semiconductor device will be described with reference to FIG. 32 to FIG. 37.

[Memory Device 1]

Figure 32:
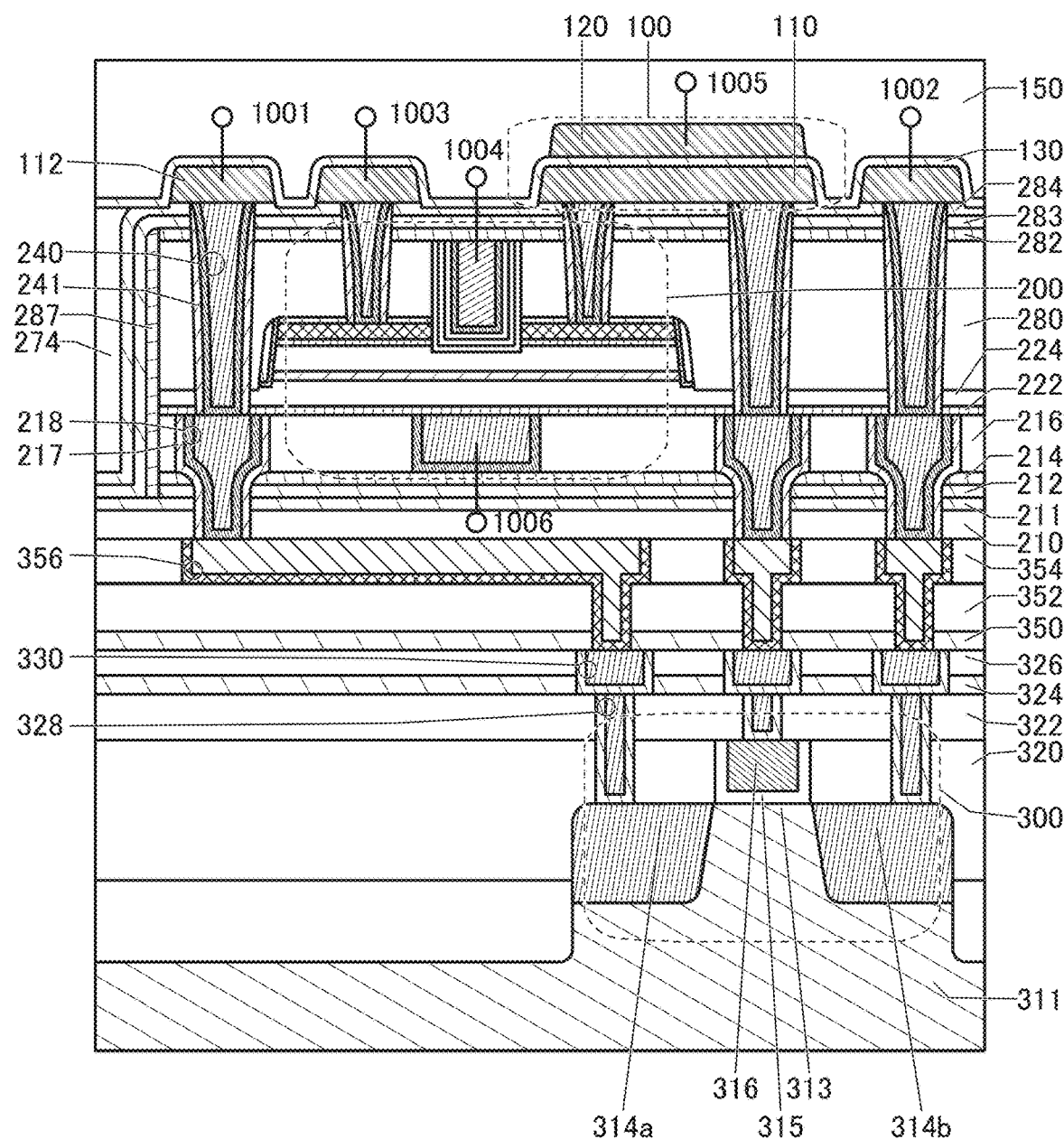
FIG. 32 is a cross-sectional view illustrating a structure of a memory device of one embodiment of the present invention.

FIG. 32 illustrates an example of a semiconductor device (memory device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor whose channel is formed in a semiconductor layer including an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 32, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to the first gate of the transistor 200. A wiring 1006 is electrically connected to the second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 32 can form a memory cell array when arranged in a matrix.

<Transistor 300>

The transistor 300 is provided over a substrate 311 and includes a conductor 316 functioning as a gate, an insulator 315 functioning as a gate insulator, a semiconductor region 313 that is a part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 32, the semiconductor region 313 (part of the substrate 311) in which the channel is formed has a convex shape. Furthermore, the conductor 316 is provided to cover the top surface and the side surface of the semiconductor region 313 with the insulator 315 therebetween. Note that the conductor 316 may be formed using a material adjusting the work function. Such a transistor 300 is also referred to as a FIN-type transistor because the convex portion of the semiconductor substrate is utilized. An insulator functioning as a mask for forming the convex portion may be provided in contact with an upper portion of the convex portion. Although the case where the convex portion is formed by processing part of the semiconductor substrate is described here, a semiconductor film having a convex shape may be formed by processing an SOI substrate.

Note that the transistor 300 illustrated in FIG. 32 is an example and the structure is not limited thereto; an appropriate transistor can be used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, as the insulator 130, the insulator that can be used as the insulator 286 described in the above embodiment is preferably used.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 32, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be formed to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the insulator 130 preferably has a stacked-layer structure using a material with high dielectric strength such as silicon oxynitride and a high dielectric constant (high-k) material. In the capacitor 100 having such a structure, a sufficient capacitance can be ensured owing to the high dielectric constant (high-k) material, and the dielectric strength can be increased owing to the material with high dielectric strength, so that the electrostatic breakdown of the capacitor 100 can be inhibited.

Examples of the high dielectric constant (high-k) material (material having a high relative dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the material having high dielectric strength (material having a low relative dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 32, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 211, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241a and the insulator 241b described in the above embodiment, an insulator 217 is provided in contact with the side surface of the conductor 218 functioning as a plug. The insulator 217 is provided in contact with the inner wall of the opening formed in the insulator 210, the insulator 211, the insulator 212, the insulator 214, and the insulator 216. That is, the insulator 217 is provided between the conductor 218 and the insulator 210, the insulator 211, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, for example, an insulator such as silicon nitride, aluminum oxide, or silicon nitride oxide can be used. The insulator 217 is provided in contact with the insulator 211, the insulator 212, the insulator 214, and the insulator 222; thus, impurities such as water and hydrogen can be inhibited from entering the oxide 230 from the insulator 210, the insulator 216, or the like through the conductor 218. In particular, silicon nitride is suitable because of its high blocking property against hydrogen. Furthermore, oxygen contained in the insulator 210 or the insulator 216 can be prevented from being absorbed by the conductor 218.

The insulator 217 can be formed in a manner similar to that of the insulator 241a and the insulator 241b. For example, silicon nitride is deposited by a PEALD method and an opening reaching the conductor 356 is formed by anisotropic etching.

Examples of an insulator that can be used as an interlayer film include an oxide, a nitride, an oxynitride, a nitride oxide, a metal oxide, a metal oxynitride, and a metal nitride oxide, each of which has an insulating property.

For example, when a material having a low relative dielectric constant is used for the insulator functioning as an interlayer film, the parasitic capacitance between wirings can be reduced. Accordingly, a material is preferably selected in accordance with the function of an insulator.

For example, the insulator 150, the insulator 210, the insulator 352, the insulator 354, and the like preferably include an insulator having a low relative dielectric constant. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low relative dielectric constant. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen is used as the insulator 214, the insulator 211, the insulator 212, the insulator 350, and the like.

The insulator having a function of inhibiting passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used as wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electrical conductivity, typified by polycrystalline silicon containing an impurity element such as phosphorus, or silicide such as nickel silicide may be used.

For example, the conductor 328, the conductor 330, the conductor 356, the conductor 218, the conductor 112, and the like may have a single-layer structure or a stacked-layer structure using a conductive material such as a metal material, an alloy material, a metal nitride material, or a metal oxide material which is formed using the above materials. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 32, the insulator 241 is preferably provided between the conductor 240 and the insulator 224 and the insulator 280 that contain excess oxygen. Since the insulator 241 is provided in contact with the insulator 222, the insulator 282, the insulator 283, and the insulator 284, the insulator 224 and the transistor 200 can be sealed by the insulators having a barrier property.

That is, the insulator 241 can inhibit excess oxygen contained in the insulator 224 and the insulator 280 from being absorbed by the conductor 240. In addition, the insulator 241 can inhibit diffusion of hydrogen, which is an impurity, into the transistor 200 through the conductor 240.

Note that the insulator 241 is preferably formed using an insulating material having a function of inhibiting diffusion of oxygen and impurities such as water and hydrogen. For example, silicon nitride, silicon nitride oxide, aluminum oxide, hafnium oxide, or the like is preferably used. Silicon nitride is particularly preferable because of its high blocking property against hydrogen. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulator 211, the insulator 212, the insulator 214, the insulator 287, the insulator 282, the insulator 283, and the insulator 284. Such a structure can inhibit entry of hydrogen contained in the insulator 274, the insulator 150, or the like into the insulator 280 or the like.

Note that the conductor 240 penetrates the insulator 284, the insulator 283, and the insulator 282, and the conductor 218 penetrates the insulator 214, the insulator 212, and the insulator 211; however, as described above, the insulator 241 is provided in contact with the conductor 240, and the insulator 217 is provided in contact with the conductor 218. This can reduce the amount of hydrogen entering the inside of the insulator 211, the insulator 212, the insulator 214, the insulator 287, the insulator 282, the insulator 283, and the insulator 284 through the conductor 240 and the conductor 218. In this manner, the transistor 200 is sealed more surely with the insulator 211, the insulator 212, the insulator 214, the insulator 287, the insulator 282, the insulator 283, the insulator 284, the insulator 241, and the insulator 217, so that impurities such as hydrogen contained in the insulator 274 or the like can be inhibited from entering from the outside.

As described in the above embodiment, the insulator 216, the insulator 224, the insulator 280, the insulator 250, and the insulator 274 are preferably formed by a deposition method using the gas in which hydrogen atoms are reduced or removed. This can reduce the hydrogen concentration of the insulator 216, the insulator 224, the insulator 280, the insulator 250, and the insulator 274.

In this manner, the hydrogen concentration of silicon-based insulating films near the transistor 200 can be reduced; thus, the hydrogen concentration of the oxide 230 can be reduced.

<Dicing Line>

A dicing line (sometimes referred to as a scribe line, a dividing line, or a cutting line) that is provided when a large-sized substrate is divided into semiconductor elements so that a plurality of semiconductor devices are each formed in a chip form is described below. Examples of a dividing method include the case where a groove (a dicing line) for separating the semiconductor elements is formed on the substrate, and then the substrate is cut along the dicing line to divide (split) it into a plurality of semiconductor devices.

Here, for example, as illustrated in FIG. 32, a region where the insulator 283 is in contact with the insulator 211 preferably overlaps with the dicing line. That is, an opening is formed in the insulator 282, the insulator 280, the insulator 224, the insulator 222, the insulator 216, the insulator 214, and the insulator 212 in the vicinity of a region to be the dicing line that is provided on the outer edge of a memory cell including the plurality of transistors 200.

That is, in the opening formed in the insulator 282, the insulator 280, the insulator 224, the insulator 222, the insulator 216, the insulator 214, and the insulator 212, the insulator 211 is in contact with the insulator 283. Alternatively, an opening may be formed in the insulator 282, the insulator 280, the insulator 224, the insulator 222, the insulator 216, and the insulator 214, and the insulator 212 and the insulator 283 may be in contact with each other. In that case, for example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistor 200 can be surrounded by the insulator 211, the insulator 212, the insulator 214, the insulator 287, the insulator 282, the insulator 283, and the insulator 284. At least one of the insulator 211, the insulator 212, the insulator 214, the insulator 287, the insulator 282, the insulator 283, and the insulator 284 has a function of inhibiting diffusion of oxygen, hydrogen, and water; thus, even when the substrate is divided into circuit regions each of which is provided with the semiconductor elements in this embodiment to form a plurality of chips, entry and diffusion of impurities such as hydrogen and water from the direction of a side surface of the divided substrate to the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 33:
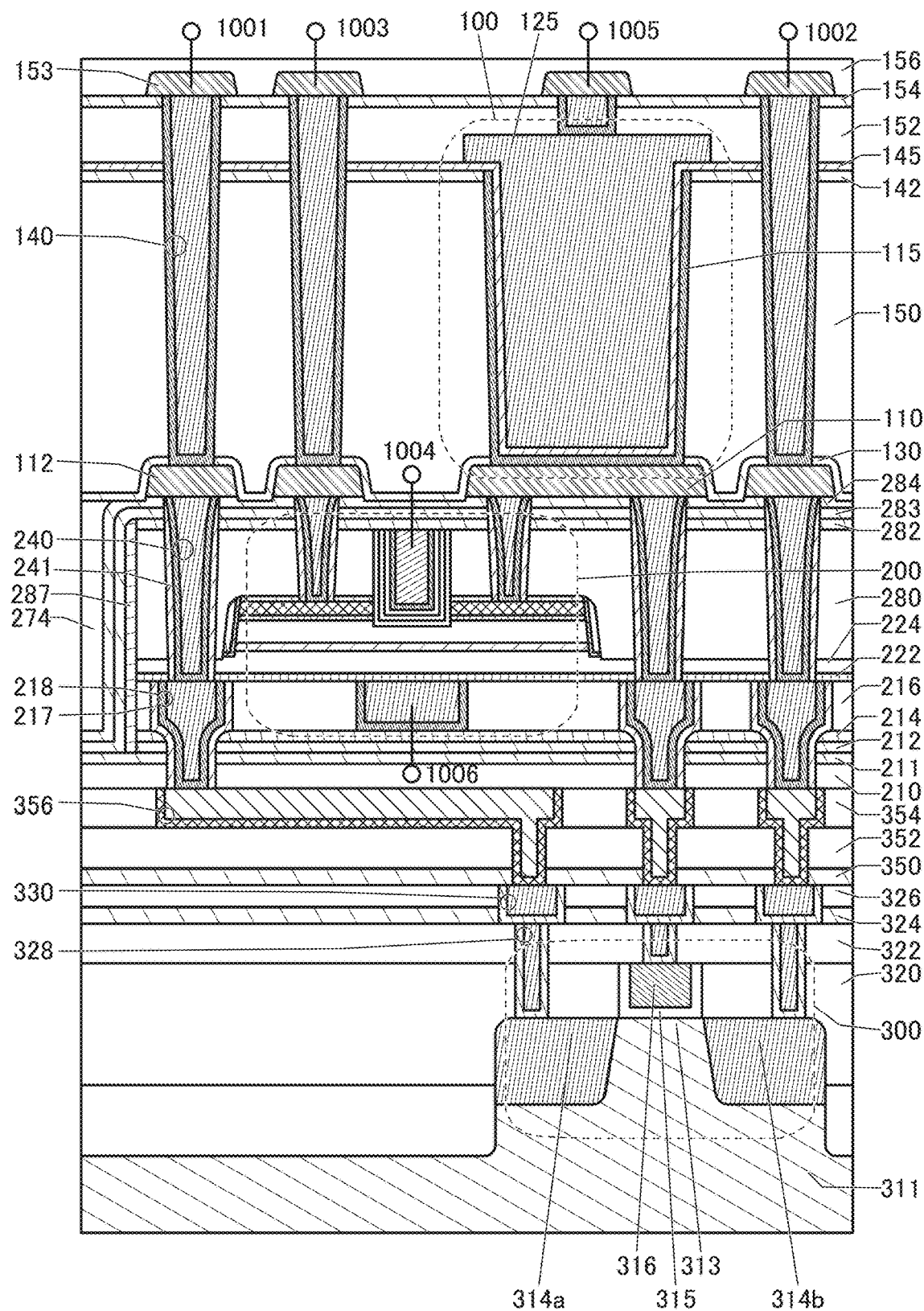
FIG. 33 is a cross-sectional view illustrating a structure of a memory device of one embodiment of the present invention.

Note that although the capacitor 100 of the memory device illustrated in FIG. 32 has a planar shape, the capacitor 100 of the memory device described in this embodiment is not limited thereto. For example, the capacitor 100 may be a cylindrical capacitor as illustrated in FIG. 33. Note that the structure below and including the insulator 150 of a memory device illustrated in FIG. 33 is similar to that of the semiconductor device illustrated in FIG. 32.

The capacitor 100 illustrated in FIG. 33 includes the insulator 150 over the insulator 130, an insulator 142 over the insulator 150, a conductor 115 in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are provided in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The upper electrode and the lower electrode of the capacitor 100 face each other with the dielectric therebetween, along the side surface as well as the bottom surface of the opening in the insulator 150 and the insulator 142; thus, the capacitance per unit area can be increased. Accordingly, the deeper the opening is, the larger the capacitance of the capacitor 100 can be. Increasing the capacitance per unit area of the capacitor 100 in this manner enhances miniaturization and integration of the semiconductor device.

An insulator that can be used as the insulator 280 is used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably larger in the top view. Such a structure can reduce the area occupied by the semiconductor device including the capacitor 100 and the transistor 200.

The conductor 115 is provided in contact with the opening formed in the insulator 142 and the insulator 150. It is preferable that a top surface of the conductor 115 be substantially level with a top surface of the insulator 142. Furthermore, a bottom surface of the conductor 115 is in contact with the conductor 110 in an opening in the insulator 130. The conductor 115 is preferably deposited by an ALD method, a CVD method, or the like, and a conductor that can be used as the conductor 205 is used, for example.

The insulator 145 is positioned to cover the conductor 115 and the insulator 142. The insulator 145 is preferably deposited by an ALD method or a CVD method, for example. The insulator 145 can be provided to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, hafnium nitride, or the like. As the insulator 145, an insulating film in which zirconium oxide, aluminum oxide, and zirconium oxide are stacked in this order can be used, for instance.

The insulator 145 is preferably formed using a material with high dielectric strength, such as silicon oxynitride, or a high dielectric constant (high-k) material. Alternatively, a stacked-layer structure using a material with high dielectric strength and a high dielectric constant (high-k) material may be employed.

Examples of a high dielectric constant (high-k) material (material having a high relative dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material enables sufficient capacitance of the capacitor 100 to be ensured even when the insulator 145 has a large thickness. The insulator 145 having a large thickness can inhibit leakage current generated between the conductor 115 and the conductor 125.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator having high dielectric strength can increase the dielectric strength and inhibit electrostatic breakdown of the capacitor 100.

The conductor 125 is provided to fill the opening formed in the insulator 142 and the insulator 150. The conductor 125 is electrically connected to the wiring 1005 through a conductor 140 and a conductor 153. The conductor 125 is preferably deposited by an ALD method, a CVD method, or the like, and a conductor that can be used as the conductor 205 is used, for example.

The conductor 153 is provided over an insulator 154 and is covered with an insulator 156. A conductor that can be used as the conductor 112 is used as the conductor 153, and an insulator that can be used as the insulator 152 is used as the insulator 156. Here, the conductor 153 is in contact with a top surface of the conductor 140 and functions as a terminal of the capacitor 100, the transistor 200, or the transistor 300.

[Memory Device 2]

Figure 34:
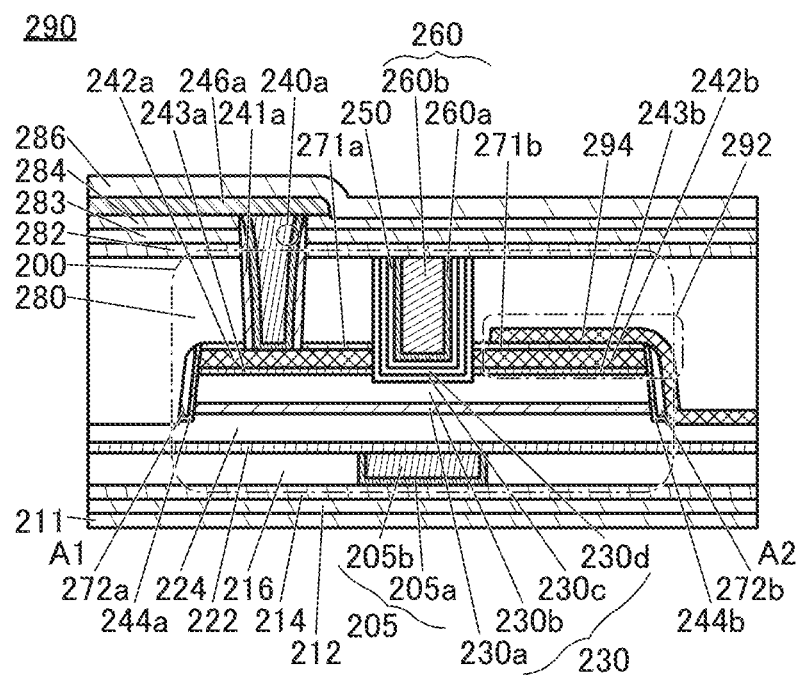
FIG. 34 is a cross-sectional view of a semiconductor device of one embodiment of the present invention.

FIG. 34 illustrates an example of the semiconductor device (memory device) of one embodiment of the present invention.

Structure Example of Memory Device

FIG. 34 is a cross-sectional view of a semiconductor device including a memory device 290. The memory device 290 illustrated in FIG. 34 includes a capacitor device 292 in addition to the transistor 200 illustrated in FIG. 1A to FIG. 1D. FIG. 34 corresponds to a cross-sectional view of the transistor 200 in the channel length direction.

The capacitor device 292 includes the conductor 242b, the insulator 271b provided over the conductor 242b, and a conductor 294 provided over the insulator 271b and the insulator 272b. In other words, the capacitor device 292 forms a MIM (Metal-Insulator-Metal) capacitor. Note that one of a pair of electrodes of the capacitor device 292, i.e., the conductor 242b, can double as the source electrode of the transistor. The dielectric layer of the capacitor device 292 can double as a protective layer provided in the transistor, i.e., the insulator 271b and the insulator 272b. Thus, the manufacturing process of the capacitor device 292 can double as part of the manufacturing process of the transistor, improving the productivity of the semiconductor device. Since the one of the pair of electrodes of the capacitor device 292, i.e., the conductor 242b, doubles as the source electrode of the transistor, an area where the transistor and the capacitor device are provided can be reduced.

The conductor 294 can be formed using, for example, a material that can be used for the conductor 242a and the conductor 242b.

Modification Example of Memory Device

An example of a semiconductor device including the transistor 200 and the capacitor device 292 of one embodiment of the present invention, which is different from the semiconductor device described above in <Structure example of memory device>, will be described below with reference to FIG. 35A, FIG. 35B, FIG. 36, and FIG. 37. In the semiconductor device illustrated in FIG. 35A, FIG. 35B, FIG. 36, and FIG. 37, components having the same functions as the components in the semiconductor device described in the above embodiment and <Structure example of memory device> (see FIG. 34) are denoted by the same reference numerals. In this section, as the components of the transistor 200 and the capacitor device 292, the materials described in detail in the above embodiment and <Structure example of memory device> can be used.

Modification Example 1 of Memory Device

Hereinafter, an example of a semiconductor device 600 including a transistor 200a, a transistor 200b, a capacitor device 292a, and a capacitor device 292b of one embodiment of the present invention will be described with reference to FIG. 35A.

FIG. 35A is a cross-sectional view of the semiconductor device 600 in the channel length direction including the transistor 200a, the transistor 200b, the capacitor device 292a, and the capacitor device 292b. The semiconductor device 600 has a line-symmetric structure with respect to the dashed-dotted line A3-A4 as illustrated in FIG. 35A. A conductor 242c functions as one of a source electrode and a drain electrode of the transistor 200a and one of a source electrode and a drain electrode of the transistor 200b. The conductor 240 functioning as a plug connects the conductor 246 functioning as a wiring to the transistor 200a and the transistor 200b. Accordingly, when the connection of the two transistors, the two capacitor devices, the wiring, and the plug have the above-described structure, a semiconductor device that can be miniaturized or highly integrated can be provided.

For the structures and the effects of the transistor 200a, the transistor 200b, the capacitor device 292a, and the capacitor device 292b, the structure examples of the semiconductor device illustrated in FIG. 1A to FIG. 1D and FIG. 34 can be referred to.

Modification Example 2 of Memory Device

In the above description, the semiconductor device including the transistor 200a, the transistor 200b, the capacitor device 292a, and the capacitor device 292b is given as a structure example; however, the semiconductor device described in this embodiment is not limited thereto. For example, as illustrated in FIG. 35B, the semiconductor device 600 may be connected to a semiconductor device having a structure similar to that of the semiconductor device 600 through a capacitor portion. In this specification, the semiconductor device including the transistor 200a, the transistor 200b, the capacitor device 292a, and the capacitor device 292b is referred to as a cell. For the structures of the transistor 200a, the transistor 200b, the capacitor device 292a, and the capacitor device 292b, the above description of the transistor 200a, the transistor 200b, the capacitor device 292a, and the capacitor device 292b can be referred to.

FIG. 35B is a cross-sectional view in which the semiconductor device 600 including the transistor 200a, the transistor 200b, the capacitor device 292a, and the capacitor device 292b is connected to a cell having a structure similar to that of the semiconductor device 600 through the capacitor portion.

As illustrated in FIG. 35B, a conductor 294b functioning as one electrode of the capacitor device 292b included in the semiconductor device 600 doubles as one electrode of a capacitor device included in a semiconductor device 601 having a structure similar to that of the semiconductor device 600. Although not illustrated, a conductor 294a functioning as one electrode of the capacitor device 292a included in the semiconductor device 600 doubles as one electrode of a capacitor device of a semiconductor device on the left side of the semiconductor device 600, i.e., a semiconductor device adjacent to the semiconductor device 600 in the A1 direction in FIG. 35B. The same applies to a cell on the right side of the semiconductor device 601, i.e., a cell in the A2 direction in FIG. 35B. That is, a cell array (also referred to as memory device layer) can be formed. With this structure of the cell array, the space between the adjacent cells can be reduced; thus, the projected area of the cell array can be reduced and high integration can be achieved. The cell arrays illustrated in FIG. 35B are arranged in a matrix, whereby a matrix of cell arrays can be formed.

When the transistor 200a, the transistor 200b, the capacitor device 292a, and the capacitor device 292b are formed to have the structures described in this embodiment as described above, the area of the cell can be reduced and the semiconductor device including the cell array can be miniaturized or highly integrated.

Figure 36:
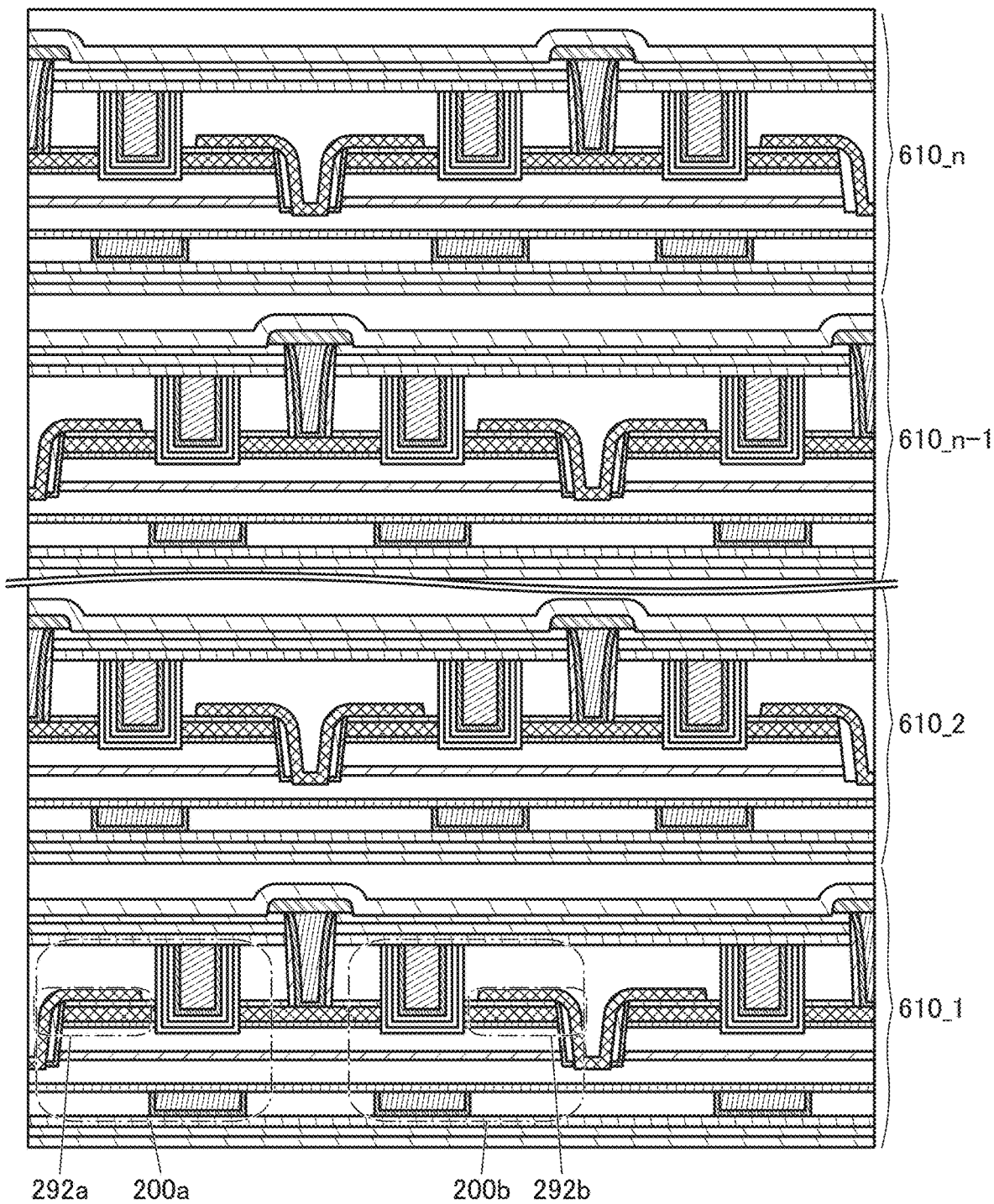
FIG. 36 is a cross-sectional view of a semiconductor device of one embodiment of the present invention.

Furthermore, the cell array may have a stacked-layer structure instead of a single-layer structure. FIG. 36 is a cross-sectional view of n layers of cell arrays that are stacked. As illustrated in FIG. 36, by stacking a plurality of cell arrays (a cell array 610_1 to a cell array 610_n), the cells can be integrated without an increase in the area occupied by the cell arrays. In other words, a 3D cell array can be formed.

Modification Example 3 of Memory Device

Figure 37:
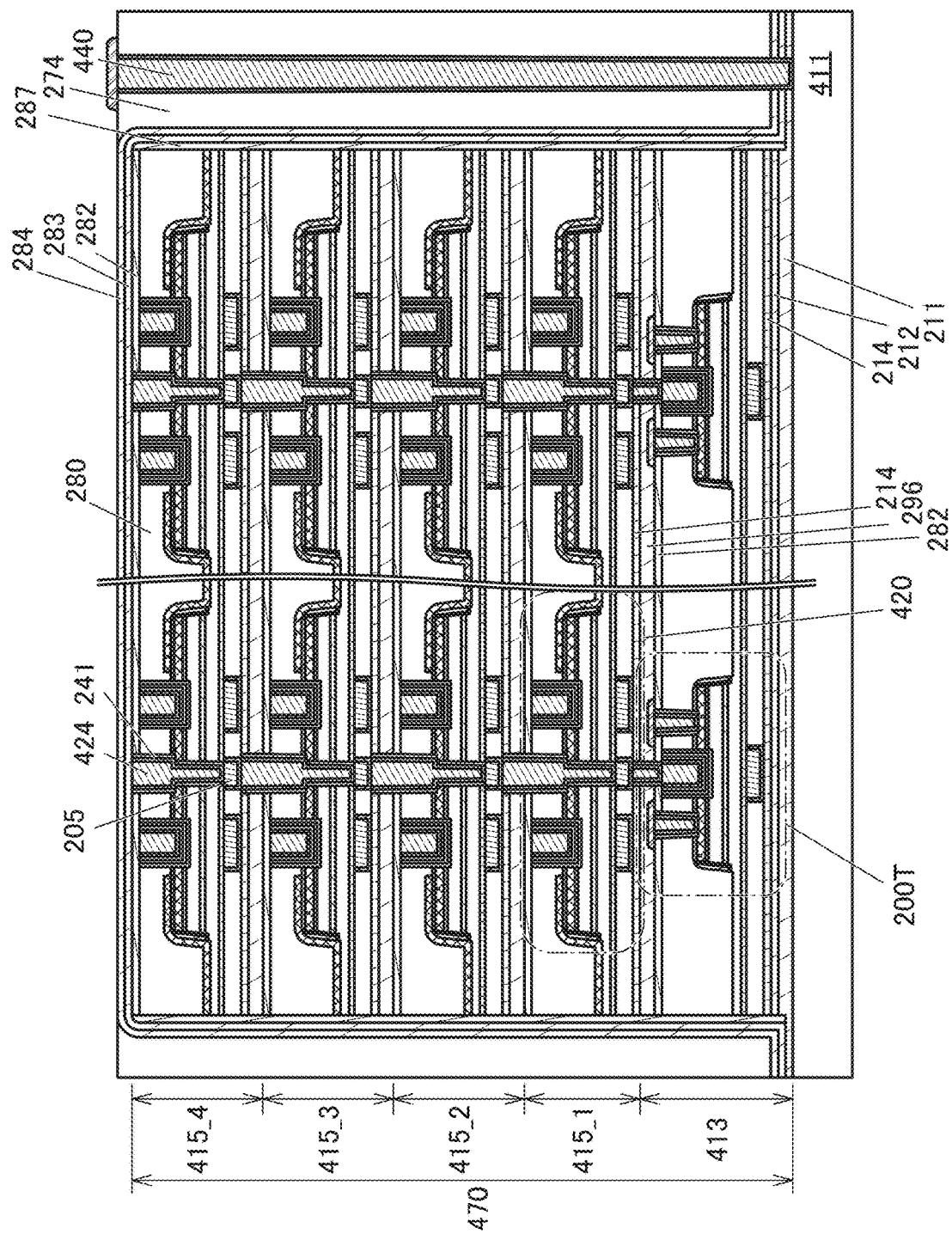
FIG. 37 is a cross-sectional view of a semiconductor device of one embodiment of the present invention.

FIG. 37 illustrates an example in which a memory unit 470 includes a transistor layer 413 including a transistor 200T and four memory device layers 415 (a memory device layer 415_1 to a memory device layer 415_4).

The memory device layer 415_1 to the memory device layer 415_4 each include a plurality of memory devices 420.

The memory device 420 is electrically connected to the memory devices 420 included in different memory device layers 415 and to the transistor 200T included in the transistor layer 413 through a conductor 424 and the conductor 205.

The memory unit 470 is sealed by the insulator 211, the insulator 212, the insulator 214, the insulator 287, the insulator 282, the insulator 283, and the insulator 284 (such a structure is referred to as a sealing structure below for convenience). The insulator 274 is provided around the insulator 284. A conductor 440 is provided in the insulator 274, the insulator 284, the insulator 283, and the insulator 211, and is electrically connected to an element layer 411.

The insulator 280 is provided in the sealing structure. The insulator 280 has a function of releasing oxygen by heating. The insulator 280 includes an excess-oxygen region.

The insulator 211, the insulator 283, and the insulator 284 are suitably formed using a material having a high blocking property against hydrogen. The insulator 214, the insulator 282, and the insulator 287 are suitably formed using a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

Materials for the insulator 211, the insulator 212, the insulator 214, the insulator 287, the insulator 282, the insulator 283, and the insulator 284 may have an amorphous or crystal structure, although the crystal structure is not limited thereto. For example, amorphous aluminum oxide is suitably used for the material having a function of capturing or fixing hydrogen. Amorphous aluminum oxide may capture or fix hydrogen more than aluminum oxide with high crystallinity.

The insulator 282 and the insulator 214 are preferably provided between the transistor layer 413 and the memory device layer 415_1 or between the memory device layers 415. An insulator 296 is preferably provided between the insulator 282 and the insulator 214. A material similar to those for the insulator 283 and the insulator 284 can be used for the insulator 296. Alternatively, silicon oxide or silicon oxynitride can be used. Alternatively, a known insulating material may be used.

Here, as the model of excess oxygen in the insulator 280 with respect to diffusion of hydrogen from an oxide semiconductor in contact with the insulator 280, the following model can be given.

Hydrogen in the oxide semiconductor diffuses to another structure body through the insulator 280 in contact with the oxide semiconductor. The hydrogen reacts with the excess oxygen in the insulator 280 to have the OH bonding and diffuses in the insulator 280 as OH. The hydrogen atom having the OH bonding reacts with the oxygen atom bonded to an atom (such as a metal atom) in the insulator 282 in reaching a material having a function of capturing or fixing hydrogen (typically, the insulator 282), and is captured or fixed in the insulator 282. The excess oxygen having the OH bonding probably remains as excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment is performed for one hour or more, preferably four hours or more, further preferably eight hours or more.

The heat treatment enables diffusion of hydrogen from the oxide semiconductor to the outside through the insulator 280, the insulator 282, and the insulator 287. That is, the absolute amount of hydrogen in and near the oxide semiconductor can be reduced.

The insulator 283 and the insulator 284 are formed after the heat treatment. The insulator 283 and the insulator 284 are formed using materials having a high blocking property against hydrogen; thus, entry of hydrogen diffusing to the outside or external hydrogen into the inside, specifically, the oxide semiconductor or insulator 280 side can be inhibited.

An example in which the heat treatment is performed after the insulator 282 is formed is described; however, one embodiment of the present invention is not limited thereto. For example, the heat treatment may be performed after the transistor layer 413 is formed or after the memory device layer 415_1 to the memory device layer 415_3 are formed. When hydrogen diffuses to the outside through the heat treatment, hydrogen diffuses in the upward direction or the lateral direction of the transistor layer 413. Similarly, when the heat treatment is performed after the memory device layer 415_1 to the memory device layer 415_3 are formed, hydrogen diffuses in the upward direction or the lateral direction.

With the above manufacturing process, the sealing structure can be formed by bonding the insulator 211 and the insulator 283.

The above-described structure and manufacturing process enable a semiconductor device using an oxide semiconductor with reduced hydrogen concentration. Thus, a highly reliable semiconductor device can be provided. One embodiment of the present invention can provide a semiconductor device with favorable electrical characteristics.

The compositions, structures, methods, and the like described in this embodiment can be used in an appropriate combination with the compositions, structures, methods, and the like described in the other embodiments.

Embodiment 3

In this embodiment, a memory device including a transistor in which an oxide is used as a semiconductor (hereinafter, sometimes referred to as an OS transistor) and a capacitor (hereinafter, sometimes referred to as an OS memory device) of one embodiment of the present invention will be described with reference to FIG. 38A, FIG. 38B, and FIG. 39A to FIG. 39H. The OS memory device is a memory device that includes at least a capacitor and an OS transistor that controls the charging and discharging of the capacitor. Since the OS transistor has an extremely low off-state current, the OS memory device has excellent retention characteristics and thus can function as a nonvolatile memory.

Structure Example of Memory Device

Figure 38A:
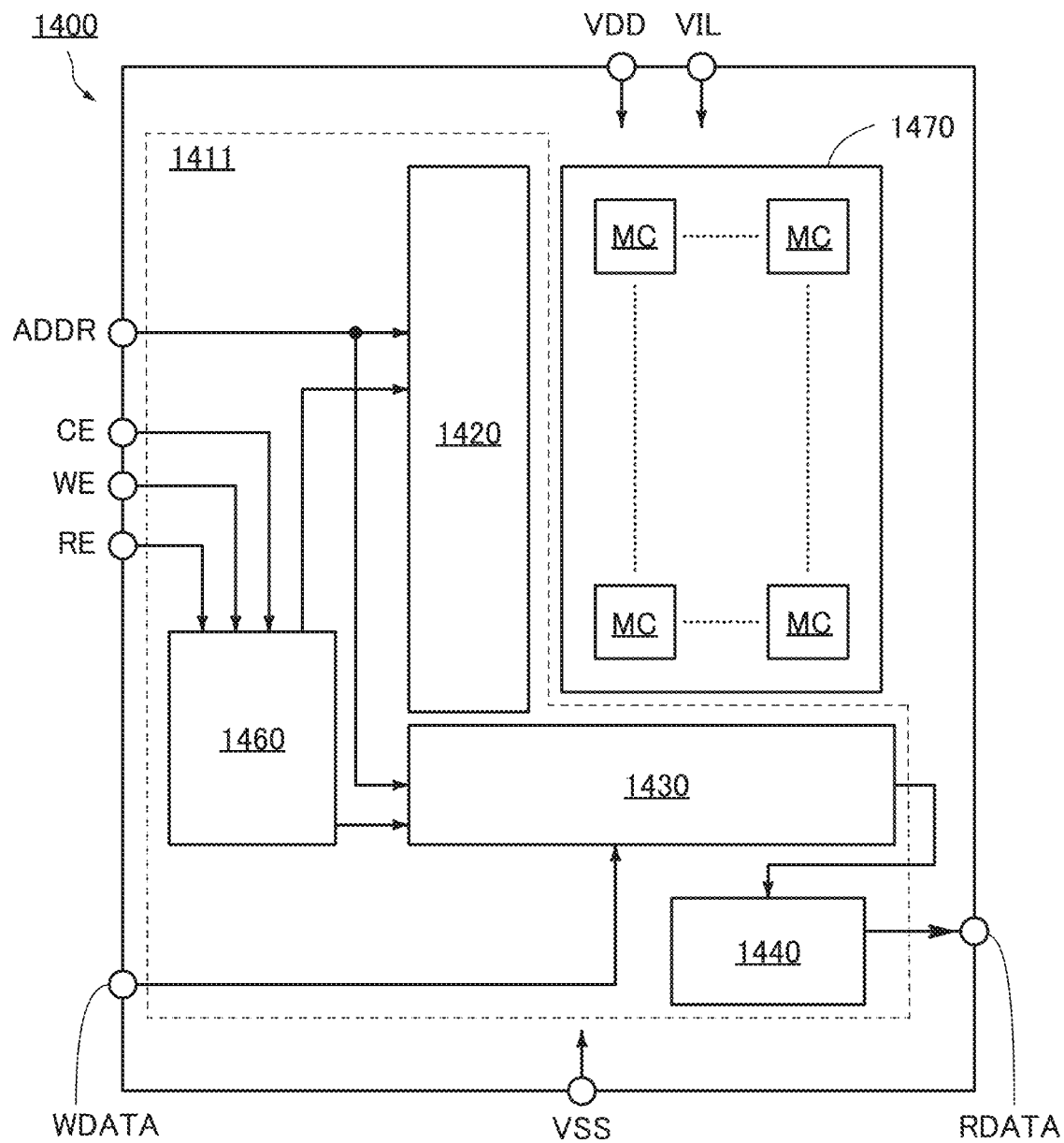
FIG. 38A is a block diagram illustrating a structure example of a memory device of one embodiment of the present invention.

FIG. 38A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Figure 38B:
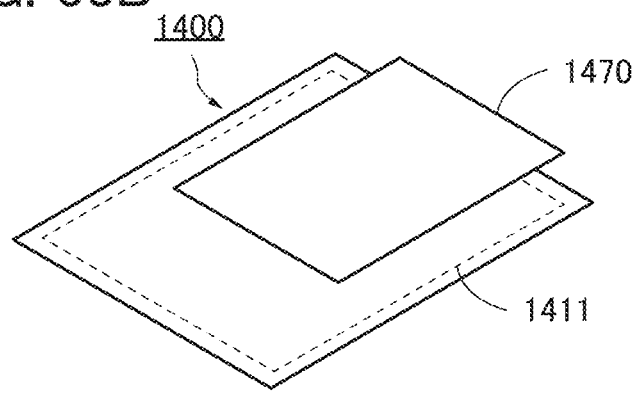
FIG. 38B is a schematic view illustrating a structure example of a memory device of one embodiment of the present invention.

Note that FIG. 38A illustrates an example in which the peripheral circuit 1411 and the memory cell array 1470 are formed on the same plane; however, this embodiment is not limited thereto. For example, as illustrated in FIG. 38B, the memory cell array 1470 may be provided over the peripheral circuit 1411 to partly overlap with the peripheral circuit

1411. For example, the sense amplifier may be provided below the memory cell array 1470 so that they overlap with each other.

FIG. 39A to FIG. 39H illustrate structure examples of a memory cell that can be used as the memory cell MC.

[DOSRAM]

Figure 39A:
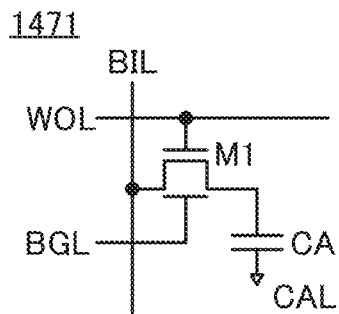
FIG. 39A to FIG. 39H are circuit diagrams illustrating structure examples of a memory device of one embodiment of the present invention.
Figure 39B:
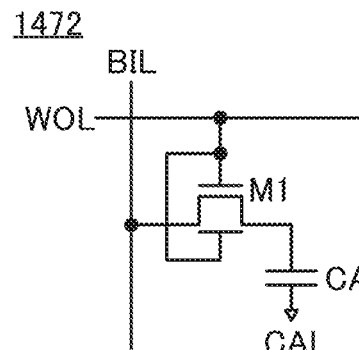
Figure 39C:
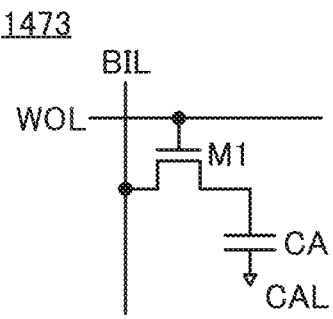

FIG. 39A to FIG. 39C illustrate circuit structure examples of a memory cell of a DRAM (Dynamic Random Access Memory). In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 39A includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. When a given potential is applied to the wiring BGL, the threshold voltage of the transistor M1 can be increased or decreased.

Here, a memory cell 1471 illustrated in FIG. 39A corresponds to the memory device illustrated in FIG. 34. That is, the transistor M1 and the capacitor CA correspond to the transistor 200 and the capacitor device 292, respectively.

The circuit structure of the memory cell MC is not limited to that of the memory cell 1471, and the circuit structure can be changed. For example, as in a memory cell 1472 illustrated in FIG. 39B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 39C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. Alternatively, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. This reduces bit line capacitance, which can reduce the storage capacitance of the memory cell.

[NOSRAM]

FIG. 39D to FIG. 39G each illustrate a circuit structure example of a gain-cell memory cell including two transistors and one capacitor. A memory cell 1474 illustrated in FIG. 39D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. The threshold voltage of the transistor M2 can be increased or decreased by applying a given potential to the wiring BGL.

Figure 39D:
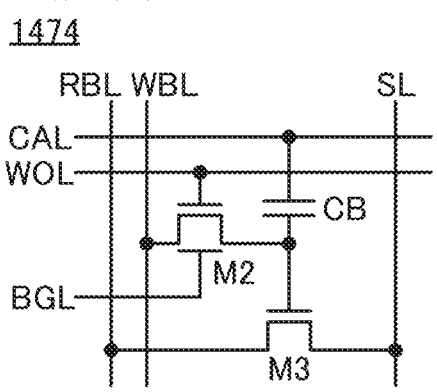
Figure 39E:
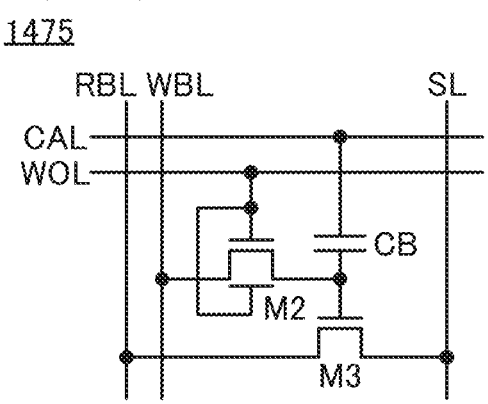
Figure 39F:
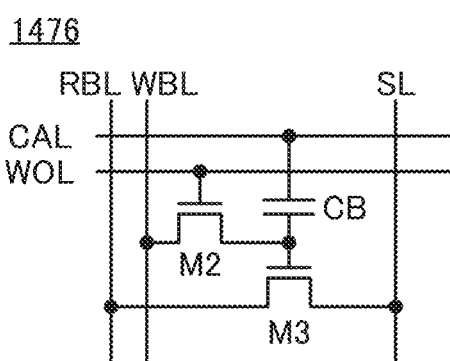
Figure 39G:
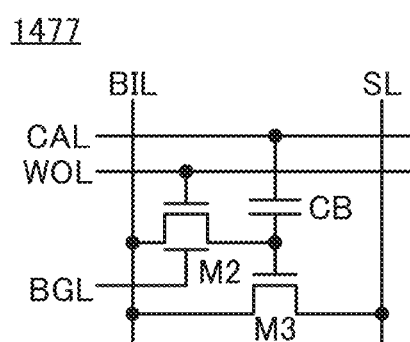

Here, the memory cell 1474 illustrated in FIG. 39D corresponds to the memory device illustrated in FIG. 32. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The circuit structure of the memory cell MC is not limited to that of the memory cell 1474, and the circuit structure can be changed as appropriate. For example, as in a memory cell 1475 illustrated in FIG. 39E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 39F. For example, the memory cell MC may have a structure in which the wiring WBL and the wiring RBL are combined into one wiring BIL as in a memory cell 1477 illustrated in FIG. 39G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long time, and thus the frequency of the refresh operation for the memory cell can be decreased. Alternatively, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, sometimes referred to as a Si transistor). The Si transistor may be either an n-channel transistor or a p-channel transistor. A Si transistor has higher field-effect mobility than an OS transistor in some cases. Therefore, a Si transistor may be used as the transistor M3 functioning as a reading transistor. Furthermore, the transistor M2 can be stacked over the transistor M3 when a Si transistor is used as the transistor M3, in which case the area occupied by the memory cell can be reduced, leading to high integration of the memory device.

Alternatively, the transistor M3 may be an OS transistor. When an OS transistor is used as each of the transistor M2 and the transistor M3, the circuit of the memory cell array 1470 can be formed using only n-channel transistors.

Figure 39H:
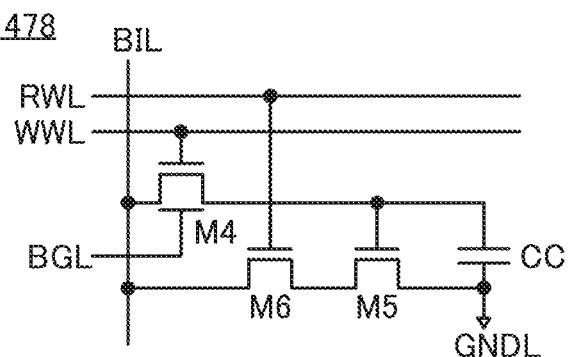

FIG. 39H illustrates an example of a gain-cell memory cell including three transistors and one capacitor. A memory cell 1478 illustrated in FIG. 39H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate, and the back gate is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 40:
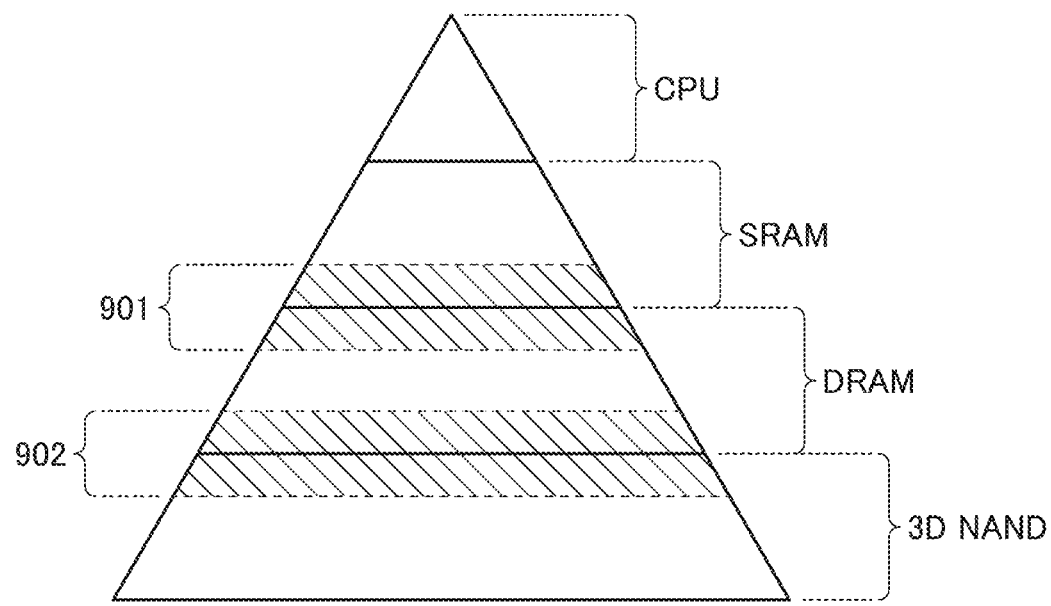
FIG. 40 is a diagram illustrating a hierarchy of a variety of memory devices.

In general, a variety of memory devices (memory) are used in semiconductor devices such as a computer in accordance with the intended use. FIG. 40 shows a hierarchy of memory devices. The memory devices at the upper levels of the diagram require higher access speed, and the memory devices at the lower levels require larger memory capacity and higher record density. FIG. 40 shows, sequentially from the top level, a memory combined as a register in an arithmetic processing device such as a CPU, an SRAM (Static Random Access Memory), a DRAM, and a 3D NAND memory.

A memory combined as a register in an arithmetic processing device such as a CPU is used for temporary storage of arithmetic operation results, for example, and thus is very frequently accessed by the arithmetic processing device. Accordingly, high operation speed is required rather than memory capacity. The register also has a function of retaining settings of the arithmetic processing device, for example.

An SRAM is used for a cache, for example. The cache has a function of retaining a copy of part of data retained in a main memory. Copying data which is frequently used and retaining the copy of the data in the cache facilitates rapid data access.

A DRAM is used for the main memory, for example. The main memory has a function of retaining a program or data which are read from the storage. The record density of a DRAM is approximately 0.1 to 0.3 Gbit/mm$^2$.

A 3D NAND memory is used for the storage, for example. The storage has a function of retaining data that needs to be stored for a long time and programs used in an arithmetic processing device, for example. Therefore, the storage needs to have a large memory capacity and a high record density rather than operating speed. The record density of a memory device used for the storage is approximately 0.6 to 6.0 Gbit/mm$^2$.

The memory device of one embodiment of the present invention operates fast and can retain data for a long time. The memory device of one embodiment of the present invention can be suitably used as a memory device in a boundary region 901 including both the level in which a cache is placed and the level in which a main memory is placed. The memory device of one embodiment of the present invention can be suitably used as a memory device in a boundary region 902 including both the level in which a main memory is placed and the level in which a storage is placed.

The structure described in this embodiment can be used in an appropriate combination with the structures described in the other embodiments.

Embodiment 4

In this embodiment, an example of a chip 1200 on which the semiconductor device of the present invention is mounted will be described with reference to FIG. 41A and FIG. 41B. A plurality of circuits (systems) are mounted on the chip 1200. A technique for integrating a plurality of circuits (systems) on one chip is referred to as system on chip (SoC) in some cases.

Figure 41A:
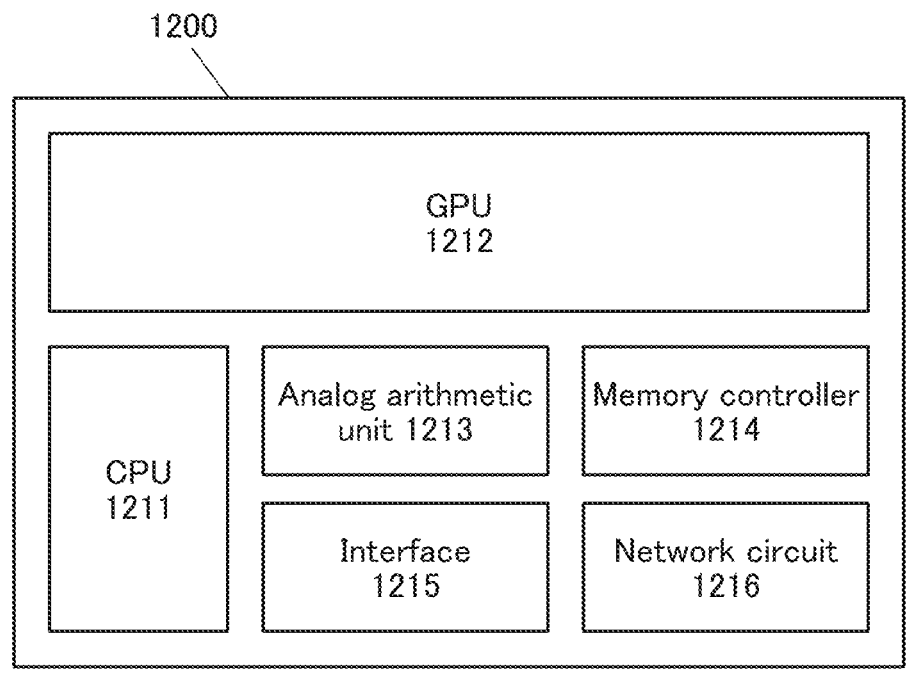
FIG. 41A and FIG. 41B are schematic views of a semiconductor device of one embodiment of the present invention.

As illustrated in FIG. 41A, the chip 1200 includes a CPU 1211, a GPU 1212, one or more analog arithmetic units 1213, one or more memory controllers 1214, one or more interfaces 1215, one or more network circuits 1216, and the like.

Figure 41B:
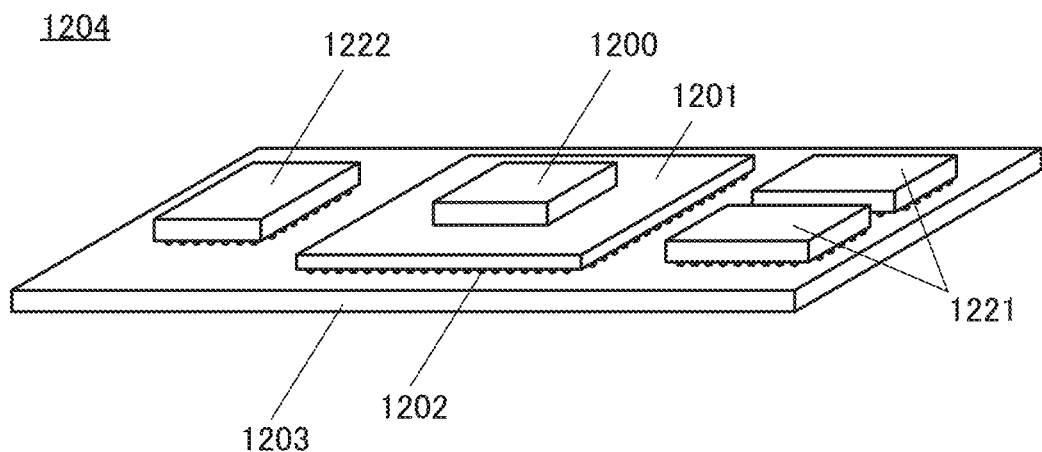

A bump (not illustrated) is provided on the chip 1200 and is connected to a first surface of a printed circuit board (PCB) 1201 as illustrated in FIG. 41B. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. The analog arithmetic unit 1213 may include the above-described product-sum operation circuit.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a circuit for a network such as a LAN (Local Area Network). The network circuit 1216 may include a circuit for network security.

The circuits (systems) can be formed in the chip 1200 through the same manufacturing process. Thus, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology and thus can have a small size. Furthermore, the GPU module 1204 is excellent in image processing and thus is suitably used in a portable electronic device such as a smartphone, a tablet terminal, a laptop PC, or a portable (mobile) game console. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments.

Embodiment 5

In this embodiment, examples of electronic components and electronic devices in which the memory device or the like described in the above embodiments is incorporated will be described.

Electronic Component

First, examples of electronic components in which a memory device 720 is incorporated are described with reference to FIG. 42A and FIG. 42B.

Figure 42A:
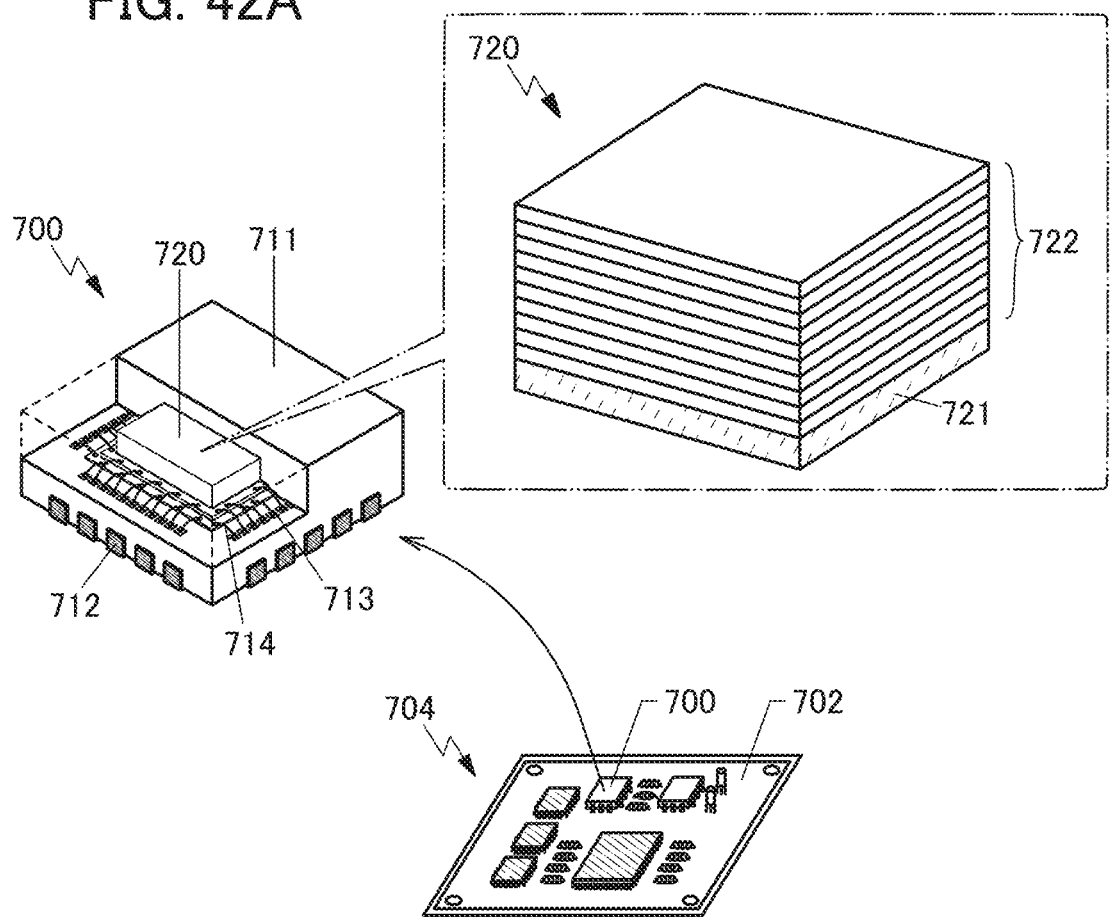
FIG. 42A and FIG. 42B are diagrams illustrating examples of electronic components.

FIG. 42A is a perspective view of an electronic component 700 and a substrate (a mounting board 704) on which the electronic component 700 is mounted. The electronic component 700 illustrated in FIG. 42A includes the memory device 720 in a mold 711. FIG. 42A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 720 via a wire 714. The electronic component 700 is mounted on a printed circuit board 702, for example. A plurality of such electronic components are combined and electrically connected to each other on the printed circuit board 702, whereby the mounting board 704 is completed.

The memory device 720 includes a driver circuit layer 721 and a memory circuit layer 722.

Figure 42B:
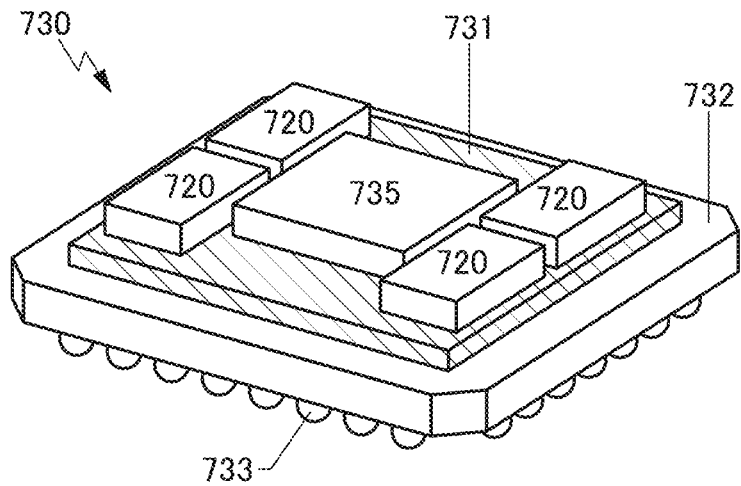

FIG. 42B is a perspective view of an electronic component 730. The electronic component 730 is an example of a SiP (System in package) or an MCM (Multi Chip Module). In the electronic component 730, an interposer 731 is provided on a package substrate 732 (printed circuit board), and a semiconductor device 735 and a plurality of memory devices 720 are provided on the interposer 731.

The electronic component 730 using the memory devices 720 as high bandwidth memory (HBM) is illustrated as an example. An integrated circuit (semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory devices 720 and the semiconductor device 735 are preferably equal to each other.

An electrode 733 may be provided on the bottom portion of the package substrate 732 to mount the electronic component 730 on another substrate. FIG. 42B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods, not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments.

Embodiment 6

In this embodiment, application examples of the memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for a variety of removable memory devices such as memory cards (e.g., SD cards), USB memories, and SSDs (solid state drives). FIG. 43A to FIG. 43E schematically illustrate some structure examples of removable memory devices. The semiconductor device described in the above embodiment is processed into a packaged memory chip and used in a variety of storage devices and removable memories, for example.

Figure 43A:
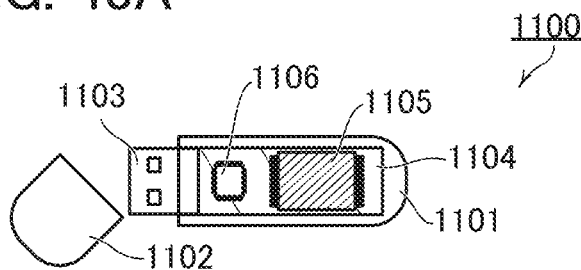
FIG. 43A to FIG. 43E are schematic views of memory devices of one embodiment of the present invention.

FIG. 43A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 43B:
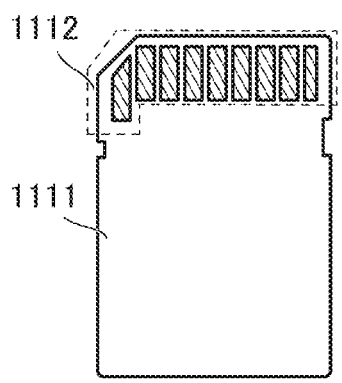
Figure 43C:
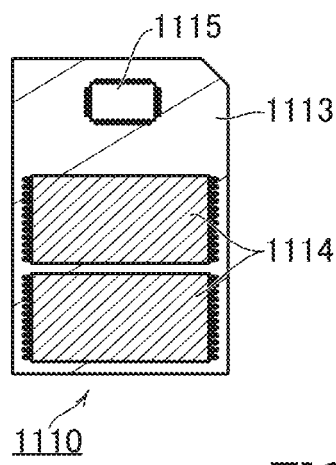

FIG. 43B is a schematic external view of an SD card, and FIG. 43C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figure 43D:
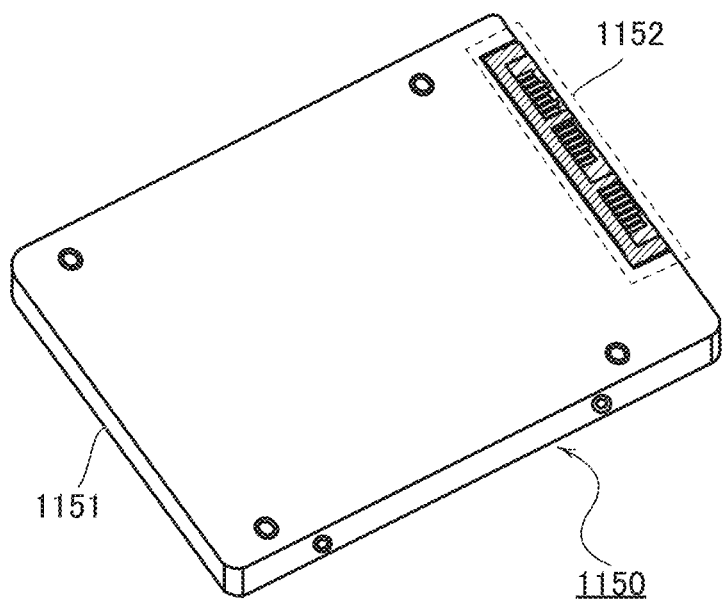
Figure 43E:
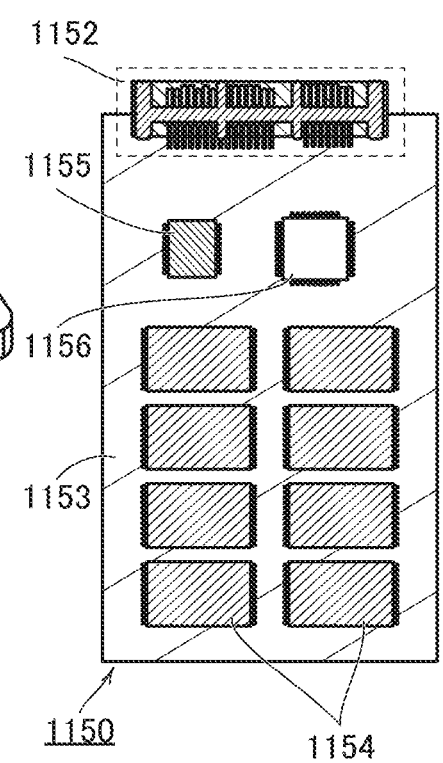

FIG. 43D is a schematic external view of an SSD, and FIG. 43E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments.

Embodiment 7

The semiconductor device of one embodiment of the present invention can be used as a processor such as a CPU and a GPU or a chip. FIG. 44A to FIG. 44H illustrate specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 44A to FIG. 44H illustrate examples of electronic devices.

[Information Terminal]

Figure 44A:
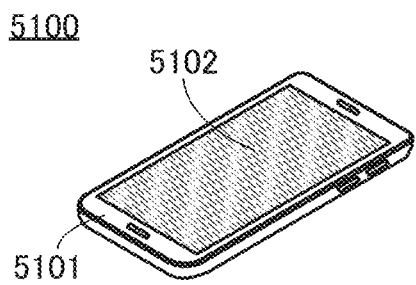
FIG. 44A to FIG. 44H are diagrams illustrating electronic devices of one embodiment of the present invention.

FIG. 44A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is used in the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 44B:
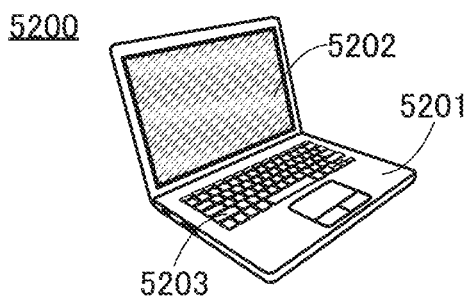

FIG. 44B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is used in the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 44A and FIG. 44B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 44C:
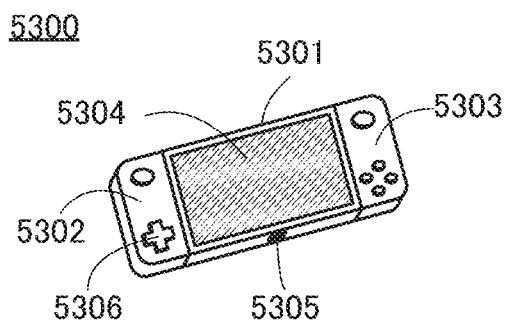

FIG. 44C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 44D:
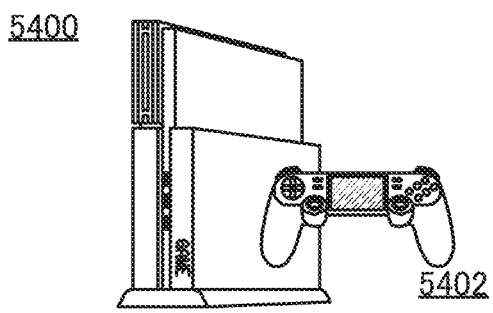

FIG. 44D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 44C and FIG. 44D, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 44E:
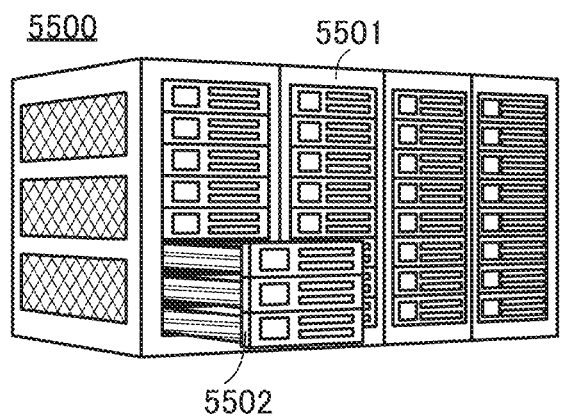
Figure 44F:
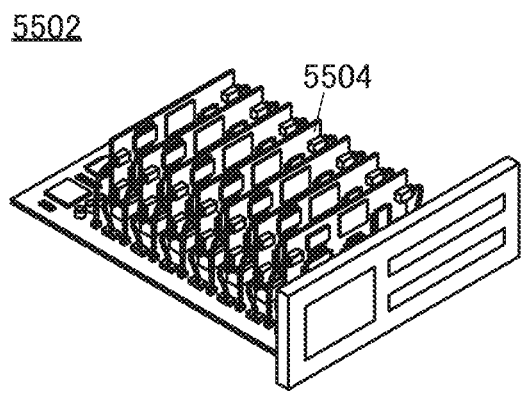

FIG. 44E illustrates a supercomputer 5500 as an example of a large computer. FIG. 44F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 44E and FIG. 44F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be used for an automobile, which is a moving vehicle, and the periphery of a driver's seat in the automobile.

Figure 44G:
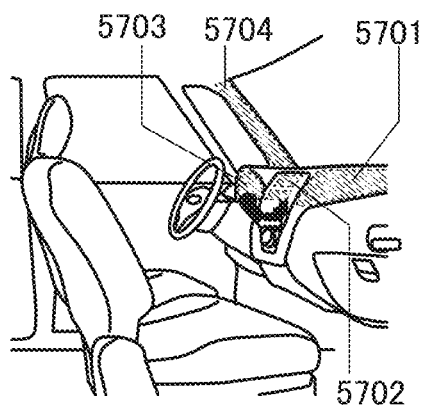

FIG. 44G illustrates an area around a windshield inside an automobile, which is an example of a moving vehicle. FIG. 44G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used for each of these moving vehicles.

[Household Appliance]

Figure 44H:
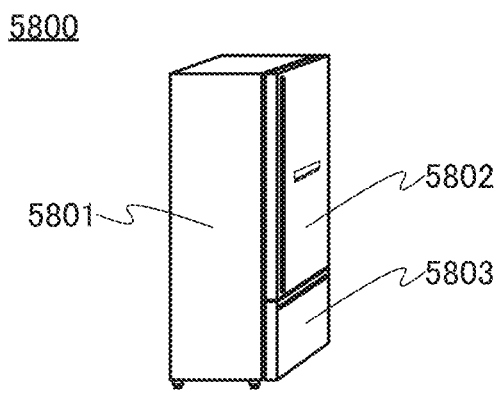

FIG. 44H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used for the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments.

REFERENCE NUMERALS

100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200_n: transistor, 200_1: transistor, 200a: transistor, 200b: transistor, 200T: transistor, 205: conductor, 205a: conductor, 205b: conductor, 210: insulator, 211: insulator, 212: insulator, 214: insulator, 216: insulator, 217: insulator, 218: conductor, 222: insulator, 224: insulator, 230: oxide, 230a: oxide, 230A: oxide film, 230b: oxide, 230B: oxide film, 230c: oxide, 230C: oxide film, 230d: oxide, 230D: oxide film, 234: region, 236a: region, 236b: region, 240: conductor, 240a: conductor, 240b: conductor, 241: insulator, 241a: insulator, 241b: insulator, 242a: conductor, 242A: conductive film, 242b: conductor, 242B: conductive layer, 242c: conductor, 243a: oxide, 243A: oxide film, 243b: oxide, 243B: oxide layer, 244a: layer, 244A: layer, 244b: layer, 244B: layer, 246: conductor, 246a: conductor, 246b: conductor, 247A: conductive film, 247B: conductive layer, 250: insulator, 250A: insulating film, 260: conductor, 260a: conductor, 260A: conductive film, 260b: conductor, 260B: conductive film, 265: sealing portion, 265a: sealing portion, 265b: sealing portion, 271a: insulator, 271A: insulating film, 271b: insulator, 271B: insulating layer, 272a: insulator, 272A: insulating film, 272b: insulator, 272B: insulating layer, 274: insulator, 280: insulator, 282: insulator, 283: insulator, 284: insulator, 286: insulator, 287: insulator, 287A: insulating film, 290: memory device, 292: capacitor device, 292a: capacitor device, 292b: capacitor device, 294: conductor, 294a: conductor, 294b: conductor, 296: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 411: element layer, 413: transistor layer, 415: memory device layer, 415_1: memory device layer, 415_2: memory device layer, 415_3: memory device layer, 415_4: memory device layer, 420: memory device, 424: conductor, 440: conductor, 470: memory unit, 600: semiconductor device, 601: semiconductor device, 610_n: cell array, 610_1: cell array, 700: electronic component, 702: printed circuit board, 704: mounting board, 711: mold, 712: land, 713: electrode pad, 714: wire, 720: memory device, 721: driver circuit layer, 722: memory circuit layer, 730: electronic component, 731: interposer, 732: package substrate, 733: electrode, 735: semiconductor device, 901: boundary region, 902: boundary region, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising:
   a first insulator;
   a first oxide over the first insulator;
   a second oxide over the first oxide;
   a first conductor and a second conductor over the second oxide;
   a second insulator over the first conductor;
   a third insulator over the second conductor;
   a first layer and a second layer over the first insulator;
   a fourth insulator over the first layer;
   a fifth insulator over the second layer;
   a sixth insulator over the first insulator, the second insulator, the third insulator, the fourth insulator, and the fifth insulator;
   a third oxide positioned between the first conductor and the second conductor and positioned over the second oxide;
   a seventh insulator over the third oxide; and
   a third conductor over the seventh insulator,
   wherein the sixth insulator comprises a region in contact with a top surface of the first insulator, a region in contact with the fourth insulator, and a region in contact with the fifth insulator,
   wherein the first layer comprises a region in contact with a side surface of the first oxide, a side surface of the second oxide, a side surface of the first conductor, and a top surface of the first insulator,
   wherein the second layer comprises a region in contact with a side surface of the first oxide, a side surface of the second oxide, a side surface of the second conductor, and a top surface of the first insulator,
   wherein the fourth insulator is positioned over the first insulator with the first layer therebetween, and
   wherein the fifth insulator is positioned over the first insulator with the second layer therebetween.

2. The semiconductor device according to claim 1, wherein thicknesses of the first layer and the second layer are each greater than or equal to 0.5 nm and less than or equal to 1.5 nm.

3. The semiconductor device according to claim 1, wherein the first conductor and the second conductor are each a nitride comprising tantalum, and wherein the first layer and the second layer each comprise tantalum and oxygen.

4. The semiconductor device according to claim 3, wherein a tantalum concentration at and near an interface between the first insulator and the sixth insulator is lower than a tantalum concentration in the first layer or the second layer.

5. The semiconductor device according to claim 1, wherein the second oxide and the third oxide each comprise indium, an element M, and zinc, and wherein M is selected from the group consisting of gallium, aluminum, yttrium, and tin.

6. The semiconductor device according to claim 1, wherein the first oxide has a lower oxygen-transmitting property than the third oxide.

\* \* \* \* \*